US012660415B2

(12) United States Patent
Yaguchi

(10) Patent No.: US 12,660,415 B2
(45) Date of Patent: Jun. 16, 2026

(54) NANOPARTICLE FILM PATTERNING METHOD, METHOD FOR PRODUCING LIGHT-EMITTING ELEMENT, METHOD FOR PRODUCING DISPLAY DEVICE, AND LIGHT-EMITTING ELEMENT

(71) Applicant: SHARP KABUSHIKI KAISHA, Sakai City (JP)

(72) Inventor: Yuma Yaguchi, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 370 days.

(21) Appl. No.: 18/578,488

(22) PCT Filed: Sep. 30, 2021

(86) PCT No.: PCT/JP2021/036045
§ 371 (c)(1),
(2) Date: Jan. 11, 2024

(87) PCT Pub. No.: WO2023/053311
PCT Pub. Date: Apr. 6, 2023

(65) Prior Publication Data
US 2025/0060518 A1 Feb. 20, 2025

(51) Int. Cl.
*H10K 59/12* (2023.01)
*H10K 50/115* (2023.01)

(52) U.S. Cl.
CPC ....... *H10K 59/1201* (2023.02); *H10K 50/115* (2023.02)

(58) Field of Classification Search
CPC . H10K 50/115; H10K 59/1201; H10K 71/211
See application file for complete search history.

(56) References Cited

U.S. PATENT DOCUMENTS

| | | | | |
|---|---|---|---|---|
| 2009/0087792 A1* | 4/2009 | Iizumi | H05B 33/10 430/312 |
| 2023/0265338 A1* | 8/2023 | Aoki | B82Y 20/00 252/301.36 |

FOREIGN PATENT DOCUMENTS

| | | |
|---|---|---|
| JP | 2009-087760 A | 4/2009 |

* cited by examiner

*Primary Examiner* — Daniel P Shook
(74) *Attorney, Agent, or Firm* — ScienBiziP, P.C.

(57) ABSTRACT

A non-dispersive ligand-containing portion containing a monodentate ligand that is coordinated to a QD to render the QD non-dispersible in a solvent is formed in a part of a QD film containing the QD, and a portion of the QD film other than the non-dispersive ligand-containing portion is removed by a solvent to form a QD layer pattern.

19 Claims, 26 Drawing Sheets

NANOPARTICLE FILM PATTERNING METHOD, METHOD FOR PRODUCING LIGHT-EMITTING ELEMENT, METHOD FOR PRODUCING DISPLAY DEVICE, AND LIGHT-EMITTING ELEMENT

TECHNICAL FIELD

The disclosure relates to a nanoparticle film patterning method, and a method for manufacturing a light-emitting element, a method for manufacturing a display device, and a light-emitting element using the same.

BACKGROUND ART

In manufacturing a light-emitting device such as a light-emitting element by using a nanoparticle such as a quantum dot, patterning of a nanoparticle film containing the nanoparticle is performed in the related art. As a patterning method of the nanoparticle film, an edging method (etching method), a lift-off method, or the like is used.

In the edging method, a resist layer is layered on the nanoparticle film on a support body, after exposure, development is performed to form a resist pattern, and the nanoparticle film is edged by an edging agent with the resist pattern as a mask.

Thereafter, a nanoparticle layer pattern is formed by peeling the resist pattern.

In the lift-off method, the resist layer is formed on the support body, after exposure, development is performed to form the resist pattern, and then the resist pattern is removed using a resist solvent to remove (lift-off) the nanoparticle film on the resist pattern, and thus the nanoparticle pattern is formed on a portion of the support body where the resist pattern is not formed.

PTL 1 discloses that in a case where, for example, a light-emitting layer is formed as the nanoparticle layer pattern, when the edging method is used, the light-emitting layer is exposed to edging and performance such as light-emitting characteristics is deteriorated, and thus the lift-off method is used to suppress such deterioration in performance.

CITATION LIST

Patent Literature

PTL 1: JP 2009-87760 A

SUMMARY

Technical Problem

However, in the known patterning method of the nanoparticle film, removed nanoparticle cannot be reused.

For example, in the lift-off method, the resist pattern is dissolved and removed by a resist solvent, and thus the nanoparticle film on the resist pattern is removed. Thus, a waste liquid contains a resist material, the nanoparticle, and the resist solvent. It is difficult to extract the nanoparticle from the waste liquid in which the nanoparticle and the resist material are mixed, and the nanoparticle is deteriorated due to various factors. Thus, the nanoparticle contained in the removed nanoparticle film cannot be reused.

In addition, in the edging method, the nanoparticle in the nanoparticle film to be removed are deteriorated by edging. Thus, also in this case, the nanoparticle contained in the removed nanoparticle film cannot be reused.

An aspect of the disclosure has been made in view of the above-described problems, and an object thereof is to provide a nanoparticle film patterning method capable of recovering and reusing at least some of the removed nanoparticle with less deterioration and forming a nanoparticle layer pattern with less deterioration, and a method for manufacturing a light-emitting element, a method for manufacturing a display device, and a light-emitting element using the same.

Solution to Problem

In order to solve the above problems, a nanoparticle film patterning method according to an aspect of the disclosure includes forming a non-dispersive ligand-containing portion containing a nanoparticle and a monodentate non-dispersive ligand that is coordinated to the nanoparticle to render the nanoparticle non-dispersible in a solvent in a part of a nanoparticle film containing the nanoparticle, and removing a portion of the nanoparticle film other than the non-dispersive ligand-containing portion with a first organic solvent.

In order to solve the above problems, a method for manufacturing a light-emitting element according to an aspect of the disclosure includes performing nanoparticle layer patterning of forming a nanoparticle layer pattern by using the nanoparticle film patterning method according to an aspect of the disclosure.

In order to solve the above problems, a method for manufacturing a display device according to an aspect of the disclosure includes performing nanoparticle layer patterning of forming the nanoparticle layer pattern for each subpixel, and the nanoparticle layer pattern in at least one subpixel of a plurality of the subpixels is formed using the nanoparticle film patterning method according to an aspect of the disclosure.

In order to solve the above problems, a light-emitting element according to an aspect of the disclosure include a nanoparticle layer pattern containing a nanoparticle, the nanoparticle layer pattern including a non-dispersive ligand-containing portion containing a monodentate non-dispersive ligand that is coordinated to the nanoparticle to render the nanoparticle non-dispersible in a solvent and a dispersive ligand-containing portion containing at least a dispersive ligand that is coordinated to the nanoparticle to render the nanoparticle dispersible in one of a polar organic solvent and a non-polar organic solvent, the dispersive ligand-containing portion is formed adjacent to the non-dispersive ligand-containing portion in a part of an outer edge portion of the non-dispersive ligand-containing portion, and the dispersive ligand contained in the dispersive ligand-containing portion is coordinated to the nanoparticle to which the non-dispersive ligand is coordinated.

Advantageous Effects of Disclosure

According to an aspect of the disclosure, a nanoparticle film patterning method capable of recovering and reusing at least some of the removed nanoparticle with less deterioration and forming a nanoparticle layer pattern with less deterioration, and a method for manufacturing a light-emitting element, a method for manufacturing a display device, and a light-emitting element using the same can be provided.

DESCRIPTION OF EMBODIMENTS

Figure 1:
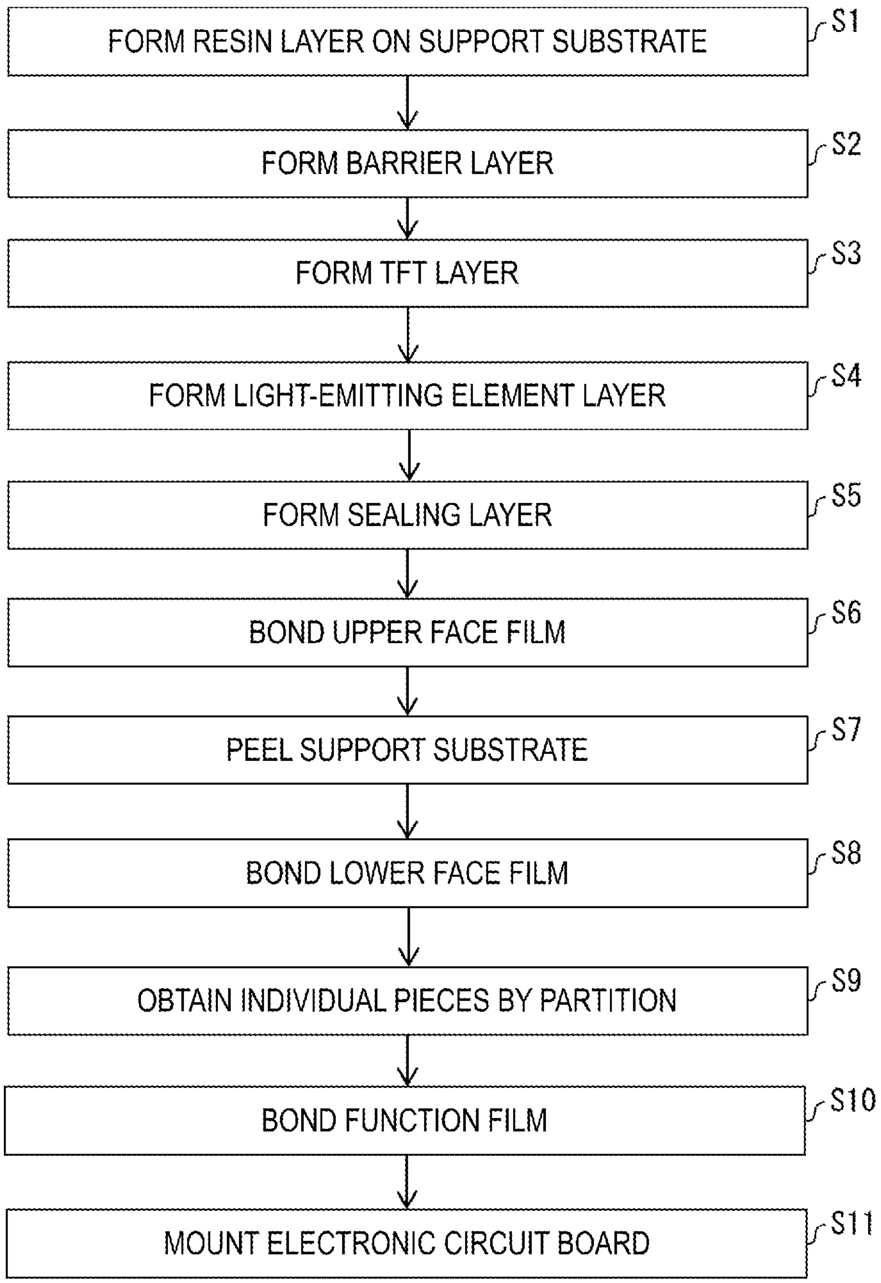
FIG. 1 is a flowchart illustrating an example of a method for manufacturing a display device according to a first embodiment.

Hereinafter, embodiments of the disclosure will be described in detail. Note that, for convenience of description, members having the same functions as the members described earlier may be denoted by the same reference numerals and signs, and the description thereof will not be repeated.

Also note that in the following description, “same layer” refers to formation in the same process (film formation process). “Lower layer” means that the layer is formed in a process before that of the layer being compared. “Upper layer” means that the layer is formed in a process after that of the layer being compared. Also, the term “from A to B” for two numbers A and B is intended to mean “equal to or greater than A and equal to or less than B”, unless otherwise specified.

First Embodiment

Method for Manufacturing Display Device and Overall Configuration

Figure 2:
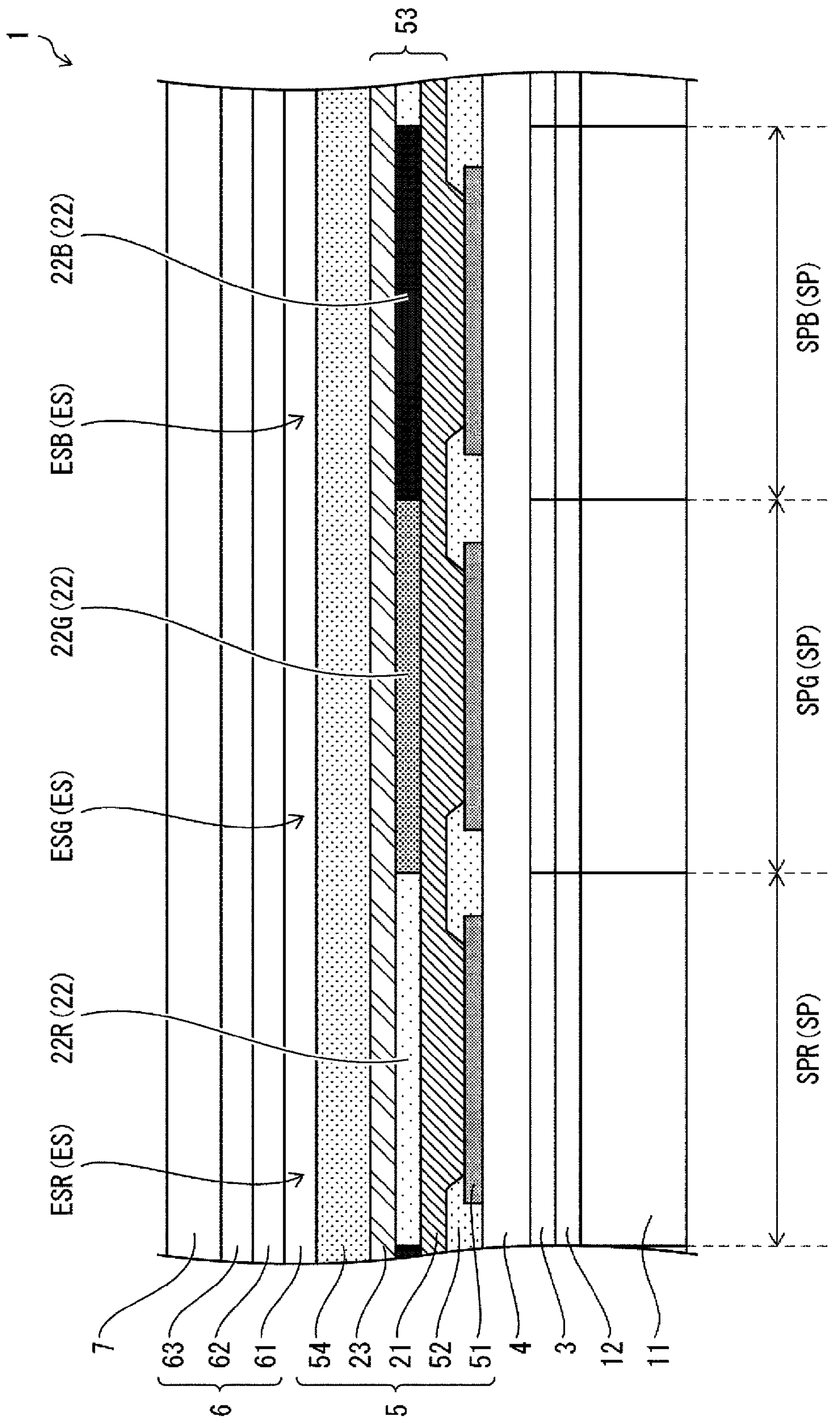
FIG. 2 is a cross-sectional view illustrating an example of an overall configuration of main portions of the display device according to the first embodiment.

FIG. 1 is a flowchart illustrating an example of a method for manufacturing a display device 1 according to the present embodiment. FIG. 2 is a cross-sectional view illustrating an example of an overall configuration of main portions of the display device 1 according to the present embodiment.

As illustrated in FIG. 1 and FIG. 2, in a case where a flexible display device 1 is manufactured, first, a resin layer 12 is formed on a transparent support substrate (a mother glass, for example) (step S1). Next, a barrier layer 3 is formed (step S2). Next, a thin film transistor layer 4 is formed (step S3). Next, a light-emitting element layer 5 is formed (step S4). Next, a sealing film 6 is formed (step S5). Next, an upper face film is bonded to the sealing film 6 (step S6).

Next, the support substrate is peeled from the resin layer 12 through irradiation with laser light or the like (step S7). Next, a lower face film 11 is bonded to the lower face of the resin layer 12 (step S8). Next, a layered body including the lower face film 11, the resin layer 12, the barrier layer 3, the thin film transistor layer 4, the light-emitting element layer 5, the sealing film 6, and the upper face film is divided to obtain a plurality of individual pieces (step S9). Next, a function film is attached to each of the individual pieces from above the upper face film or the lower face film with the upper face film or the lower face film being peeled from the obtained individual piece, or only a terminal portion being peeled off (step S10). Next, an electronic circuit board is mounted on a part (terminal portion) of a frame region (non-display region) surrounding a display region where a plurality of subpixels SP are formed (step S11). Note that steps S1 to S11 are performed by a display device manufacturing apparatus (including a film formation apparatus configured to perform each process of steps S1 to S5).

Examples of the material of the resin layer 12 include polyimide. A portion of the resin layer 12 can be replaced by two resin films (for example, polyimide films) with an inorganic insulating film sandwiched therebetween.

The barrier layer 3 is a layer that inhibits foreign matter such as water and oxygen from entering the thin film transistor layer 4 and the light-emitting element layer 5. For example, the barrier layer can be constituted of a silicon oxide film, a silicon nitride film, or a silicon oxynitride film, or a layered film thereof formed by chemical vapor deposition (CVD).

A subpixel circuit that controls the light-emitting element layer 5 and a plurality of wiring lines connected to the subpixel circuit are formed in the thin film transistor layer 4. The subpixel circuit is provided for each subpixel SP in correspondence with each subpixel SP in the display region. The subpixel circuit includes a plurality of thin film transistors. The plurality of thin film transistors are electrically connected to a plurality of wiring lines including wiring lines such as the gate wiring line and the source wiring line. Note that, as these thin film transistors, a known structure can be employed, and the structure is not particularly limited.

On a surface of the thin film transistor layer 4, provided is a flattening film covering the plurality of thin film transistors, flattening surfaces of the plurality of thin film transistors. The flattening film can be made of, for example, an organic insulating material such as polyimide or acrylic resin.

The light-emitting element layer 5 includes a plurality of light-emitting elements ES. Details of the light-emitting element layer 5 will be described below.

The sealing film 6 covers the light-emitting element layer 5 so as to seal the plurality of light-emitting elements ES. The sealing film 6 prevents foreign matter such as moisture, oxygen, and excess organic matter such as dust generated during the manufacturing process from penetrating the light-emitting element layer 5. For example, a transparent sealing film is used as the sealing film 6.

The sealing film 6 illustrated in FIG. 2 includes, for example, an inorganic sealing film 61, an organic buffer film 62, and an inorganic sealing film 63 in order from the lower layer side. The inorganic sealing film 61 and the inorganic sealing film 63 are inorganic insulating films and made of, for example, a silicon oxide film, a silicon nitride film, or a silicon oxynitride film, or a layered film of these, formed by a CVD method. The organic buffer film 62 is an organic insulating layer having a flattening effect, and is made of acrylic resin, polyimide, or the like. The organic buffer film 62 can be formed by ink-jet application, for example.

The function film used in step S11 has, for example, at least one of an optical compensation function, a touch sensor function, and a protection function.

The electronic circuit board mounted to the terminal portion is, for example, an integrated circuit (IC) chip or a flexible printed circuit board (FPC).

The upper face film is bonded on the sealing film 6 by an adhesive or the like and functions as a support material when the support substrate is peeled. Examples of the material of the upper face film include polyethylene terephthalate (PET) film.

The lower face film 11 is, for example, a PET film bonded to a lower face of the resin layer 12 by an adhesive or the like after the support substrate is peeled, to provide a display device having excellent flexibility.

Note that instead of the resin layer 12 having the lower face to which the lower face film 11 is attached, a non-flexible (in other words, solid) insulating substrate may be formed as a support body that supports each layer (for example, the barrier layer to the sealing film 6 or the function film) above the barrier layer 3. Examples of such an insulating substrate include a glass substrate. While, in the above description, the case where the display device 1 is the flexible display device is described, but ordinarily, formation of the resin layer 12 and replacement of a base material are not required when a non-flexible display device is manufactured as the display device 1 as described above. Thus, for example, when the non-flexible display device is to be manufactured as the display device 1, a layering process of steps S2 to S5 is performed on a glass substrate, after which the process proceeds to step S9. Furthermore, when the non-flexible display device is manufactured as the display device 1, a transparent sealing member may be caused to adhere using a sealing adhesive instead of forming or in addition to forming the sealing film 6, under a nitrogen atmosphere. The transparent sealing member can be formed from glass, plastic, or the like, and preferably has a concave shape.

The display device 1 includes, as a subpixel SP, a subpixel SPR (red subpixel) that emits red light, a subpixel SPG (green subpixel) that emits green light, and a subpixel SPB (blue subpixel) that emits blue light, for example. In the subpixel SPR, a light-emitting element ESR (red light-emitting element) that emits red light is provided as the light-emitting element ES. In the subpixel SPG, a light-emitting element ESG (green light-emitting element) that emits green light is provided as the light-emitting element ES. In the blue subpixel SPB, a light-emitting element ESB (blue light-emitting element) that emits blue light is provided as the light-emitting element ES. However, the above luminescent colors are examples, and the subpixels are not limited to the above luminescent colors. Furthermore, the display device 1 may be a display device of monochromatic light emission.

Overall Configuration of Light-Emitting Element Layer 5

The light-emitting element layer 5 includes the plurality of light-emitting elements ES as described above. The light-emitting element ES is provided for each subpixel SP as described above. Thus, the subpixel circuit that controls the light-emitting element ES in each subpixel SP is formed for each subpixel SP in the thin film transistor layer 4.

Each light-emitting element ES includes an anode electrode 51 (anode), an electroluminescence (EL) layer 53, and a cathode electrode 54 (cathode). An edge cover 52 having insulating properties is provided between the light-emitting elements ES adjacent to each other. Thus, the light-emitting element layer 5 includes the anode electrode 51, the edge cover 52, the EL layer 53, and the cathode electrode 54.

One of the anode electrode 51 and the cathode electrode 54 is an island-shaped electrode (subpixel electrode) provided in an island shape for each light-emitting element ES (in other words, for each subpixel SP), and the other of the anode electrode 51 and cathode electrode 54 is a common electrode commonly provided for all the light-emitting elements ES (in other words, all the subpixels SP).

In the present embodiment, a layer (function layer) between the anode electrode 51 and the cathode electrode 54 is referred to as the EL layer 53. Note that the EL layer 53 may be a single layer type formed only of a light-emitting layer (EML), or may be a multi-layer type including a function layer other than the EML. The EL layer 53 may include, for example, at least one layer of a hole injection layer (HIL), a hole transport layer (HTL), an electron transport layer (ETL), and an electron injection layer (EIL) in addition to the EML. In addition, the EL layer 53 may include a function layer such as a hole blocking layer or an electron blocking layer other than the function layer described above.

In FIG. 2, a case is illustrated as an example in which the anode electrode 51 is an island-shaped lower electrode (subpixel electrode) provided on the flattening film of the thin film transistor layer 4, and the cathode electrode 54 is an upper electrode (common electrode) provided in an upper layer of the lower electrode in common to all the subpixels SP. In FIG. 2, a case is illustrated as an example in which the EL layer 53 includes an HTL 21, an EML 22 (nanoparticle layer pattern), and an ETL 23. The EL layer 53 illustrated in FIG. 2 is formed by layering the HTL 21, the EML 22, and the ETL 23 in this order from the lower layer side.

Figure 3:
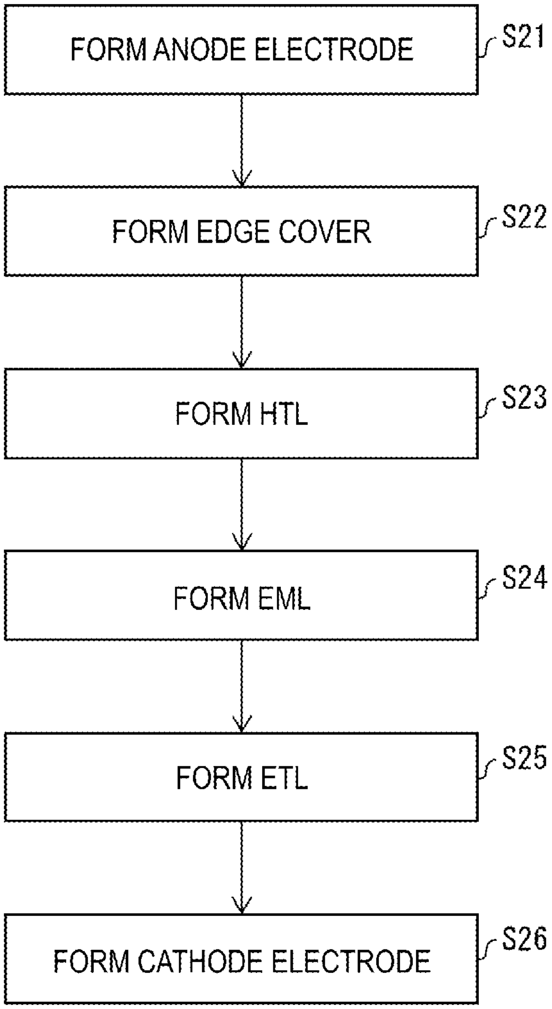
FIG. 3 is a flowchart illustrating an example of a method for forming a light-emitting element layer illustrated in FIG. 2.

FIG. 3 is a flowchart illustrating an example of a method for forming the light-emitting element layer 5 illustrated in FIG. 2. FIG. 3 illustrates each process in step S4 indicated by S4 in FIG. 1.

In the forming process (step S4) of the light-emitting element layer 5, as illustrated in FIG. 3, first, the anode electrode 51 is formed on the thin film transistor layer 4 (step S21). Next, the edge cover 52 covering an edge of the anode electrode 51 is formed (step S22). Next, the HTL 21 is formed (step S23). Next, the EML 22 is formed as a nanoparticle layer pattern (step S24). Next, the ETL 23 is formed (step S25). Next, the cathode electrode 54 is formed (step S26).

The anode electrode 51 is an electrode that supplies positive holes (holes) to the EML 22 when a voltage is applied. The anode electrode 51 includes, for example, a material having a relatively large work function. Examples of the material include tin-doped indium oxide (ITO), zinc-doped indium oxide (IZO), aluminum-doped zinc oxide (AZO), gallium-doped zinc oxide (GZO), and antimony-doped tin oxide (ATO). One type of these materials may be used, or two or more types may be mixed and used, as appropriate.

The cathode electrode 54 is an electrode that supplies electrons to the EML 22 when a voltage is applied. The cathode electrode 54 is made of, for example, a material having a relatively small work function. Examples of the material include aluminum (Al), silver (Ag), barium (Ba), ytterbium (Yb), calcium (Ca), lithium (Li)—Al alloys, magnesium (Mg)—Al alloys, Mg—Ag alloys, Mg-indium (In) alloys, and Al-aluminum oxide ($Al_2O_3$) alloys.

Note that the anode electrode 51 and/or the cathode electrode 54 is made of a transparent material. One of the anode electrode 51 and the cathode electrode 54 may be made of a light-reflective material. For example, in a case where the display device 1 is a top-emitting display device, an upper electrode is made of a transparent material, and a lower lower-layer is made of a light-reflective material. In a case where the display device 1 is a bottom-emitting display device, the upper electrode is made of a light-reflective material, and the lower electrode is made of a transparent material.

In step S21 and step S26, formation (film formation) of the anode electrode 51 and the cathode electrode 54 may be implemented using, for example, physical vapor deposition (PVD), such as sputtering or vacuum vapor deposition, a spin coating method, or an ink-jet method.

Among the anode electrode 51 and the cathode electrode 54, the anode electrode 51 is a subpixel electrode formed in an island shape for each subpixel SP as described above, and is patterned for each subpixel SP. The cathode electrode 54 is a common electrode and is formed in a solid-like shape on the ETL 23.

The edge cover 52 covers an edge of the anode electrode 51 that is an island-shaped lower electrode. In step S22, the edge cover 52 can be formed into a desired shape by patterning a layer made of an insulating material deposited by PVD such as a sputtering method or a vacuum vapor deposition technique, a spin-applying method, or an ink-jet method, by, for example, using a photolithography method. Examples of the insulating material include an inorganic insulating material such as silicon nitride or silicon oxide, or an organic insulating material such as polyimide or acrylic resin.

The edge cover 52 covers the edge of the patterned lower layer electrode as described above and also functions as a subpixel separation film. Thus, each of the anode electrodes 51 is separated from each other by the edge cover 52.

The HTL 21 has hole transport properties and transports the positive holes supplied from the anode electrode 51 to the EML 22. A hole transport material is used for a material of the HTL 21. The hole transport material may be an organic material or an inorganic material. Examples of the hole transport material include polymer materials such as poly[(9,9-dioctylfluorenyl-2,7-diyl)-co-(4,4'-(N-(4-sec-butylphenyl) diphenylamine))](TFB), N,N'-bis(4-butylphenyl)-N,N'-bis(phenyl)-benzidine (poly-TPD), and p-type semiconductor materials such as nickel oxide (NiO) and molybdenum oxide ($MoO_x$). Only one type of these hole transport materials may be used, or two or more types thereof may be mixed and used as appropriate.

The ETL 23 has electron transport properties and transports the electrons supplied from the cathode electrode 54 to the EML 22. An electron transport material is used for a material of the ETL 23. The electron transport material may be an organic material and may be an inorganic material. Examples of the hole transport material include n-type semiconductor materials such as zinc oxide (ZnO) and magnesium zinc oxide (MgZnO) and polymer materials such as 1,3,5-tris(1-phenyl-1H-benzimidazol-2-yl)benzene (TPBi), bathophenanthroline (Bphen), and tris(2,4,6-trimethyl-3-(pyridin-3-yl)phenyl)borane (3TPYMB). Only one type of these electron transport materials may be used, or two or more types thereof may be mixed and used as appropriate.

In step S23, when the HTL 21 is made of the organic material, for example, the vacuum vapor deposition technique, the spin coating method, or the ink-jet method is preferably used for film formation of the HTL 21. In step S23, when the HTL 21 is made of the inorganic material, for example, PVD such as a sputtering method or a vacuum vapor deposition technique, a spin coating method, or an ink-jet method is used for formation (film formation) of the HTL 21.

In step S25, the same method as the film formation of the HTL 21 is used for the film formation of the ETL 23. That is, when the ETL 23 is made of the inorganic material, for example, PVD such as the sputtering method or the vacuum vapor deposition technique, a spin coating method, or the ink-jet method is suitably used for film formation of the ETL 23. When the ETL 23 is made of the organic material, for example, the vacuum vapor deposition technique, the spin coating method, or the ink-jet method is preferably used for film formation of the ETL 23.

At least the EML 22 of the EL layer 53 illustrated in FIG. 2, is patterned in an island shape for each subpixel SP. The HTL 21 and the ETL 23 may be formed in an island shape for each subpixel SP, or may be formed in a solid-like shape as common layers common to all the subpixels SP. In FIG. 2, a case is illustrated as an example in which the HTL 21 and the ETL 23 are common layers.

As illustrated in FIG. 2, the light-emitting element ESR includes an EML 22R (red EML) that emits red light as the EML 22. The light-emitting element ESG includes the EML 22G (green EML) that emits green light as the EML 22. The light-emitting element ESB includes an EML 22B (blue EML) that emits blue light as the EML 22. The EML 22R, the EML 22G, and the EML 22B may be in contact with or separated from each other.

The EML 22R, the EML 22G, and the EML 22B are quantum dot layers (nanoparticle layers) each containing quantum dots as a light-emitting material and emits EL light in association with recombination between the positive holes supplied from the anode electrode 51 and the electrons supplied from the cathode electrode 54. Note that hereinafter, quantum dot is referred to as “QD”.

The QD is an inorganic nanoparticle having a particle size of about several nm to several tens nm. A composition of the QD is derived from a semiconductor material, and thus the QD is also referred to as a semiconductor nanoparticle. The QD has a structure having a specific crystal structure, and thus the QD is also referred to as a nanocrystal. The QD emit fluorescence, for example, and is nano order in size, and thus the QD is also referred to as a fluorescent nanoparticle or a QD phosphor particle.

The QD may include, for example, a semiconductor material made of an element of at least one type selected from the group consisting of cadmium (Cd), sulfur (S), tellurium (Te), selenium (Se), zinc (Zn), indium (In), nitrogen (N), phosphorus (P), arsenic (As), antimony (Sb), aluminum (Al), gallium (Ga), lead (Pb), silicon (Si), germanium (Ge), and magnesium (Mg). Note that general QD contains Zn. Thus, the QD may be, for example, a semiconductor material including Zn.

Further, the QD may be a core type and may be a core-shell type or a core multi-shell type. Further, the QD may be a two-component core type, a three-component core type, or a four-component core type. Further, the QD may contain a doped nanoparticle, or may contain a compositionally graded structure.

An emission wavelength of QD can be changed in various ways, for example, to a red wavelength, a green wavelength, and a blue wavelength depending on a particle size and composition thereof.

Figure 4:
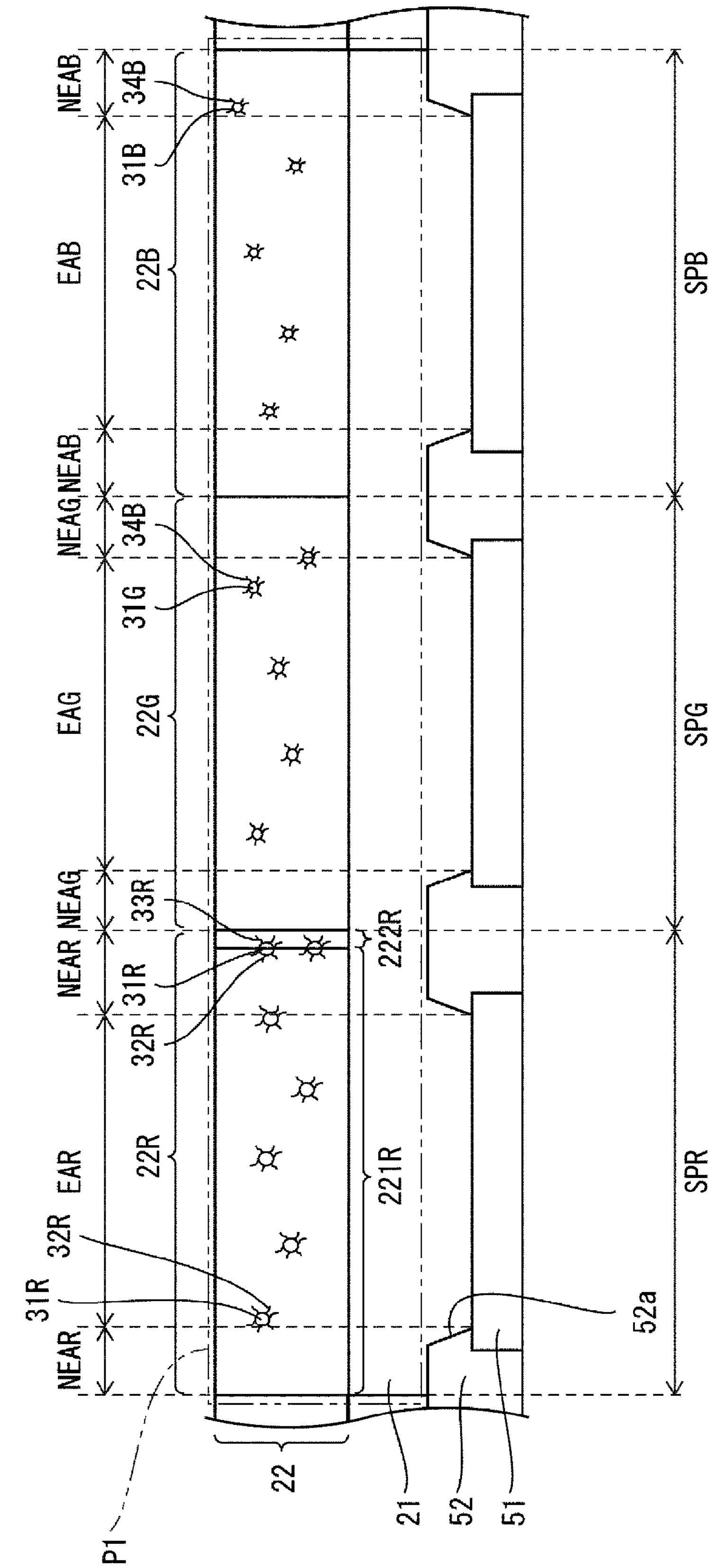
FIG. 4 is a cross-sectional view schematically illustrating an overall configuration of the main portions of the display device according to the first embodiment.

FIG. 4 is a cross-sectional view schematically illustrating an overall configuration of the main portions of the display device 1 according to the present embodiment. In FIG. 4, the QDs in the EML 22 are enlarged and the number of QDs is omitted.

As illustrated in FIG. 4, the EML 22R includes QDs 31R (red QDs) that emit red light as the QDs. The green EML 22G includes QDs 31G (green QDs) that emit green light as the QDs. The blue EML 22B includes QDs 31B (blue QDs) that emit blue light as the QDs.

Many ligands are coordinated to the surface of each of the QDs 31R, the QDs 31G, and the QDs 31B.

In the present embodiment, “coordinate” means that the ligand is adsorbed on the surface of the nanoparticle (in other words, the ligand modifies the surface of the nanoparticle (surface modification)). Here, “adsorption” means that the concentration of the ligands on the surface of the nanoparticle is higher than the concentration of the ligands in the surrounding area. The adsorption may be chemical adsorption in which there is a chemical bond between the nanoparticle and the ligand, physical adsorption, or electrostatic adsorption. The ligand may be bonded by a coordinate bond, a covalent bond, an ionic bond, a hydrogen bond, or the like, or need not be necessarily bonded, as long as the ligand chemically affects the surface of the nanoparticle by the adsorption. In the present embodiment, not only a molecule or an ion coordinated to the surface of the nanoparticle but also a molecule or an ion that can be coordinated but is not coordinated is referred to as “ligand”.

Thus, the EML 22R, the EML 22G and the EML 22B each contains the ligand. The EML 22R illustrated in FIG. 4 includes a non-dispersive ligand-containing portion 221R containing ligands 32R (non-dispersive ligands) as the ligands and a dispersive ligand-containing portion 222R containing ligands 33R (dispersive ligands) as the ligands.

To be more specific, the non-dispersive ligand-containing portion 221R contains the QDs 31R and the ligands 32R coordinated to the QDs 31R. The dispersive ligand-containing portion 222R contains at least the ligands 33R among the QDs 31R and the ligands 33R. The ligands 33R are coordinated to the QDs 31R to which the ligands 32R are coordinated. The non-dispersive ligand-containing portion 221R and the dispersive ligand-containing portion 222R are one continuous layer. The dispersive ligand-containing portion 222R is formed adjacent to the non-dispersive ligand-containing portion 221R at a part of an outer edge portion of the non-dispersive ligand-containing portion 221R, and is formed thinner than the non-dispersive ligand-containing portion 221R.

The dispersive ligand-containing portion 222R is formed by supplying the ligands 32R to a part of a QD film containing the QDs 31R and the ligands 33R coordinated to the QDs 31R and to be the non-dispersive ligand-containing portion 221R by patterning to perform ligand exchange.

The ligands 33R may be coordinated to the QDs 31R to which the ligands 32R are coordinated in the vicinity of the dispersive ligand-containing portion 222R in the non-dispersive ligand-containing portion 221R. As long as the ligands 33R and the ligands 32R are coordinated to the QDs 31R, the QDs 31R to which the ligands 33R are coordinated themselves (that is, the QDs 31R themselves) may be located in the non-dispersive ligand-containing portion 221R or may be located in the dispersive ligand-containing portion 222R. Thus, in an extreme case, the dispersive ligand-containing portion 222R may be made of only the ligands 33R.

In addition, the dispersive ligand-containing portion 222R may contain the QDs 31R, and the ligands 33R may be coordinated to the QDs 31R within a range in which the QDs 31R are not dispersed in a solvent. The ligand exchange gradually proceeds from a portion far from the non-dispersive ligand-containing portion 221R. Thus, the ligands 33R may have a concentration distribution in the dispersive ligand-containing portion 222R. In this case, the farther the dispersive ligand-containing portion 222R is from the non-dispersive ligand-containing portion 221R, the more the amount of the ligands 33R coordinated to the QDs 31R increases while the more the amount of the ligands 32R coordinated to the QDs 31R decreases.

The edge cover 52 is the subpixel separation film as described above. FIG. 2 and FIG. 4 illustrates, for example, a bottom-emitting display device as an example of the display device 1. The edge cover 52 is formed in a lattice pattern, for example. A part of the anode electrode 51 and the EML 22 exposed by an opening 52*a* of the edge cover 52 is light-emitting region of each subpixel SP, and the other region (in other words, a region overlapping the edge cover 52 in a plan view) is a non-light-emitting region of each subpixel SP.

As illustrated in FIG. 4, the subpixel SPR includes a light-emitting region EAR as the light-emitting region and a non-light-emitting region NEAR as the non-light-emitting region. The green subpixel SPG includes a light-emitting region EAG as the light-emitting region and a non-light-emitting region NEAG as the non-light-emitting region.

The blue subpixel SPB includes a light-emitting region EAB as the light-emitting region and a non-light-emitting region NEAB as the non-light-emitting region.

The dispersive ligand-containing portion 222R is formed in a part of the non-light-emitting region NEAR around the light-emitting region EAR, which corresponds to the edge cover 52 in a plan view.

The EML 22G in its entirety contains the QDs 31G and ligands 34G. The EML 22B illustrated in FIG. 4 in its entirety contains the QDs 31B and the ligands 34B.

The ligands 32R are monodentate ligands that are coordinated to the QDs 31R to significantly reduce dispersibility of the QDs 31R to any solvent. The QDs 31R to which the ligands 32R are coordinated become non-dispersible in a solvent. Thus, the ligands 32R are monodentate ligands that are coordinated to the QDs 31R to render the QDs 31R non-dispersible in the solvent.

The ligand is generally made of a coordinating functional group (adsorbing group) coordinated (adsorbed) to the surface of the nanoparticle and a carbon chain such as an alkyl chain bonded to the coordinating functional group.

The ligand 32R is the monodentate ligand as described above, and includes one coordinating functional group that can be coordinated to the QD 31R.

The coordinating functional group may be a functional group that can be coordinated to the QD 31R. Thus, examples of the coordinating functional group include typically at least one functional group selected from the group consisting of a thiol group, an amino group, a carboxy group, a phosphonic group, and a phosphine group.

The ligand 32R includes one coordinating functional group that can be coordinated to the QD 31R as described above, and is preferably a monomer having the number of carbons of a main chain skeleton illustrated below of 1 or more and 8 or less, and more preferably a monomer having the number of carbons of 1 or more and 5 or less.

The ligand 32R may contain a ring (ring structure) or need not contain the ring.

When the ligand 32R does not contain the ring as in a case of, for example, a chain compound, a carbon chain having the largest number of carbons contained in a carbon chain connecting the shortest distance from a carbon to which the coordinating functional group is bonded to a carbon of a terminal group is defined as the main chain skeleton.

On the other hand, when the ligand 32R contains the ring as in a case of, for example, a cyclic compound such as an alicyclic compound or an aromatic compound, when the ring does not include a substituent (a side chain or a branched chain) other than the coordinating functional group or a substituent containing the coordinating functional group, a carbon in the ring located at the opposite side of the carbon bonded to the coordinating functional group or the substituent containing the coordinating functional group is a carbon located farthest from the carbon bonded to the coordinating functional group. In addition, movement of a cyclic carbon chain is restricted as compared with a chain carbon chain. Thus, when the ligand 32R includes the ring, the number of carbons of the carbon chain contained in the ring is not a carbon chain that affects the dispersibility of the nanoparticle.

Thus, when the ligand 32R contains the ring, a carbon chain containing more carbons among the following (i) and (ii) is defined as the main chain skeleton.

(i) A carbon chain connecting the shortest distance along the ring from a carbon to which the coordinating functional group is bonded to a carbon (hereinafter referred to as "carbon at the opposite position") in the ring located on the opposite side of a carbon to which the coordinating functional group or the substituent containing the coordinating functional group is bonded.

(ii) A carbon chain having the largest number of carbons contained in a carbon chain connecting the shortest distance along the ring from a carbon to which the coordinating functional group is bonded to a carbon at a terminal of a substituent other than the coordinating functional group or the substituent containing the coordinating functional group bonded to the ring when the substituent other than the coordinating functional group or the substituent containing the coordinating functional group is bonded to the ring.

In (i) and (ii), "carbon to which the coordinating functional group is bonded" refers to a carbon in the ring to which the coordinating functional group is bonded when the coordinating functional group is bonded to the ring, and refers to a carbon in the substituent to which the coordinating functional group is bonded when the substituent containing the coordinating functional group is bonded to the ring.

That is, in the case where the ligand 32R contains the ring, when the number of carbons constituting the ring is counted along the ring with a carbon at the first position bonded to the coordinating functional group or the substituent containing the coordinating functional group as a first carbon, the number of carbons from the carbon in the ring to which the coordinating functional group or the substituent containing the coordinating functional group is bonded to the carbon at the opposite position is defined as the maximum number of carbons of the ring. For example, when the ligand 32R contains a benzene ring, a carbon at a p position (fourth position) is the carbon at the opposite position and the maximum number of carbons of the benzene ring is 4.

When the substituent other than the coordinating functional group or the substituent containing the coordinating functional group is not bonded to the ring, the number of carbons of the carbon chain that connect the shortest distance along the ring from a carbon to which the coordinating functional group is bonded to a carbon at the opposite position (that is, the carbon in the ring located on the opposite side of the carbon to which the coordinating functional group or the substituent containing the coordinating functional group is bonded) is the number of carbons of the main chain skeleton.

On the other hand, when the substituent other than the coordinating functional group or the substituent containing the coordinating functional group is bonded to the ring, the number of carbons of the carbon chain connecting the shortest distance along the ring from a carbon to which the coordinating functional group is bonded to a carbon at the opposite position is compared with the number of carbons of a carbon chain connecting the shortest distance along the ring from the carbon to which the coordinating functional group is bonded to a carbon at a terminal of the substituent other than the coordinating functional group or the substituent containing the coordinating functional group bonded to the ring, and the largest number of carbons among them is defined as the number of carbons of the main chain skeleton.

That is, a path connecting the shortest distance along the ring from a carbon to which the coordinating functional group is bonded to a carbon at the opposite position is defined as a first path and a path connecting the shortest distance along the ring from the carbon to which the coordinating functional group is bonded to a carbon bonded to the ring at a terminal of the substituent other than the coordinating functional group or the substituent containing the coordinating functional group bonded to the ring is defined as a second path, and in a case where the two paths are compared, the second path becomes the main chain skeleton when the second path is longer than the first path.

In any case, the main chain skeleton does not include the coordinating functional group itself. Thus, even when the coordinating functional group contains a carbon, the number of carbons of the main chain skeleton does not include the number of carbons of the coordinating functional group.

Examples of the ligand 32R include thiols including one thiol group and having the number of carbons of the main chain skeleton of 1 or more and 8 or less such as ethyl mercaptan (ethanethiol), 1-propanethiol, 1-butanethiol, 1-pentanethiol, 2-methyl-1-butanethiol, o-toluenethiol, m-toluenethiol, p-toluenethiol, 2, 4-dimethylbenzenethiol, 3, 4-dimethylbenzenethiol, 2, 5-dimethylbenzenethiol, 3, 5-dimethylbenzenethiol, and 3-methylcyclopentanethiol, amines including one amino group and having the number of carbons of the main chain skeleton of 1 or more and 8 or less such as methyl amine, pentylamine, and p-toluidine, carboxylic acids including one carboxy group and having the number of carbons of the main chain skeleton of 1 or more and 8 or less such as pentanoic acid and benzoic acid, phosphonic acid including one phosphonic group and having the number of carbons of the main chain skeleton of 1 or more and 8 or less such as ethylphosphonic acid, and phosphines including one phosphine group and having the number of carbons of the main chain skeleton of 1 or more and 8 or less such as trimethylphosphine. Only one type of these ligands 32R may be used, or two or more types may be mixed and used, as appropriate.

As described above, the ligand 32R may be an aliphatic ligand such as linear alkyl thiol, linear alkyl amine, linear alkyl carboxylic acid, linear alkyl phosphonic acid, or linear alkyl phosphinic acid. The ligand 32R may be an aromatic ligand such as benzenethiol, benzeneamine, benzenecarboxylic acid, benzenephosphonic acid, or benzenephosphinic acid, or a cycloaliphatic ligand. Each of them may include a branched chain or a substituent.

How to count the number of carbons of the main chain skeleton of the ligand 32R will be specifically described with reference to examples. First, a description will be given with reference to pentylamine that is a linear alkyl amine ligand. Pentylamine does not contain the ring, a chain compound, and thus a carbon chain having the largest number of carbons contained in a carbon chain connecting the shortest distance from a carbon to which the coordinating functional group is bonded to a carbon of the terminal group is defined as the main chain skeleton. Thus, the number of carbons of the main chain skeleton of pentylamine is 5 as represented by (1) to (5) in the following formula (A).

[Chem. 1]

(A)

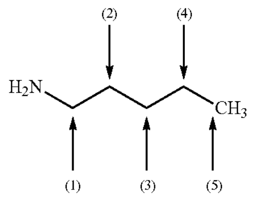

Next, a description will be given with reference to 2-methyl-1-butanethiol that is an aliphatic ligand including a branched chain. A carbon chain connecting the shortest distance from a carbon to which the coordinating functional group is bonded to a carbon of a terminal group in 2-methyl-1-butanethiol includes a carbon chain (first carbon chain) having the number of carbons of 4 including carbons represented by (1) to (4) in the following formula (B) and a carbon chain (second carbon chain) having the number of carbons of 3 including carbons represented by (1), (2), and (3)' in the following formula (B). In this case, the number of carbons of the first carbon chain is larger than the number of carbons of the second carbon chain, and thus the first carbon chain is defined as the main chain skeleton, and a carbon chain having a carbon represented by (3)' branched from the main chain skeleton is defined as the branched chain. Thus, the number of carbons of the main chain skeleton of 2-methyl-1-butanethiol is 4.

[Chem. 2]

(B)

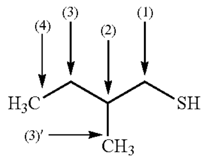

Next, a description will be given with reference to p-toluenethiol that is an aromatic ligand (specifically, a benzenethiol ligand) including a benzene ring to which one substituent other than the coordinating functional group is bonded. As illustrated in the following formula (C), p-toluenethiol includes the benzene ring to which the coordinating functional group is directly bonded and a substituent other than the coordinating functional group at the opposite position of a carbon to which the coordinating functional group is bonded in the benzene ring. Thus, a carbon chain connecting the shortest distance along the benzene ring from a carbon to which the coordinating functional group is bonded to a carbon at a terminal of the substituent other than the coordinating functional group is defined the main chain skeleton.

Examples of the carbon chain connecting the shortest distance along the benzene ring from the carbon to which the coordinating functional group of p-toluenethiol is bonded to the carbon at the terminal of the substituent other than the coordinating functional group include a carbon chain (first carbon chain) including carbons represented by (1) to (5) in the following formula (C) and a carbon chain (second carbon chain) including carbons represented by (1), (2)', (3)', (4), and (5) in the following formula (C). In this case, the number of carbons of the first carbon chain is the same as the number of carbons of the second carbon chain, and either carbon chain may be regarded as the main chain skeleton. In any case, the number of carbons of the main chain skeleton of p-toluenethiol is 5.

[Chem. 3]

(C)

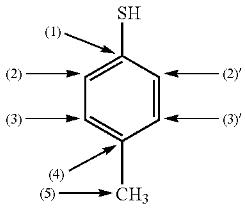

Next, a description will be given with reference to o-toluenethiol that is a benzenethiol ligand including a benzene ring to which one substituent other than the coordinating functional group is bonded. As illustrated in the following formula (D), o-toluenethiol includes the benzene ring to which the coordinating functional group is directly bonded and a substituent other than the coordinating functional group in the middle of a path connecting the shortest distance along the benzene ring between a carbon to which the coordinating functional group is bonded and a carbon at the opposite position (p position) in the benzene ring.

Examples of the carbon chain connecting the shortest distance along the benzene ring from the coordinating functional group of p-toluenethiol to the carbon at the p position include a carbon chain (first carbon chain) including carbons represented by (1) to (4) in the following formula (D) and a carbon chain (second carbon chain) including carbons represented by (1), (2)', (3)', and (4) in the following formula (D). In this case, the number of carbons of any carbon chain is 4.

On the other hand, a carbon chain connecting the shortest distance along the benzene ring from the carbon to which the coordinating functional group is bonded in p-toluenethiol to a carbon at a terminal of the substituent other than the coordinating functional group is a carbon chain (third carbon chain) including carbons represented by (1), (2)', and (3)" in the following formula (D) and the number of carbons of the carbon chain is 3.

Examples of the carbon chain connecting the carbon bonded to the coordinating functional group and the carbon to which the substituent other than the coordinating functional group is bonded in the benzene ring include a carbon chain having the number of carbons of 3 including carbons represented by (1), (2)', and (3)" in the following formula (D) and a carbon chain having the number of carbons of 6 including carbons represented by (1) to (4), (3)', and (2)' in the following formula (D), which constitute the third carbon chain.

However, as described above, in the present embodiment, when the number of carbons constituting the ring is counted along the ring, the number of carbons from the carbon bonded to the coordinating functional group to the carbon at the opposite position is defined as the maximum number of carbons of the ring. The number of carbons of 6 exceeds the maximum number of carbons of 4 in the benzene ring. In addition, a path connecting the carbons represented by (1) to (4), (3)', and (2)' in the following formula (D) is not a path connecting the shortest distance along the benzene ring from a carbon to which the coordinating functional group is bonded to a carbon at a terminal of the substituent other than the coordinating functional group. In other words, the carbon chain including carbons represented by (1) to (4), (3)', and (2)' in the following formula (D) is not the carbon chain connecting the shortest distance along the benzene ring from a carbon to which the coordinating functional group is bonded to a carbon at a terminal of the substituent other than the coordinating functional group.

Thus, the first carbon chain or the second carbon chain connecting the shortest distance along the benzene ring from a carbon to which the coordinating functional group is bonded to a carbon at the p position in the benzene ring of o-toluenethiol is defined as the main chain skeleton of o-toluenethiol. In any case, the number of carbons of the main chain skeleton of o-toluenethiol is 4.

[Chem. 4]

(D)

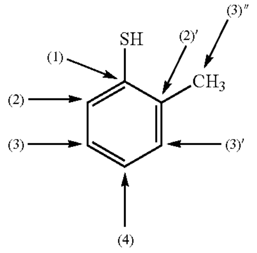

Similarly, as illustrated in the following formula (E), m-toluenethiol that is the benzenethiol ligand including a benzene ring to which one substituent other than the coordinating functional group is bonded includes the benzene ring to which the coordinating functional group is directly bonded and a substituent other than the coordinating functional group in the middle of a path connecting the shortest distance along the benzene ring between a carbon to which the coordinating functional group is bonded and a carbon at the opposite position (p position) in the benzene ring.

Examples of the carbon chain connecting the shortest distance along the benzene ring from a carbon to which the coordinating functional group is bonded to a carbon at the p position in the benzene ring of m-toluenethiol include a carbon chain (first carbon chain) including carbons represented by (1) to (4) in the following formula (D) and a carbon chain (second carbon chain) including carbons represented by, for example, (1), (2)', (3)', and (4) in the following formula (D). In this case, the number of carbons of any carbon chain is 4.

A carbon chain connecting the shortest distance along the benzene ring from the carbon to which the coordinating functional group of m-toluenethiol is bonded to a carbon at a terminal of the substituent other than the coordinating functional group is a carbon chain (third carbon chain) including carbons represented by (1), (2)', (3)', and (4)' in the following formula (E) and the number of carbons of the carbon chain is 4.

Thus, in this case, the number of carbons of the first carbon chain, the number of carbons of the second carbon chain, and the number of carbons of the third carbon chain are the same, and any carbon chain may be regarded as the main chain skeleton. In any case, as described above, the number of carbons of the main chain skeleton of m-toluenethiol is 4.

[Chem. 5]

(E)

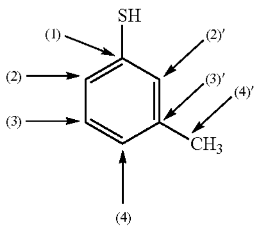

Next, a description will be given with reference to 2, 4-dimethylbenzenethiol that is a benzenethiol ligand including a benzene ring to which two substituent other than the coordinating functional group are bonded. As illustrated in the following formula (F), 2, 4-dimethylbenzenethiol includes the benzene ring to which the coordinating functional group is directly bonded and includes a substituent other than the coordinating functional group in the middle of a path connecting the shortest distance along the benzene ring between a carbon to which the coordinating functional group is bonded and a carbon at the opposite position (p position) and at the opposite position of the coordinating functional group in the benzene ring.

As illustrated in the following formula (F), when the substituent other than the coordinating functional group at the opposite position to the coordinating functional group in the benzene ring is included, a carbon chain connecting the shortest distance along the benzene ring from a carbon to which the coordinating functional group is bonded to a carbon at a terminal of the substituent other than the coordinating functional group bonded to the carbon at the opposite position is naturally longer than a carbon chain connecting the shortest distance along the benzene ring from the carbon to which the coordinating functional group is bonded to a carbon at the opposite position in the benzene ring.

Examples of the carbon chain connecting the shortest distance along the benzene ring from a carbon to which the coordinating functional group is bonded to a carbon at the p position at a terminal of the substituent other than the coordinating functional group in the benzene ring of 2, 4-dimethylbenzenethiol include a carbon chain (first carbon chain) including carbons represented by (1) to (5) in the following formula (F) and a carbon chain (second carbon chain) including carbons represented by (1), (2)', (3)', (4), and (5) in the following formula (F). In this case, the number of carbons of any carbon chain is 5.

2, 4-dimethylbenzenethiol also includes the substituent other than the coordinating functional group at the o position (second position) in addition to the p position (fourth position). A carbon chain connecting the shortest distance along the benzene ring from a carbon to which the coordinating functional group is bonded to a carbon at the o position at a terminal of the substituent other than the coordinating functional group in the benzene ring of 2, 4-dimethylbenzenethiol is a carbon chain (third carbon chain) including carbons represented by (1), (2)', and (3)" in the following formula (F) and the number of carbons of the carbon chain is 3.

Thus, the first carbon chain or the second carbon chain connecting the shortest distance along the benzene ring from a carbon to which the coordinating functional group is bonded to the carbon at a p position at the terminal of the substituent other than the coordinating functional group in the benzene ring of 2, 4-dimethylbenzenethiol is defined as the main chain skeleton of 2, 4-dimethylbenzenethiol. In any case, the number of carbons of the main chain skeleton of 2, 4-dimethylbenzenethiol is 5.

[Chem. 6]

(F)

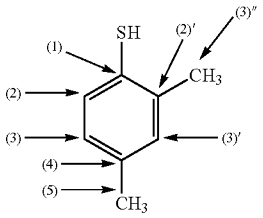

Next, a description will be given with reference to 2, 5-dimethylbenzenethiol that is a benzenethiol ligand including a benzene ring to which two substituent other than the coordinating functional group are bonded. As illustrated in the following formula (G), 2, 5-dimethylbenzenethiol includes the benzene ring to which the coordinating functional group is directly bonded and two substituents other than the coordinating functional group in the middle of a path connecting the shortest distance along the benzene ring between a carbon to which the coordinating functional group is bonded and a carbon at the opposite position (p position) in the benzene ring.

Examples of the carbon chain connecting the shortest distance along the benzene ring from a carbon to which the coordinating functional group is bonded to a carbon at the p position at the terminal of the substituent other than the coordinating functional group in the benzene ring of 2, 5-dimethylbenzenethiol include a carbon chain (first carbon chain) including carbons represented by (1) to (4) in the following formula (G) and a carbon chain (second carbon chain) including carbons represented by (1), (2)', (3)', and (4) in the following formula (G). In this case, the number of carbons of any carbon chain is 4.

The carbon chain connecting the shortest distance along the benzene ring from a carbon to which the coordinating functional group is bonded to a carbon at the o position (second position) at the terminal of the substituent other than the coordinating functional group in the benzene ring of 2, 5-dimethylbenzenethiol is a carbon chain (third carbon chain) including carbons represented by (1), (2)', and (3)" in the following formula (G) and the number of carbons of the carbon chain is 3.

The carbon chain connecting the shortest distance along the benzene ring from a carbon to which the coordinating functional group is bonded to a carbon at the m position (fifth position) at the terminal of the substituent other than the coordinating functional group in the benzene ring of 2, 5-dimethylbenzenethiol is a carbon chain (fourth carbon chain) including carbons represented by (1), (2), (3), and (4) in the following formula (G) and the number of carbons of the carbon chain is 4.

Thus, in this case, the number of carbons of the first carbon chain, the second carbon chain, and the fourth carbon chain are the same, and any carbon chain among them may be regarded as the main chain skeleton. In any case, the number of carbons of the main chain skeleton of 2, 5-dimethylbenzenethiol is 4.

[Chem. 7]

(G)

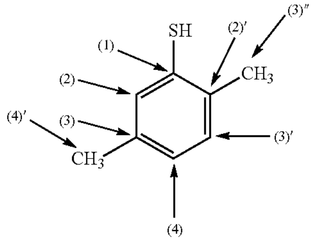

Next, a description will be given with reference to benzoic acid that is an aromatic ligand (specifically, a benzenecarboxylic acid ligand) including a benzene ring to which the coordinating functional group containing a carbon is bonded. As illustrated in the following formula (H), benzoic acid includes the benzene ring to which the coordinating functional group is directly bonded, but does not include the substituent other than the coordinating functional group. Thus, the carbon chain connecting the shortest distance along the benzene ring from a carbon to which the coordinating functional group is bonded to a carbon at the opposite position (p position) thereof in the benzene ring is the number of carbons of the main chain skeleton. In benzoic acid, the coordinating functional group itself includes a carbon, but as described above, the coordinating functional group is not included in the main chain skeleton. Thus, a carbon chain (first carbon chain) including carbons represented by (1) to (4) in the following formula (H) or a carbon chain (second carbon chain) including carbons represented by (1), (2)', (3)', and (4) in the following formula (D) is defined as the main chain skeleton of benzoic acid. In any case, the number of carbons of the main chain skeleton of benzoic acid is 4.

[Chem. 8]

(H)

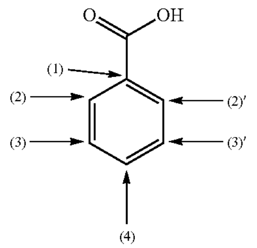

Next, a description will be given with reference to 3-methylcyclopentanethiol that is a cycloaliphatic ligand to which one substituent other than the coordinating functional group is bonded. As illustrated in the following formula (I), 3-methylcyclopentanethiol includes cyclopentane (five-membered ring) to which a coordinating functional group is directly bonded and a substituent other than the coordinating functional group at the opposite position to the coordinating functional group in the cyclopentane, and thus, a carbon chain connecting the shortest distance along the ring from a carbon to which the coordinating functional group is bonded to a carbon at the terminal of the substituent other than the coordinating functional group is defined as the main chain skeleton.

Examples of the carbon chain connecting the carbon bonded to the coordinating functional group and the carbon to which the substituent other than the coordinating functional group is bonded in the cyclopentane include a carbon chain (first carbon chain) having the number of carbons of 3 including carbons represented by (1) to (3) in the following formula (I) and a carbon chain (second carbon chain) having the number of carbons of 4 including carbons represented by (1), (2)', (3)' and (3), in the following formula (I).

However, in cyclopentanethiol, the opposite position of the coordinating functional group is the third position, and the maximum number of carbons of cyclopentane constituting a part of the main chain skeleton is 3. The number of carbons of 4 exceeds the maximum number of carbons of 3 of cyclopentane. In addition, a path connecting the carbons represented by (1), (2)', (3)', and (3) in the following formula (I) is not a path connecting the shortest distance along the ring from a carbon to which the coordinating functional group is bonded to a carbon at a terminal of the substituent other than the coordinating functional group.

Thus, a carbon chain including the first carbon chain including the carbons represented by (1) to (4) in the following formula (I) is defined as the main chain skeleton of 3-methylcyclopentanethiol. Thus, the number of carbons of the main chain skeleton of 3-methylcyclopentanethiol is 4.

[Chem. 9]

(I)

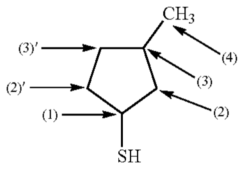

Next, a description will be given with reference to 4-phenylbutylamine that is an aromatic ligand including a benzene ring to which a substituent containing a coordinating functional group is bonded. 4-phenylbutylamine includes the benzene ring to which only $—(CH_2)_4NH_2$ containing an amino group ($—NH_2$) that is a coordinating functional group is bonded as the substituent. Thus, the number of carbons of the carbon chain connecting the shortest distance along the benzene ring from a carbon in the substituent to which the amino group is bonded to a carbon at the opposite position (p position) to a carbon to which the substituent is bonded in the benzene ring is the number of carbons of the main chain skeleton. The number of carbons of the substituent included in the main chain skeleton is 4, and the maximum number of carbons of the benzene ring is 4, and thus the number of carbons of the main chain skeleton of 4-phenylbutylamine is 8.

The number of carbons of the main chain skeleton of the ligand 32R other than those described above can also be determined in the same manner. An example of the ligand 32R used in the present embodiment is shown in Table 1 together with the number of carbons of the main chain skeleton of the ligand 32R.

TABLE 1

| Non-dispersive ligand | Number of carbons of main chain skeleton |
|---|---|
| Ethyl mercaptan | 2 |
| 1-propanethiol | 3 |
| 1-butanethiol | 4 |
| 1-pentanethiol | 5 |
| 2-methyl-1-butanethiol | 4 |
| o-toluenethiol | 4 |
| m-toluenethiol | 4 |
| p-toluenethiol | 5 |
| 2,4-dimethylbenzenethiol | 5 |
| 3,4-dimethylbenzenethiol | 5 |
| 2,5-dimethylbenzenethiol | 4 |
| 3,5-dimethylbenzenethiol | 4 |
| 3-methylcyclopentanethiol | 4 |
| 4-tert-butylbenzenethiol | 6 |
| 4-isopropylbenzenethiol | 6 |
| Methylamine | 1 |
| Pentylamine | 5 |
| p-toluidine | 5 |
| 4-phenylbutylamine | 8 |
| Pentanoic acid | 4 |
| Benzoic acid | 4 |
| Ethylphosphonic acid | 2 |
| Trimethylphosphine | 1 |

Note that the above example is merely an example, and the ligand 32R is not particularly limited as long as the ligand 32R is the monodentate ligand that is coordinated to the QD 31R to render the QD 31R non-dispersible in the solvent as described above.

Among them, the ligand 32R is preferably at least one type of a ligand selected from the group consisting of, for example, ethyl mercaptan, 1-propanethiol, 1-butanethiol, 1-pentanethiol, 2-methyl-1-butanethiol, o-toluenethiol, m-toluenethiol, p-toluenethiol, 2, 4-dimethylbenzenethiol, 3, 4-dimethylbenzenethiol, 2, 5-dimethylbenzenethiol, 3, 5-dimethylbenzenethiol, 3-methylcyclopentanethiol, 4-tert-butylbenzenethiol, 4-isopropylbenzenethiol, methyl amine, pentylamine, p-toluidine, 4-phenylbutylamine, pentanoic acid, benzoic acid, ethylphosphonic acid, and trimethylphosphine. The ligand 32R is more preferably a ligand having the number of carbons of the main chain skeleton of 5 or less, and even more preferably p-toluenethiol.

The ligand 33R is a ligand that is coordinated to the QD 31R to disperse the QD 31R in one of organic solvents of a polar organic solvent and a non-polar organic solvent (non-polar solvent). The ligand 33R is not particularly limited as long as the ligand 33R is a ligand capable of dispersing the QD 31R to which the ligand 33R is coordinated in any one of the organic solvents described above. The ligand 33R may be a non-polar ligand and may be a polar ligand, for example.

Here, "non-polar ligand" refers to a ligand having high polarity due to a polarity of the coordinating functional group in a free state in which the ligand is not coordinated to the nanoparticle, while having low polarity or no polarity by the polarity of the coordinating functional group being canceled by the nanoparticle in a coordinated state in which the ligand is coordinated to the nanoparticle via the coordinating functional group.

The "polar ligand" refers to a ligand having high polarity due to a polarity of the coordinating functional group in a free state in which the ligand is not coordinated to the nanoparticle, and having high polarity also in the coordinated state in which the ligand is coordinated to the nanoparticle via the coordinating functional group.

The nanoparticle to which the non-polar ligand is coordinated is easily dispersed in the non-polar organic solvent. On the other hand, the nanoparticle to which the polar ligand is coordinated is easily dispersed in the polar solvent such as the polar organic solvent or water.

As described above, in the present embodiment, a ligand that is coordinated to the QD 31R to disperse the QD 31R in one of the organic solvents of the polar organic solvent and the non-polar organic solvent is used as the ligand 33R.

Although a method for forming the EML 22R will be described later, as the non-polar organic solvent, an organic solvent having a dielectric constant (Y) of 1.8 or more and 6.1 or less (that is, $1.8 \leq Y \leq 6.1$) is preferably used. As the polar organic solvent, an organic solvent having the dielectric constant (Y) of more than 6.1 and 50 or less (that is, $6.1 < Y \leq 50$) is preferably used. The same applies to a non-polar organic solvent and a polar organic solvent described below.

Table 2 shows the dielectric constants of main solvents. In the present embodiment, "dielectric constant" refers to a dielectric constant measured at around from 20° C. to 25° C. The generally disclosed dielectric constant is a value measured at around from 20° C. to 25° C., and thus the generally disclosed dielectric constant can be adopted as it is as the above-described dielectric constant. Note that a method for measuring the dielectric constant and a measuring device are not particularly limited. As an example, a liquid dielectric constant meter can be used.

TABLE 2

| Solvent | Dielectric constant |
|---|---|
| Pentane | 1.84 |
| Hexane | 1.89 |
| Heptane | 1.92 |
| Octane | 1.948 |
| Carbon tetrachloride | 2.24 |
| p-xylene | 2.27 |
| Benzene | 2.28 |
| Toluene | 2.38 |
| Diethyl ether | 4.34 |
| Chloroform | 4.9 |
| Butyl acetate | 5.01 |
| Isobutyl acetate | 5.29 |
| Chlorobenzene | 5.62 |

TABLE 2-continued

| Solvent | Dielectric constant |
|---|---|
| Ethyl acetate | 6.02 |
| Dimethyl ether | 6.18 |
| THF | 7.6 |
| Dichloromethane | 9.08 |
| 1,2-dichloroethane | 10.42 |
| Ethylene glycol monomethyl ether | 16.9 |
| 1-butanol | 17.5 |
| 2-propanol | 19.9 |
| 1-propanol | 20.3 |
| Acetone | 20.7 |
| Acetaldehyde | 21.1 |
| Ethanol | 24.6 |
| Methanol | 32.7 |
| DMF | 36.7 |
| Acetonitrile | 37.5 |
| Ethylene glycol | 37.7 |
| DMSO | 46.7 |

As shown in Table 2, examples of the organic solvent satisfying $1.8 \leq Y \leq 6.1$ include pentane, hexane, heptane, octane, carbon tetrachloride, p-xylene, benzene, toluene, diethyl ether, chloroform, butyl acetate, isobutyl acetate, chlorobenzene, and ethyl acetate.

As shown in Table 2, examples of the organic solvent satisfying $6.1 < Y \leq 50$ include dimethyl ether, tetrahydrofuran (THF), dichloromethane, 1, 2-dichloroethane, ethylene glycol monomethyl ether, 1-butanol, 2-propanol, 1-propanol, acetone, acetaldehyde, ethanol, methanol, N, N-dimethylformamide (DMF), acetonitrile, ethylene glycol, and dimethyl sulfoxide (DMSO).

As described above, the ligand that is coordinated to disperse the QD 31R in any one of the organic solvents of the polar organic solvent and the non-polar organic solvent may be used as the ligand 33R. However, when the nanoparticle is the QD and the carrier transport layer containing the inorganic nanoparticle such as a metal oxide nanoparticle having carrier transport properties is formed adjacent to the EML 22 as described above, the ligand 33R is preferably a ligand capable of dispersing the QD 31R to which the ligand 33R is coordinated in the non-polar organic solvent.

In the related art, many QDs to which the ligands are coordinated are hardly dispersed in the polar organic solvent and easily dispersed in the non-polar organic solvent. As the ligand 33R, a known monodentate ligand which has been generally used for the QD can be used.

Examples of such a ligand 33R include a monodentate monomer including one coordinating functional group that coordinates to the QD 31R and having the number of carbons of the main chain skeleton of 9 or more and 30 or less.

Examples of the coordinating functional group that coordinates to the QD31R include the coordinating functional groups exemplified above. As described above, the number of carbons of the main chain skeleton of the ligand indicates the number of carbons of the longest carbon chain connecting the shortest distance between the coordinating functional group and the terminal group of the ligand. Thus, the number of carbons of the main chain skeleton of the ligand 33R indicates the number of carbons of the longest carbon chain connecting the shortest distance between the coordinating functional group and the terminal group of the ligand 33R.

Examples of the ligand 33R include oleic acid, dodecanoic acid, dodecanethiol, dodecyl amine, trioctylphosphine, and trioctylphosphine oxide.

Nanoparticle Film Patterning Method

Next, a nanoparticle film patterning method according to the present embodiment will be described.

The nanoparticle film patterning method according to the present embodiment is a method for forming the nanoparticle layer pattern by forming a non-dispersive ligand-containing portion containing a nanoparticle and a monodentate non-dispersive ligand that is coordinated to the nanoparticle to render the nanoparticle non-dispersible in a solvent in a part of a nanoparticle film containing the nanoparticle, and removing a portion of the nanoparticle film other than the non-dispersive ligand-containing portion with a first organic solvent.

In the present embodiment, as the above-described nanoparticle film patterning method, the nanoparticle film is patterned using a nanoparticle film patterning method (hereinafter referred to as "first method") described below.

The first method includes a nanoparticle film forming process, a non-dispersive ligand supplying process, a resist patterning process, a dispersive ligand substituting process, and a resist pattern removing process, which are described below.

Here, the nanoparticle film forming process is a process of forming, as the nanoparticle film, a nanoparticle film containing at least the nanoparticle among the nanoparticle and a first ligand.

The non-dispersive ligand supplying process is a process of supplying non-dispersive ligand dispersion containing the non-dispersive ligand and a second organic solvent to the entire nanoparticle film and coordinating the non-dispersive ligand to the nanoparticle.

When the nanoparticle film contains the nanoparticle and the first ligand (in other words, when the nanoparticle film contains the nanoparticle to which the first ligand is coordinated), the non-dispersive ligand dispersion is supplied to the entirety of the nanoparticle film, and thus the non-dispersive ligand is coordinated to the nanoparticle by ligand exchange. Thus, the non-dispersive ligand supplying process may be a non-dispersive ligand substituting process of substituting the first ligand in the entire nanoparticle film with the non-dispersive ligand.

The resist patterning process is a process of forming a resist pattern on a part of the nanoparticle film after the non-dispersive ligand substituting process.

The dispersive ligand substituting process is a process of forming the non-dispersive ligand-containing portion by supplying dispersive ligand dispersion containing the dispersive ligand that is coordinated to the nanoparticle to disperse the nanoparticle in the first organic solvent and the first organic solvent to a portion of the nanoparticle film not covered with the resist pattern to substitute the non-dispersive ligand in the portion not covered with the resist pattern with the dispersive ligand, and dispersing, in the first organic solvent, the nanoparticle to which the dispersive ligand is coordinated and that is dispersible in the first organic solvent and removing the nanoparticle.

The resist pattern removing process is a process of removing the resist pattern after the dispersive ligand substituting process.

Here, the first ligand refers to a ligand (original ligand) coordinated to a nanoparticle that is not subjected to the ligand exchange, and the dispersive ligand refers to a ligand that can be redispersed in the organic solvent by subjecting the non-dispersive ligand to the ligand exchange. That is, each of the first ligand and the dispersive ligand represents a surface modifier that is coordinated to the nanoparticle to render the nanoparticle dispersible in the organic solvent. On the other hand, the non-dispersive ligand represents a surface modifier that is coordinated to the nanoparticle to render the nanoparticle non-dispersible in the organic solvent.

In the present embodiment, an example of a method will be described in which after the EML 22R is formed using the first method in step S24, the EML 22G and the EML 22B are formed.

Figure 5:
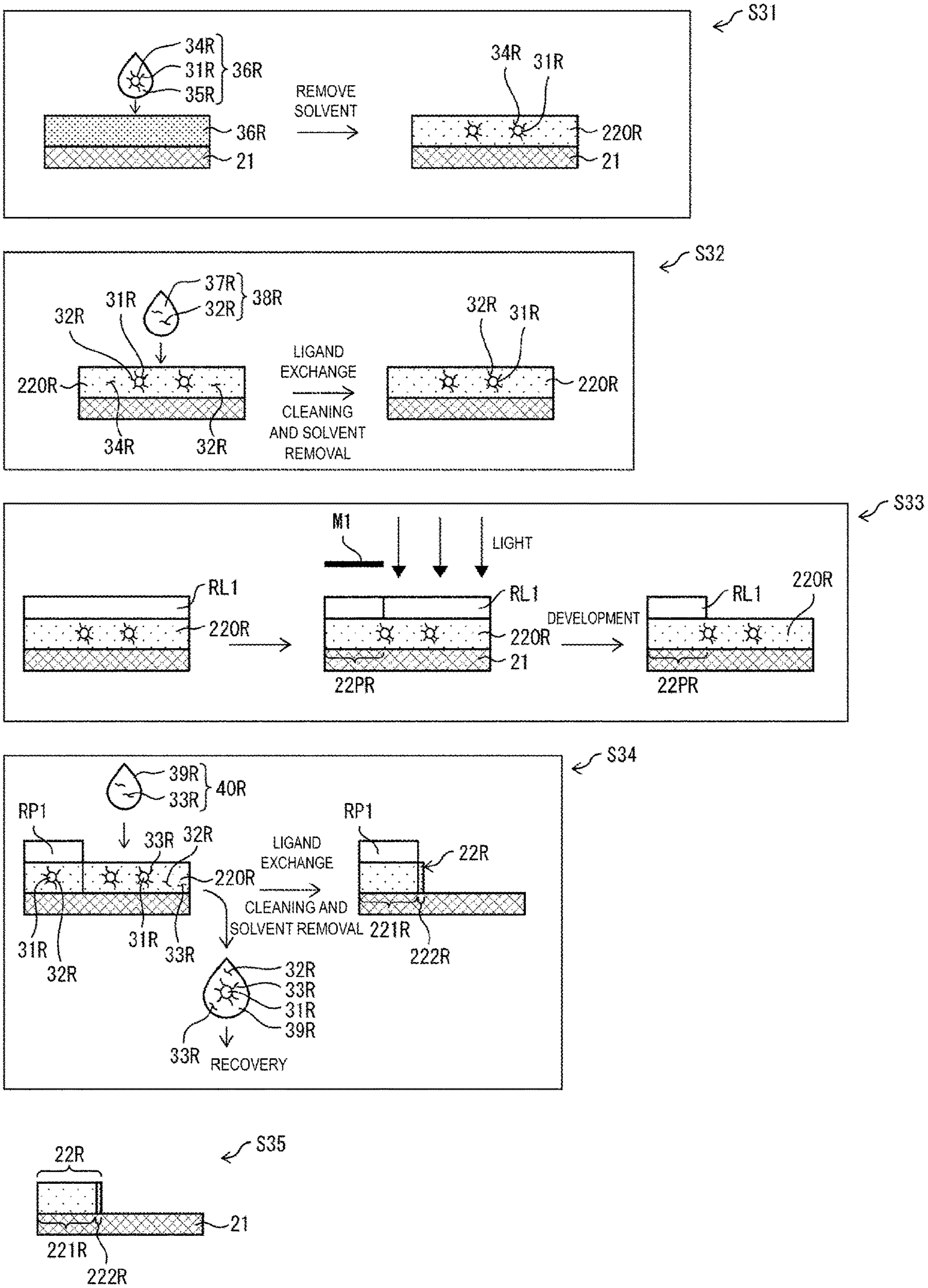
FIG. 5 is a cross-sectional view illustrating an example of processes of a part of the nanoparticle layer patterning process illustrated in FIG. 3 according to the first embodiment in order of the processes.
Figure 6:
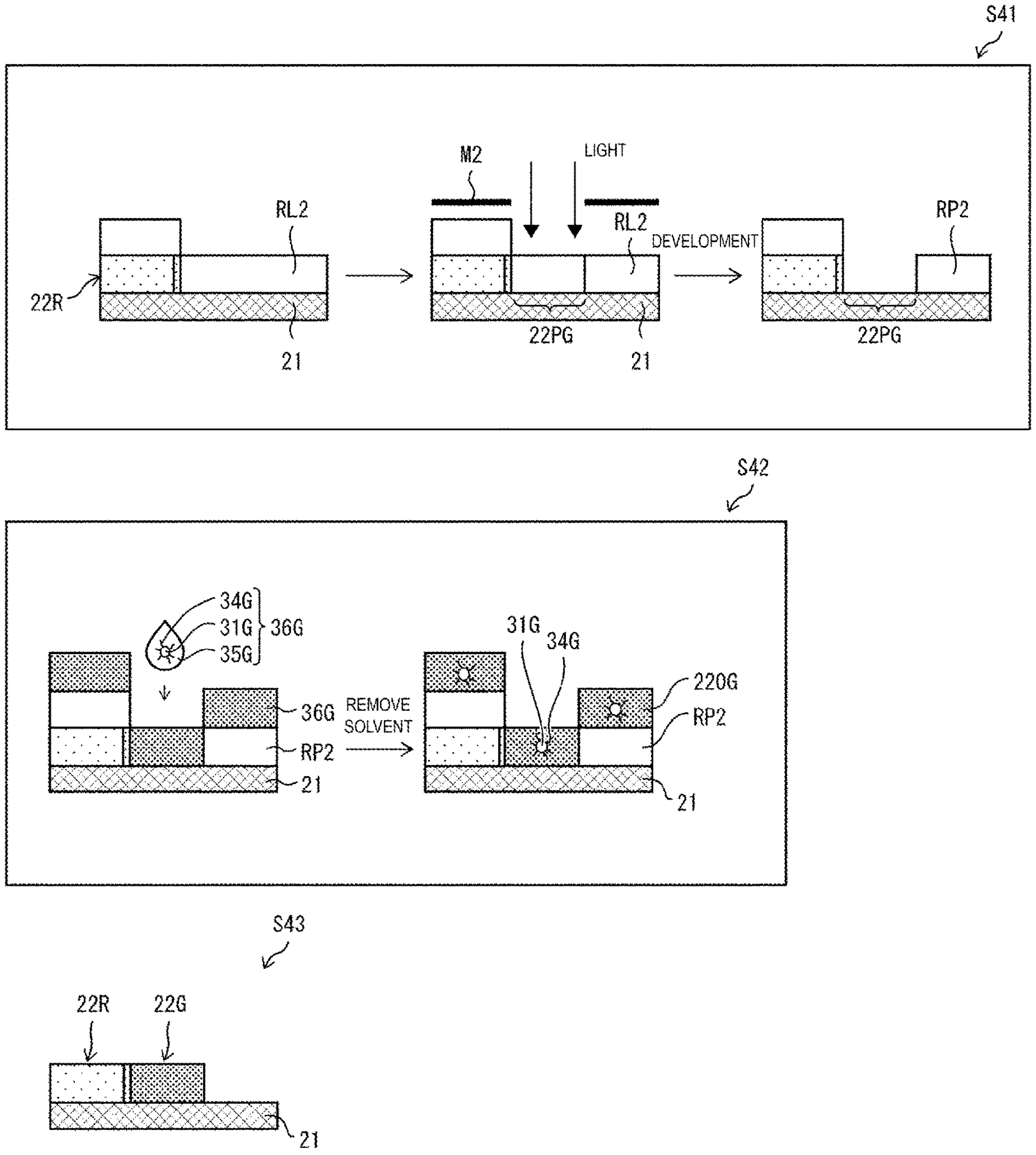
FIG. 6 is a cross-sectional view illustrating an example of processes of a part of the nanoparticle layer patterning process illustrated in FIG. 3 according to the first embodiment in order of the processes.
Figure 7:
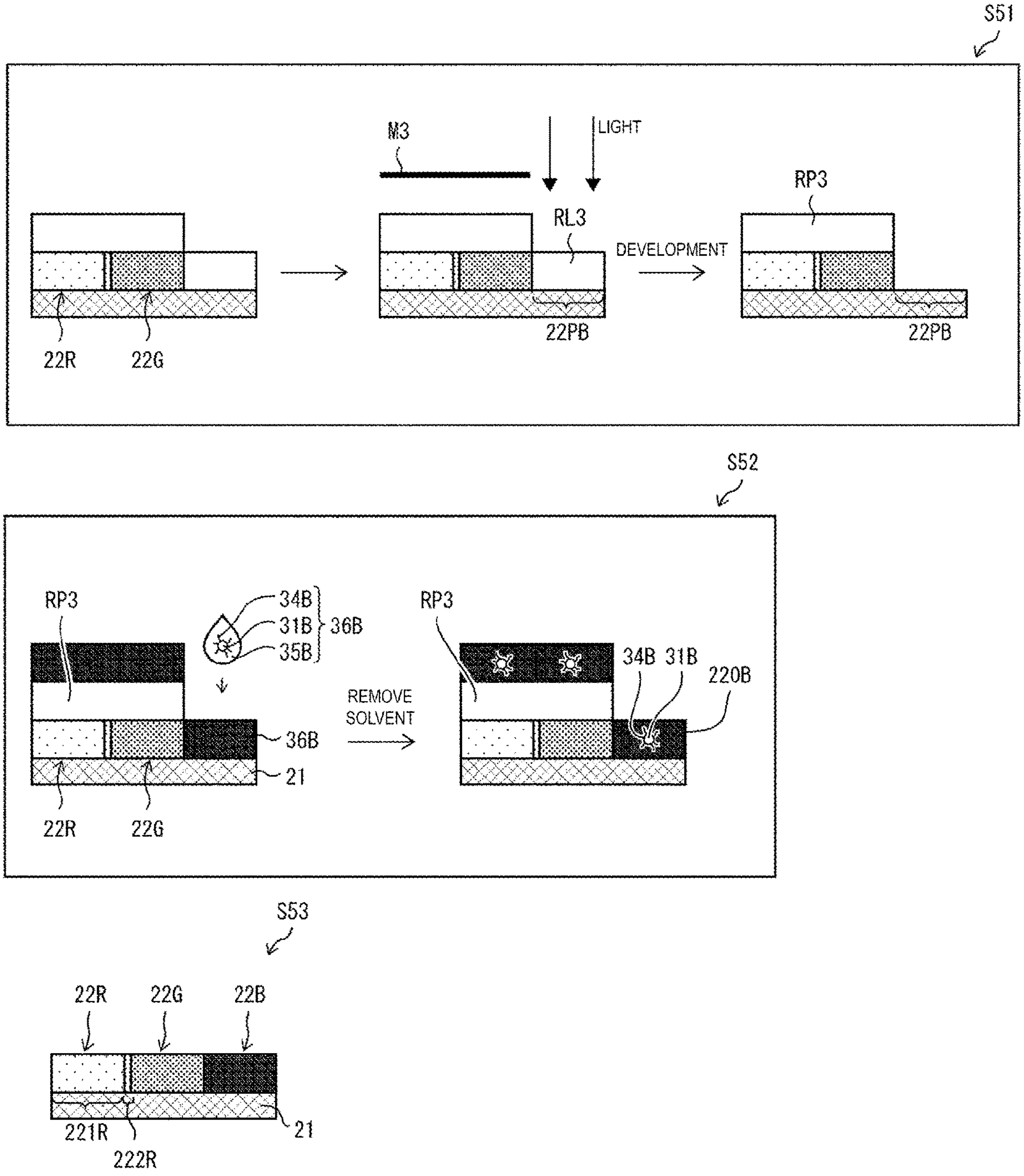
FIG. 7 is a cross-sectional view illustrating an example of processes of a part of the nanoparticle layer patterning process illustrated in FIG. 3 according to the first embodiment in order of the processes.

Each of FIGS. 5 to 7 is a cross-sectional view illustrating an example of processes of a part of step S24 (nanoparticle layer patterning process) illustrated in FIG. 3 according to the present embodiment in order of the processes. FIGS. 5 to 7 illustrate a portion P1 surrounded by a two-dot chain line in FIG. 4 as an example. In FIGS. 5 to 7, the QDs in the EML 22 are enlarged and the number of the QDs is omitted. In the following, a QD film containing the same QDs is denoted by the same reference numeral regardless of the change in the ligands coordinated to the QDs.

FIG. 5 illustrates a method for forming the EML 22R as the nanoparticle layer pattern by using the first method.

When the first method is used for forming the EML 22R, in step S24, first, as indicated by S31 in FIG. 5, a QD film 220R containing the QDs 31R and the ligands 34R (first ligands) is formed in a solid-like shape as the nanoparticle film on the HTL 21 to be an underlayer (support layer) of the EML 22 of each color (step S31, QD film forming process).

For this purpose, in step S31, first, QD dispersion 36R containing the QDs 31R, the ligands 34R and a solvent 35R is applied in a solid-like shape on the HTL 21. Next, the solvent 35R contained in a coating film made of the QD dispersion 36R applied on the HTL 21 is removed, and the coating film is dried. As a result, the QD film 220R in a solid-like shape containing the QDs 31R and the ligands 34R and common to all the subpixels SP is formed as the nanoparticle film on the HTL 21.

Note that the QD dispersion 36R does not contain the ligands 32R. As the ligand 34R, a ligand that is coordinated to the QD 31R to render the QD 31R dispersible in any one of the organic solvents of the polar organic solvent and the non-polar organic solvent is used. As described above, the ligand 34R may be the non-polar ligand and may be the polar ligand.

When the ligand 34R is the non-polar ligand, the non-polar organic solvent is used as the solvent 35R. When the ligand 34R is the polar ligand, the polar organic solvent is used as the solvent 35R. In the following, a case will be described as an example in which the non-polar organic solvent is used as the solvent 35R.

It should be noted that the concentration of the QDs 31R, the concentration of the ligands 34R, and the concentration of the ligands 34R with respect to the QDs 31R in the QD dispersion 36R may be set in a known manner, and are not particularly limited as long as a concentration or viscosity allowing the application is achieved. For example, the concentration of QDs in the QD dispersion in the case of using a spin coating method is generally set from about 5 mg/mL to about 20 mg/mL in order to obtain a practical QD film thickness. The concentration of the QDs 31R in the QD dispersion 36R can be similarly set. However, the above example is merely an example, and the optimum concentration varies depending on the film formation method.

The method of applying the QD dispersion 36R is not particularly limited, but for example, a spin coating method or the like is used. Heating and drying such as baking of the coating film formed by applying the QD dispersion 36R can be used for removing the solvent 35R. The drying temperature (for example, baking temperature) may be appropriately set according to the type of the solvent 35R so that the unnecessary solvent 35R contained in the QD dispersion 36R can be removed. Thus, the drying temperature is not particularly limited, but is preferably in a range from 60° C. to 120° C., for example. As a result, unnecessary solvent 35R contained in the coating film can be removed without causing thermal damage to the QD 31R. The drying time may be appropriately set according to the drying temperature so that the unnecessary solvent 35R contained in the coating film can be removed, and is not particularly limited.

Next, as indicated by S32 in FIG. 5, the ligands 34R in the QD film 220R are substituted with the ligands 32R over the entire QD film 220R (step S32, non-dispersive ligand supplying process, non-dispersive ligand substituting process).

For this purpose, in step S32, first, ligand dispersion 38R (non-dispersive ligand dispersion) containing an excessive amount of ligands 32R relative to the QDs 31R and a solvent 37R (second organic solvent) is supplied to the QD film 220R.

The solvent 37R is not particularly limited as long as the solvent 37R is such a solvent in which the ligands 32R as simple substances (that is, the ligands 32R not coordinated to the QDs 31R) are dispersible and the QDs 31R to which the ligands 34R are coordinated are non-dispersible. As the solvent 37R, a solvent having a polarity opposite to that of the solvent 35R is used so that the QDs 31R contained in the QD film 220R before the ligand exchange will not be dispersed by the supply of the ligand dispersion 38R and the QD film 220R will not be removed. Here, the solvent having the polarity opposite to that of the solvent 35R refers to the polar solvent when the solvent 35R is the non-polar solvent, and refers to the non-polar solvent when the solvent 35R is the polar solvent.

As a result, the ligand dispersion 38R is allowed to permeate the QD film 220R, and the ligand dispersion 38R is brought into contact with the entire QD film 220R.

When the ligand dispersion 38R is brought into contact with the QD film 220R, the ligands 34R coordinated to the QDs 31R in the QD film 220R are substituted with the ligands 32R (ligand exchange). Thus, the QD film 220R after supplying the ligand dispersion 38R contains the QDs 31R to which the ligands 34R are coordinated, the ligands 34R released from the QDs 31R by the ligand exchange, and excess ligands 32R which have not been coordinated to the QDs 31R. "Excess ligands 32R which have not been coordinated to the QDs 31R" refers to free ligands 32R which are not coordinated to the QDs 31R.

Next, for example, a sufficient amount of the solvent 37R is supplied as a rinse liquid to the QD film 220R to clean the QD film 220R. As described above, the QDs 31R to which the ligands 32R are coordinated are non-dispersible in any solvent. Thus, the free ligands 34R and the free ligands 32R contained in the QD film 220R are removed by the cleaning, but the QDs 31R to which the ligands 32R are coordinated are not removed.

Next, the unnecessary rinse liquid contained in the QD film 220R is removed by heating and drying or the like, if necessary. As a result, the QD film 220R containing the QDs 31R and the ligands 32R coordinated to the QDs 31R can be obtained.

The concentration of the ligands 32R with respect to the solvent 37R in the ligand dispersion 38R is preferably 0.01 mol/L or more, and more preferably 0.1 mol/L or more.

The higher the concentration of the ligands 32R, the easier the substitution of the ligands 34R with the ligands 32R, and thus the concentration of the ligands 32R is preferably as high as possible. Thus, the upper limit of the concentration of the ligands 32R is not particularly limited, but is preferably in the range of 10 mol/L or less, and more preferably in the range of 3.0 mol/L or less from the viewpoint of solubility or dispersibility of the ligands 32R in the solvent 37R, a production cost, and the like.

The supply amount of the ligands 32R is not particularly limited, but may be appropriately set depending on, for example, the type and amount of the QDs 31R so that an excess amount of the ligands 32R exceeding the amount of the ligands 32R coordinated to the QD 31R is supplied. Since the amount of the ligands 32R supplied per one QD 31R is sufficient amount regardless of the above conditions, the amount of the ligands 32R actually coordinated to the QDs 31R tends to depend on the concentration of the ligands 32R contained in the ligand dispersion 38R. The excess ligands 32R not coordinated to the QDs 31R are separated and removed by cleaning with the rinse liquid as described above.

In order to exchange the ligands 34R coordinated to the QDs 31R in the QD film 220R with the ligands 32R, the ligand dispersion 38R may be brought into contact with the QD film 220R as described above, and it is not particularly necessary to perform heating. In addition, according to the general layer thickness of the EML, the ligand dispersion 38R permeates the QD film 220R immediately after the ligand dispersion 38R is supplied to the QD film 220R. Thus, management and control of the time required for ligand exchange are not particularly required.

In the present embodiment, the layer thickness of the EML22 is preferably 1 nm or more and 1000 nm or less, and more preferably 1 nm or more and 50 nm or less. Thus, the film thickness of the QD film 220R is preferably 1 nm or more and 1000 nm or less, and more preferably 1 nm or more and 50 nm or less.

However, if necessary, heating may be performed in order to complete the ligand exchange, and a holding time period for the permeation of the ligand dispersion 38R may be provided. In addition, in order to uniformly supply the ligand dispersion 38R to the QD film 220R, after the ligand dispersion 38R is supplied to the QD film 220R, the supplied ligand dispersion 38R may be applied to the QD film 220R by spin coating or the like. Similarly, in order to uniformly supply the rinse liquid to the QD film 220R, after the rinse liquid is supplied to the QD film 220R, the supplied rinse liquid may be applied to the QD film 220R by spin coating or the like.

Here, in the cleaning, sufficient amount refers to an amount sufficient for a substrate size of the support substrate to be used. For example, when a glass substrate of 25 mm×25 mm×0.7 mm is used as the support substrate in step S1, the rinse liquid of 200 μL is used as the sufficient amount of the rinse liquid. The removal of the rinse liquid can be performed in the same manner as the removal of the solvent 35R in step S31.

Next, as indicated by S33 in FIG. 5, a resist pattern RP1 is formed on a part of the QD film 220R so as to cover the QD film 220R after the ligand exchange in a red EML formation scheduled region 22PR (step S33, resist patterning process). Here, "red EML formation scheduled region 22PR" refers to a formation scheduled region of the EML 22R at a design stage, and in the present embodiment liquid, refers to a region where the non-dispersive ligand-containing portion 221R is to be finally formed.

For this purpose, in step S33, first, a resist layer RL1 covering the QD film 220R is formed in a solid-like shape on the QD film 220R. The layer thickness of the resist layer RL1 is not particularly limited, but is preferably in a range of 10 nm or more and 10000 nm or less, and more preferably in a range of 100 nm or more and 3000 nm or less. In FIG. 7, a case is illustrated as an example in which a positive-working photoresist is used as a resist material constituting the resist layer RL1.

The positive-working photoresist increases in solubility in a developing solution by exposure to ultraviolet rays (UV) or the like. Next, the resist layer RL1 is exposed using a mask M1 that exposes the resist layer RL1 in a portion other than the red EML formation scheduled region 22PR.

The UV irradiation intensity at this time is not particularly limited, but is preferably in a range of 10 $mJ/cm^2$ or more and 2000 $mJ/cm^2$ or less, and more preferably in a range of 50 $mJ/cm^2$ or more and 200 $mJ/cm^2$ or less.

Next, the resist layer RL1 is developed with a developing solution. As a result, the exposed portion of the resist layer RL1 is removed. As a result, a resist pattern RP1 made of the resist layer RL1 is formed only in the red EML formation scheduled region 22PR.

As the developing solution, for example, an alkaline aqueous developing solution (alkaline aqueous solution) such as a tetramethylammonium hydroxide (TMAH) aqueous solution is used. The concentration of the developing solution is not particularly limited, but is preferably in a range of 0.01 wt % or more and 10 wt % or less, and more preferably in a range of 0.02 wt % or more and 3.0 wt % or less.

In FIG. 7, the case is illustrated as an example in which the positive-working photoresist is used as the resist material as described above. However, the present embodiment is not limited to this case, and a negative-working photoresist may be used instead of the positive-working photoresist. The negative-working photoresist decreases in solubility in the developing solution by exposure. Thus, in this case, the resist layer RL1 may be exposed using a mask that exposes only the resist layer RL1 in the red EML formation scheduled region 22PR.

Next, as indicated by S34 in FIG. 5, ligand dispersion 40R (dispersive ligand dispersion) containing the ligands 33R and a solvent 39R (first organic solvent) is supplied to and brought into contact with a portion of the QD film 220R not covered with the resist pattern RPL. When the ligand dispersion 40R is brought into contact with the QD film 220R, the ligands 32R coordinated to the QDs 31R in the QD film 220R are substituted with the ligands 33R (ligand exchange).

As described above, the ligands 33R are ligands (dispersive ligands) that are coordinated to the QDs 31R to render the QDs 31R to be dispersed in any one of the organic solvents of the polar organic solvent and the non-polar organic solvent. As described above, the ligands 33R may be the non-polar ligands or the polar ligands. When the ligands 33R are the non-polar ligands, the non-polar organic solvent is used as the solvent 39R. When the ligands 33R are the polar ligands, the polar organic solvent is used as the solvent 39R.

Thus, when the ligand dispersion 40R is brought into contact with the portion of the QD film 220R not covered with the resist pattern RP1, the ligand exchange is performed, and the QDs 31 to which the ligands 33R are coordinated are dispersed in the solvent 39R. As a result, in the portion of the QD film 220R not covered with the resist pattern RP1, a portion other than a boundary surface between the portion covered with the resist pattern RP1 and the portion not covered with the resist pattern RP1 is removed by the solvent 39R in association with the ligand exchange. Next, by removing and drying the solvent 39R, the non-dispersive ligand-containing portion 221R containing the QDs 31R to which the ligands 32R are coordinated and remaining without being removed by the solvent 39R are formed in the portion covered with the resist pattern RP1 (red EML formation scheduled region 22PR) (step S164, the dispersive ligand substituting process).

Note that the QDs 31R contained in the portion of the QD film 220R removed by the solvent 39R in step S34 and not covered with the resist pattern RP1 (in other words, the portion other than the non-dispersive ligand-containing portion 221R) is less deteriorated and can be reused. Thus, in the present embodiment, it is preferable that a recovering process of recovering the QDs 31R is performed together with step S34.

In addition, in step S34, in order to disperse the QDs 31R to which only the ligands 33R are coordinated in the solvent 39R and remove the QDs 31R, after supplying the ligand dispersion 40R, the solvent 39R may be supplied as a rinse liquid to further perform cleaning, and then the solvent 39R may be removed (dried).

When the first method is used, as illustrated in FIG. 4, at the boundary surface between the portion covered with the resist pattern RP1 and the portion not covered with the resist pattern RP1 in the QD film 220R, the QDs 31R having a low substitution rate of the ligands 32R coordinated to the QDs 31R remain without being dispersed in the solvent 39R. Thus, when the above-described method is used, in an outer edge portion of the non-dispersive ligand-containing portion 221R on the subpixel SPG side, the dispersive ligand-containing portion 222R containing the ligands 33R coordinated to the QDs 31R and thinner than the non-dispersive ligand-containing portion 221R is formed adjacent to the non-dispersive ligand-containing portion 221R.

Here, "low substitution rate of the ligands 32R coordinated to the QDs 31R" means that the ligands 32R coordinated to the QDs 31R are not substituted with the ligands 33R to such an extent of being dispersible in the solvent 39R. Hereinafter, similarly, low substitution rate of the dispersive ligands coordinated to the nanoparticles means that the non-dispersive ligands coordinated to the nanoparticles are not substituted with the dispersive ligands to such an extent of being dispersible in the solvent.

As a result, the EML 22R including the non-dispersive ligand-containing portion 221R and the dispersive ligand-containing portion 222R is formed on the HTL21 as a QD layer pattern (nanoparticle layer pattern) obtained by patterning the QD film 220R. Note that the fact that the EML 22R includes the above-described dispersive ligand-containing portion 222R is evidence that the patterning method according to the present embodiment has been used for forming the EML 22R.

The concentration of the ligands 33R with respect to the solvent 39R in the ligand dispersion 40R used in step S34 can be set in a same manner as the concentration of the ligands 32R for the same reason as the concentration of the ligands 32R in step S32. That is, the concentration of the ligands 33R with respect to the solvent 39R in the ligand dispersion 40R is preferably 0.01 mol/L or more, and more preferably 0.1 mol/L or more. In addition, the concentration of the ligands 33R with respect to the solvent 39R in the ligand dispersion 40R is preferably in a range of 10 mol/L or less, and more preferably in a range of 3.0 mol/L or less.

Similarly to the supply amount of the ligands 32R, the supply amount of the ligands 33R is not particularly limited, but may be appropriately set depending on, for example, the type and amount of the QDs 31R so that an excess amount of the ligands 33R exceeding the amount of the ligands 33R coordinated to the QD 31R is supplied.

In order to exchange the ligands 32R coordinated to the QDs 31R in the QD film 220R with the ligands 33R, similarly to step S32, the ligand dispersion 40R may be brought into contact with the QD film 220R, and it is not particularly necessary to perform heating. In addition, according to the general layer thickness of the EML, the ligand dispersion 40R permeates the QD film 220R immediately after the ligand dispersion 40R is supplied to the QD film 220R, and thus management and control of the time required for the ligand exchange are not particularly required.

After performing step S34, in the present embodiment, as indicated by S35 in FIG. 5, the resist pattern RP1 covering the non-dispersive ligand-containing portion 221R is peeled by, for example, a resist solvent to remove the resist pattern RP1 (step S35, resist pattern removing process). As a result, the patterning of the QD film 220R is completed.

As the resist solvent, for example, a known resist solvent such as propylene glycol monomethyl ether acetate (PGMEA) can be used.

Note that, as described above, the QDs 31R to which the ligands 32R are coordinated are non-dispersible in any solvent. Thus, any resist solvent can be used as the resist solvent. As the resist solvent, for example, a solvent used for application of the QDs 31R (for example, a solvent used for the QD dispersion 36R) may be used.

Then, the light-emitting element ESR including the EML 22R is manufactured by further layering the ETL 23 and the cathode electrode 54 on the EML 22R as described above.

FIG. 6 is a cross-sectional view illustrating an example of a method for forming the EML 22G. FIG. 7 is a cross-sectional view illustrating an example of a method for forming the EML 22B.

As described above, in the present embodiment, after the EML 22R is formed, the EML 22G and the EML 22B are formed in this order. In the present embodiment, a case will be described as an example in which a lift-off method is used for forming the EML 22G and the EML 22B.

After step S35, in the present embodiment, as indicated by S41 in FIG. 6, a resist pattern RP2 is formed on a part of the HTL 21 where the EML 22R is formed so that only a green EML formation scheduled region 22PG is exposed (step S41, resist patterning process). Here, "green EML formation scheduled region 22PG" refers to a formation scheduled region of the EML 22G at the design stage.

For this purpose, in step S41, first, a resist layer RL2 is formed in a solid-like shape on the HTL 21 where the EML 22R is formed so as to cover the EML 22R. In FIG. 6, a case is illustrated as an example in which a positive-working photoresist is used as a resist material constituting the resist layer RL2. Next, the resist layer RL2 is exposed using a mask M2 that exposes only the resist layer RL2 of the green EML formation scheduled region 22PG. Next, the resist layer RL2 is developed with a developing solution similar to the developing solution described above. As a result, the exposed portion of the resist layer RL2 is removed, and the resist pattern RP2 made of the resist layer RL2 is formed only in a portion other than the green EML formation scheduled region 22PG.

Conditions such as a layer thickness of the resist layer (in this case, the resist layer RL2), a UV irradiation intensity, a type of the developing solution, and a concentration of the developing solution in step S41 may be set in the same manner as in step S33, and are not particularly limited.

Also in FIG. 6, as described above, the case is illustrated as an example in which the positive-working photoresist is used as the resist material, but the negative-working photoresist may be used as the resist material. In this case, the resist layer RL2 may be exposed using a mask that covers only the resist layer RL2 in the green EML formation scheduled region 22PG.

Next, as indicated by S42 in FIG. 6, a QD film 220G containing the QDs 31G and the ligands 34G is formed in a solid-like shape as the nanoparticle film on the HTL 21 (step S42, QD film forming process).

For this purpose, in step S42, first, QD dispersion 36G containing the QDs 31G, the ligands 34G, and a solvent 35G is applied in a solid-like shape on the HTL 21 so as to cover the resist pattern RP2. Next, the solvent 35G contained in a coating film made of the QD dispersion 36G applied on the HTL 21 is removed, and the coating film is dried.

As a result, the QD film 220G in a solid-like shape containing the QDs 31G and the ligands 34G and common to all the subpixels SP is formed as the nanoparticle film on the HTL 21.

Ligands that are coordinated to the QDs 31G to render the QDs 31G dispersible in any one of the organic solvents of the polar organic solvent and the non-polar organic solvent are used as the ligands 34G. Similarly to the ligands 34R, the ligands 34G may be the non-polar ligands or the polar ligands. When the ligands 34G are the non-polar ligands, the non-polar organic solvent is used as the solvent 35G. When the ligands 34G are the polar ligands, the polar organic solvent is used as the solvent 35G. In the following, a case will be described as an example in which, similarly to the solvent 35R, the non-polar organic solvent is used as the solvent 35G. The layer thickness of the QD film 220G is set similarly to the layer thickness of the QD film 220R. It should be noted that the concentrations of the QDs 31G and the ligands 34G in the QD dispersion 36G may be set in a known manner similarly to the QD dispersion 36R, and are not particularly limited as long as a concentration or viscosity allowing the application is achieved. In addition, an applying method is also not particularly limited.

Next, as indicated by S43 in FIG. 6, the QD film 220G on the resist pattern RP2 is removed by lift-off using a resist solvent (step S43, lift-off process). As a result, the EML 22G obtained by patterning the QD film 220G is formed on the HTL 21.

As described above, for example, a known resist solvent such as PGMEA can be used as the above-described resist solvent. Although not shown in Table 2, PGMEA has a dielectric constant similar to that of ethanol.

Next, the EML 22B is formed in the same manner as the EML 22G. Specifically, as indicated by S51 in FIG. 7, a resist pattern RP3 is formed on a part of the HTL 21 where the EML 22R and the EML 22G are formed so that only a blue EML formation scheduled region 22PB is exposed (step S51, resist patterning process). Here, “blue EML formation scheduled region 22PB” refers to a formation scheduled region of the EML 22B at the design stage.

For this purpose, in step S51, first, a resist layer RL3 is formed in a solid-like shape on the HTL 21 where the EML 22R and the EML 22G are formed so as to cover the EML 22R and the EML 22G. In FIG. 7, a case is illustrated as an example in which a positive-working photoresist is used as a resist material constituting the resist layer RL3. Next, the resist layer RL3 is exposed using a mask M3 that exposes only the resist layer RL3 of the blue EML formation scheduled region 22PB. Next, the resist layer RL3 is developed with a developing solution similar to the developing solution described above. As a result, the exposed portion of the resist layer RL3 is removed, and the resist pattern RP3 made of the resist layer RL3 is formed only in a portion other than the blue EML formation scheduled region 22PB.

Conditions such as a layer thickness of the resist layer (in this case, the resist layer RL3), a UV irradiation intensity, a type of the developing solution, and a concentration of the developing solution in step S51 may be set in the same manner as in step S33 and step S41, and are not particularly limited.

Also in FIG. 7, as described above, the case is illustrated as an example in which the positive-working photoresist is used as the resist material, but the negative-working photoresist may be used as the resist material. In this case, the resist layer RL3 may be exposed using a mask that covers only the resist layer RL3 in the blue EML formation scheduled region 22PB.

Next, as indicated by S52 in FIG. 7, a QD film 220B containing the QDs 31B and the ligands 34B is formed in a solid-like shape as the nanoparticle film on the HTL 21 (step S52, QD film forming process).

For this purpose, in step S53, first, QD dispersion 36B containing the QDs 31B, the ligands 34B, and the solvent 35B is applied in a solid-like shape on the HTL 21 so as to cover the resist pattern RP3. Next, the solvent 35B contained in the coating film made of the QD dispersion 36B applied on the HTL 21 is removed, and the coating film is dried. As a result, the QD film 220B in a solid-like shape containing the QDs 31B and the ligands 34B and common to all the subpixels SP is formed as the nanoparticle film on the HTL 21.

Ligands that are coordinated to the QDs 31B to render the QDs 31B dispersible in any one of the organic solvents of the polar organic solvent and the non-polar organic solvent are used as the ligands 34B. Similar to the ligands 34R and the ligands 34G, the ligands 34B may be the non-polar ligands or the polar ligands. When the ligands 34B are the non-polar ligands, the non-polar organic solvent is used as the solvent 35B. When the ligands 34B are the polar ligands, the polar organic solvent is used as the solvent 35B. In the following, a case will be described as an example in which, similar to the solvent 35R and the solvent 35G, the non-polar organic solvent is used as the solvent 35B. Note that the ligands 34G and the ligands 34B may be the same or different. The layer thickness of the QD film 220B is set similarly to the layer thickness of the QD film 220R and the layer thickness of the QD film 220G. It should be noted that the concentrations of the QDs 31B and the ligands 34B in the QD dispersion 36B may be set in a known manner similarly to the QD dispersion 36R and the QD dispersion 36G, and are not particularly limited as long as a concentration or viscosity allowing the application is achieved. In addition, an applying method is also not particularly limited.

Next, as indicated by S53 in FIG. 7, the QD film 220B on the resist pattern RP3 is removed by lift-off using a resist solvent (step S53, lift-off process). As a result, the EML 22B obtained by patterning the QD film 220B is formed on the HTL 21.

The same resist solvent as that used in step S43 can be used as the resist solvent.

Through the above processes, the EML 22R, the EML 22G, and the EML 22B illustrated in FIG. 4 can be formed. According to the present embodiment, thereafter, step S25 and step S26 are performed to form the ETL 23 and the cathode electrode 54 illustrated in FIG. 2 on the EML 22R, the EML 22G, and the EML 22B, and then step S5 to step S11 are performed, and thus the display device 1 according to the present embodiment can be manufactured.

First Modified Example

As described above, in FIGS. 5 to 7, the case is illustrated as an example in which the EML 22R, the EML 22G, and the EML 22B illustrated in FIG. 4 are formed. However, the present embodiment is not limited to this example.

Figure 8:
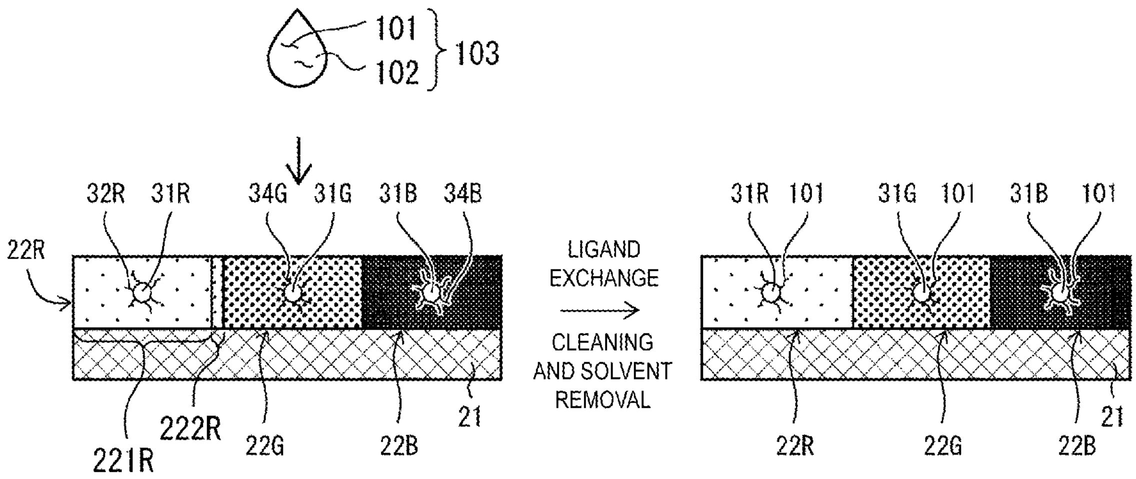
FIG. 8 is a cross-sectional view illustrating an example of processes of a part of the nanoparticle layer patterning process illustrated in FIG. 3 according to a first modified example of the first embodiment in order of the processes.

FIG. 8 is a cross-sectional view illustrating another example of processes of a part of step S24 (nanoparticle layer patterning process) according to the present modified example in order of the processes. FIG. 8 illustrates an example of processes subsequent to step S53 illustrated in FIG. 7.

As illustrated in FIG. 8, after step S53 illustrated in FIG. 7, after supplying ligand dispersion 103 (second ligand dispersion) containing desired ligands 101 (second ligands) and a solvent 102 (third organic solvent) to the EML 22R, the EML 22G, and the EML 22B, cleaning and solvent removal (drying) are performed, and thus the ligands each coordinated to the QDs 31R, the QDs 31G, and the QDs 31B may be collectively substituted with ligands 101.

In this case, the ligand 101 may be such a ligand that the ligand 101 as a simple substance is dispersible in the solvent 102 and non-dispersible in the solvent 102 by being coordinated to the QDs.

The solvent 102 may be an organic solvent in which the ligands 101 are dispersible as simple substances and the nanoparticles to which the ligands 101 are coordinated are non-dispersible.

Thus, as described above, when the non-polar organic solvent is used for the solvents 35R, 35G, and 35B, examples of the ligands 101 include any non-dispersive ligands and ligands that are dispersible in the polar solvent as simple substances and non-dispersible in the polar solvent by being coordinated to the QDs.

When the ligands 101 are dispersible in the polar solvent as simple substances and non-dispersible in the polar solvent by being coordinated to the QDs, examples of the combination of the ligands 101 and the solvent 102 include a combination in which the ligands 101 are dodecanethiol and the solvent 102 is methanol.

However, the present embodiment is not limited to the above configuration. For example, when the nanoparticles themselves are dispersible in the polar organic solvent, and the non-dispersive ligands are applied instead of the ligand exchange in the ligand supplying process, or the polar organic solvent is used for the solvents 35R, 35G, and 35B, for example, any non-dispersive ligands and ligands that are dispersible in the non-polar solvent as simple substances and non-dispersible in the non-polar solvent by being coordinated to the QDs can be used as the ligands 101.

When the ligands 101 are dispersible in the non-polar solvent as simple substances and non-dispersible in the non-polar solvent by being coordinated to the QDs, examples of the combination of the ligands 101 and the solvent 102 include a combination in which the ligands 101 are dodecanethiol and the solvent 102 is PGMEA.

For example, p-toluenethiol that serves as the non-dispersive ligand is dispersible as a simple substance in both polar solvent and non-polar solvent, but when coordinated to the QDs, the QDs become non-dispersible in all solvents.

On the other hand, dodecanethiol is dispersible as a simple substance in both polar solvent and non-polar solvent, but when coordinated to QDs, the QDs become non-dispersible in the polar solvent and dispersible only in the non-polar solvent. This is because a coordinating functional group of dodecanethiol has a polarity, and when the coordinating functional group is used for coordination to the QDs, the polarity is significantly reduced, and the dodecanethiol becomes dispersible only in the non-polar solvent.

As described above, for example, the patterning method of the QD film 220R and the method for manufacturing the light-emitting element ESR using the same may further include, for example, a process (second ligand substituting process) of supplying the ligand dispersion 103 to the non-dispersive ligand-containing portion 221R to substitute the ligands 32R with the ligands 101. After supplying the ligand dispersion 103 to the non-dispersive ligand-containing portion 221R, cleaning and solvent removal (drying) are performed, and thus, the ligands 32R coordinated to the QDs 31R can be substituted with the desired ligands 101.

In addition, the method for manufacturing the display device 1 using the patterning method of the QD film 220R may include, as the second ligand substituting process, a process of supplying the ligand dispersion 103 to the EML 22R, the EML 22G, and the EML 22B to collectively subject the ligands each coordinated to the QDs 31R, the QDs 31G, and the QDs 31B to the ligand exchange with the ligands 101. Also in this case, after supplying the ligand dispersion 103 to the EML 22R, the EML 22G, and the EML 22B, cleaning and solvent removal (drying) are performed, and thus the ligands each coordinated to the QDs 31R, the QDs 31G, and the QDs 31B can be collectively substituted with the desired ligands 101.

As described above, when the ligands 101 are the non-dispersive ligands and the ligands coordinated to the QDs 31R, the QDs 31G, and the QDs 31B are collectively substituted with ligands different from the ligands coordinated to the QDs 31R, the QDs 31G, and the QDs 31B, non-dispersive ligands different from the ligands 32R are used as the ligands 101. However, the present modified example is not limited to this, and the same ligands as the ligands 32R may be used as the ligands 101 for the purpose of substituting the ligands coordinated to the QDs 31G and the QDs 31B.

Thus, the method for manufacturing the display device 1 may include a process of supplying the ligand dispersion 103 to the plurality of nanoparticle layer patterns to exchange the ligands included in at least some of the nanoparticle layer patterns of the plurality of nanoparticle layer patterns with the ligands 101.

The type of the ligands coordinated to the nanoparticles such as QD 31R, QD 31G, or QD 31B can be detected by, for example, a tandem mass spectrometer (MS/MS) spectrum obtained by a time-of-flight secondary ion mass spectrometry (TOF-SIMS) apparatus equipped with the MS/MS spectrum. For example, by performing tandem mass spectrometry of each of nanoparticle containing films obtained by drying respective one of the above-described nanoparticle dispersions by using the TOF-SIMS apparatus, structural analysis of molecules in a nano-order thin film sample is possible, and determination of a molecular structure of the ligand contained in the nanoparticle containing film with high accuracy.

The fact that the non-polar ligand or the polar ligand coordinated to the nanoparticle has been substituted with the non-dispersive ligand can be confirmed by the fact that the nanoparticle to which the non-polar ligand or the polar ligand is not dispersed in any solvent. The fact that the non-dispersive ligand coordinated to the nanoparticle is substituted with the non-polar ligand or the polar ligand can be confirmed by the fact that the nanoparticle after the substitution is dispersed in the non-polar organic solvent or the polar organic solvent.

Depending on the ligand to coordinate, whether the coordination is successfully achieved can be confirmed by, for example, measurement using Fourier transform infrared spectroscopy (FT-IR) (hereinafter, referred to as "FT-IR measurement"). For example, when the ligand coordinated to the nanoparticles includes, for example, a carboxy group (—COOH group), an amino group (—$NH_2$ group), or a —PO group included in a phosphine group, oscillations observed in the FT-IR measurement slightly differ between the uncoordinated state and the coordinated state and the detection peak shifts. Thus, this enables the coordination of the ligand to the nanoparticles or the substitution of the ligand coordinated to the nanoparticles to be confirmed.

In addition, by the fact that after the ligand exchange, a peak of the ligand before the substitution (ligand of substitution source) disappears, and the replacement with only the ligand after the substitution (ligand to be substituted), the fact that the ligand to be substituted is coordinated to the nanoparticles can also be confirmed.

Furthermore, when at least one of the ligand of substitution source and the ligand to be substituted includes a functional group showing a specific peak in addition to the coordinating functional group coordinated to the nanoparticles, coordination can be confirmed by the detected amount thereof. Examples of such a functional group include an ether group, an ester group, and a C═C bond of oleic acid. In particular, the ligand exchange can be confirmed, when a specific peak existing before the ligand exchange disappears after the ligand exchange, or when a new specific peak is detected after the ligand exchange.

In FT-IR, measurement for each functional group is possible, and by comparing detected peaks, not only the presence of the coordination and the presence of the ligand exchange can be confirmed as described above, but also an approximate substitution rate can be determined. In the case where p-toluenethiol is used as the non-dispersive ligand as described above, when p-toluenethiol is coordinated, large absorption is observed at wave numbers 1500 $nm^{-1}$ and 800 $nm^{-1}$.

Generally, the ligand is used to facilitate dispersion of the nanoparticles in the solvent. When the non-dispersive ligand is coordinated to the nanoparticles, the dispersibility of the nanoparticles is significantly reduced, and the nanoparticles cannot be dispersed in the solvent, so that the non-dispersive ligand does not serve as a general ligand. Thus, such a ligand with low dispersibility is not used in normal applications.

The inventors of the disclosure have paid attention to this point, have an advantage of reducing the dispersibility with the idea of reversal, and make the nanoparticles such as QDs not dispersible in the solvent instead of hardening the nanoparticles with a resin to be separately patterned, so that patterning (separately patterning) can be performed.

As described above, in the related art, the nanoparticle film such as the QD film is patterned by the lift-off method, the edging method, or the like.

However, as described above, in the lift-off method, the waste liquid contains the resist material, the nanoparticles, and the resist solvent. It is difficult to extract the nanoparticles from the waste liquid in which the nanoparticles and the resist material are mixed, and the nanoparticles are deteriorated due to various factors. Thus, even when the nanoparticles can be extracted from the waste liquid, the extracted nanoparticles are deteriorated and cannot be reused.

In addition, as described above, when the edging method is used, the nanoparticles in the removed nanoparticle film are deteriorated by the edging. Thus, also in this case, the nanoparticles contained in the removed nanoparticle film cannot be reused.

On the other hand, in the first method according to the present embodiment, as described above, the nanoparticles of the entire nanoparticle film are once made non-dispersible in the solvent by the non-dispersive ligands. Thereafter, ligands at any position of the nanoparticle film are substituted with the dispersive ligands, and the nanoparticles subjected to the ligand exchange are dispersed in the solvent and removed, and thus patterning the nanoparticle film. Thus, the resist material and the nanoparticles can be separately removed. Thus, it is not necessary to separate the resist material and the nanoparticles from each other, the nanoparticles can be easily recovered, and deterioration of the nanoparticles due to the separation from the resist material does not occur.

In addition, in the present embodiment, all of the nanoparticles in the nanoparticle film under the resist pattern in the resist patterning process and the resist pattern removing process are non-dispersible in the solvent and have high solvent resistance. Thus, deterioration of the nanoparticles can be suppressed in any process.

Thus, according to the present embodiment, a nanoparticle film patterning method capable of recovering and reusing some of the removed nanoparticles with less deterioration and forming a nanoparticle layer pattern with less deterioration, and a method for manufacturing a light-emitting element, a method for manufacturing a display device, and a light-emitting element using the same can be provided.

Further, in the known method, when the solvent used in the nanoparticle dispersion used for forming the nanoparticle film is used for removing the resist pattern, the nanoparticles under the resist pattern are dispersed in the solvent and removed. Thus, the solvent used in the nanoparticle dispersion cannot be used as above-described solvent. However, when the first method is used, since all of the nanoparticles in the nanoparticle film under the resist pattern are non-dispersive in the solvent as described above, there is no restriction on the solvent used for removing the resist pattern. Thus, the solvent used in the nanoparticle dispersion can also be used as the above-described solvent, and the degree of freedom in selecting the solvent is improved.

Second Embodiment

In the following, description regarding differences from the previous embodiments will be described.

Figure 9:
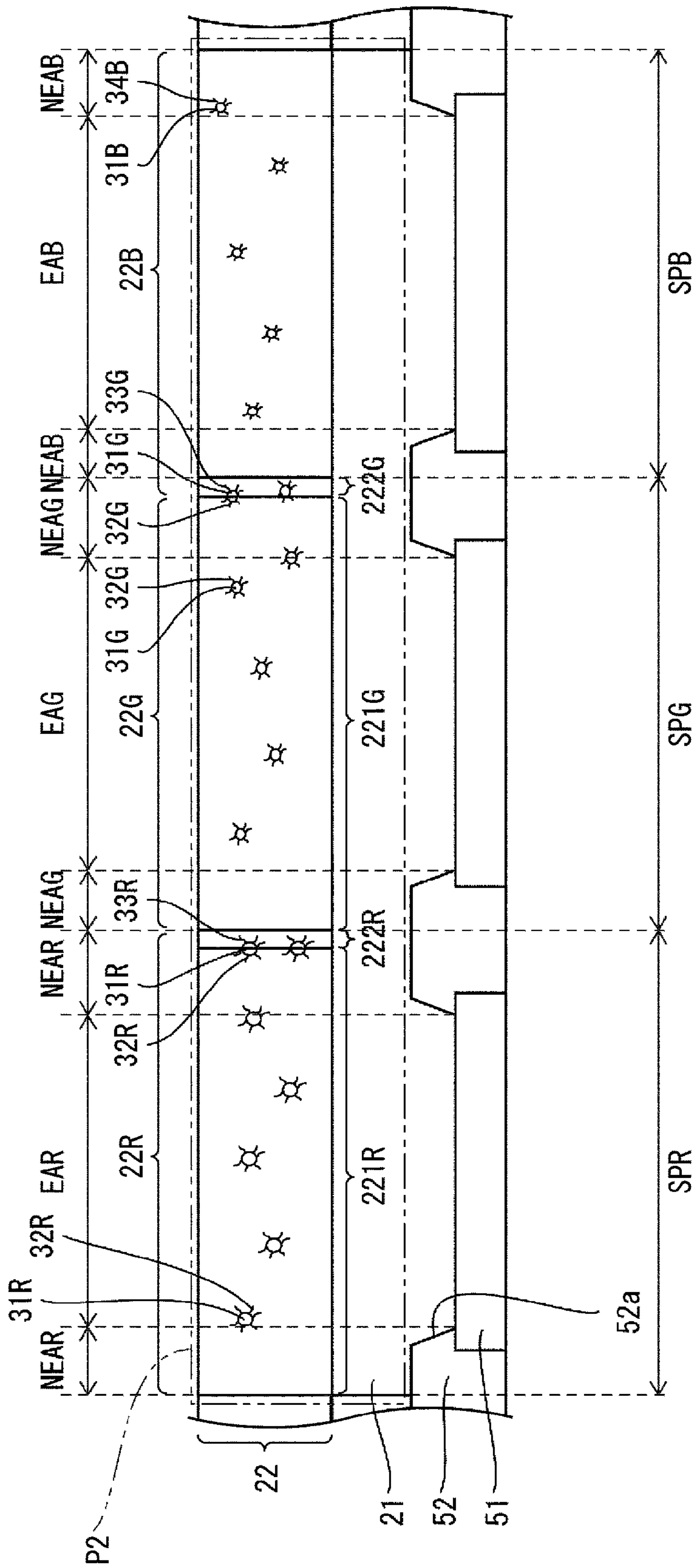
FIG. 9 is a cross-sectional view schematically illustrating an overall configuration of main portions of a display device according to a second embodiment.

FIG. 9 is a cross-sectional view schematically illustrating an overall configuration of the main portions of the display device 1 according to the present embodiment. Also in FIG. 9, the QDs in the EML 22 are enlarged and the number of QDs is omitted.

The EML 22G illustrated in FIG. 9 includes a non-dispersive ligand-containing portion 221G containing ligands 32G (non-dispersive ligands) as the ligands and a dispersive ligand-containing portion 222G containing ligands 33G (dispersive ligands) as the ligands.

To be more specific, the non-dispersive ligand-containing portion 221G contains the QDs 31G and the ligands 32G coordinated to the QDs 31G. The dispersive ligand-containing portion 222G contains at least the ligands 33G among the QDs 31G and the ligands 33G. The non-dispersive ligand-containing portion 221G and the dispersive ligand-containing portion 222G are one continuous layer. The dispersive ligand-containing portion 222G is formed adjacent to the non-dispersive ligand-containing portion 221G at a part of an outer edge portion of the non-dispersive ligand-containing portion 221G, and is formed thinner than the non-dispersive ligand-containing portion 221G.

The dispersive ligand-containing portion 222G is formed by supplying the ligands 33G to a part of a QD film containing the QDs 31G and the ligands 32G coordinated to the QDs 31G and to be the non-dispersive ligand-containing portion 221G by patterning to perform ligand exchange.

The ligands 33G may be coordinated to the QDs 31G to which the ligands 32G are coordinated in the vicinity of the dispersive ligand-containing portion 222G in the non-dispersive ligand-containing portion 221G. As long as the ligands 33G and the ligands 32G are coordinated to the QDs 31G, the QDs 31G to which the ligands 33G are coordinated themselves (that is, the QDs 31G themselves) may be located in the non-dispersive ligand-containing portion 221G or may be located in the dispersive ligand-containing portion 222G. Thus, in an extreme case, the dispersive ligand-containing portion 222G may be made of only the ligands 33G.

In addition, the dispersive ligand-containing portion 222G may contain the QDs 31G, and the ligands 33G may be coordinated to the QDs 31G within a range in which the QDs 31G are not dispersed in a solvent. The ligand exchange gradually proceeds from a portion far from the non-dispersive ligand-containing portion 221G. Thus, the ligands 33G may have a concentration distribution in the dispersive ligand-containing portion 222G. In this case, the farther the dispersive ligand-containing portion 222G is from the non-dispersive ligand-containing portion 221G, the more the amount of the ligands 33G coordinated to the QDs 31G increases while the more the amount of the ligands 32G coordinated to the QDs 31G decreases.

The dispersive ligand-containing portion 222G is formed in a part of the non-light-emitting region NEAG around the light-emitting region EAG, which corresponds to the edge cover 52 in a plan view.

The ligands 32G are monodentate ligands that are coordinated to the QDs 31G to significantly reduce dispersibility of the QDs 31G to any solvent. The QDs 31G to which the ligands 32G are coordinated become non-dispersible in a solvent. Thus, the ligands 32G are monodentate ligands that are coordinated to the QDs 31G to render the QDs 31G non-dispersible in the solvent.

The ligand 32G includes one coordinating functional group that can be coordinated to the QD 31G, and is preferably a monomer having the number of carbons of a main chain skeleton of the ligand 32G of 1 or more and 8 or less, and more preferably a monomer having the number of carbons of 1 or more and 5 or less.

Also in the ligand 32G, similarly to the ligand 32R, when the ligand 32G does not contain the ring, a carbon chain having the largest number of carbons contained in a carbon chain connecting the shortest distance from a carbon to which the coordinating functional group is bonded to a carbon of the terminal group is defined as the main chain skeleton. On the other hand, when the ligand 32G contains the ring, the main chain skeleton is defined by a carbon chain containing more carbons among (i) a carbon chain connecting the shortest distance along the ring from a carbon to which the coordinating functional group is bonded to a carbon in the ring located on the opposite side of a carbon to which the coordinating functional group or the substituent containing the coordinating functional group is bonded and (ii) a carbon chain having the largest number of carbons contained in a carbon chain connecting the shortest distance along the ring from a carbon to which the coordinating functional group is bonded to a carbon at a terminal of a substituent other than the coordinating functional group or the substituent containing the coordinating functional group bonded to the ring when the substituent other than the coordinating functional group or the substituent containing the coordinating functional group is bonded to the ring.

The coordinating functional group may be a functional group that can be coordinated to the QD 31G. Examples of the coordinating functional group include the coordinating functional groups exemplified above. As the ligand 32G, for example, a ligand similar to the ligand exemplified as the ligand 32R in the first embodiment can be used.

The ligand 33G is a ligand that is coordinated to the QD 31G to disperse the QD 31G in one of organic solvents of the polar organic solvent and the non-polar organic solvent. That is, the ligand 33G may be the non-polar ligand and may be the polar ligand. The ligand 33G is not particularly limited as long as the ligand 33G is a ligand capable of dispersing the QD 31G to which the ligand 33G is coordinated in any one of the organic solvents described above.

Examples of such a ligand 33G include a monodentate monomer including one coordinating functional group that coordinates to the QD 31G and having the number of carbons of the main chain skeleton of 9 or more and 30 or less. As the ligand 33G, for example, a ligand similar to the ligand exemplified as the ligand 33R can be used.

As illustrated in FIG. 9, the display device 1 according to the present embodiment has the same configuration as the display device 1 according to the first embodiment except for this point.

Next, a forming process of the EML 22 according to the present embodiment will be described with reference to FIG. 5, FIG. 10, and FIG. 11.

Figure 10:
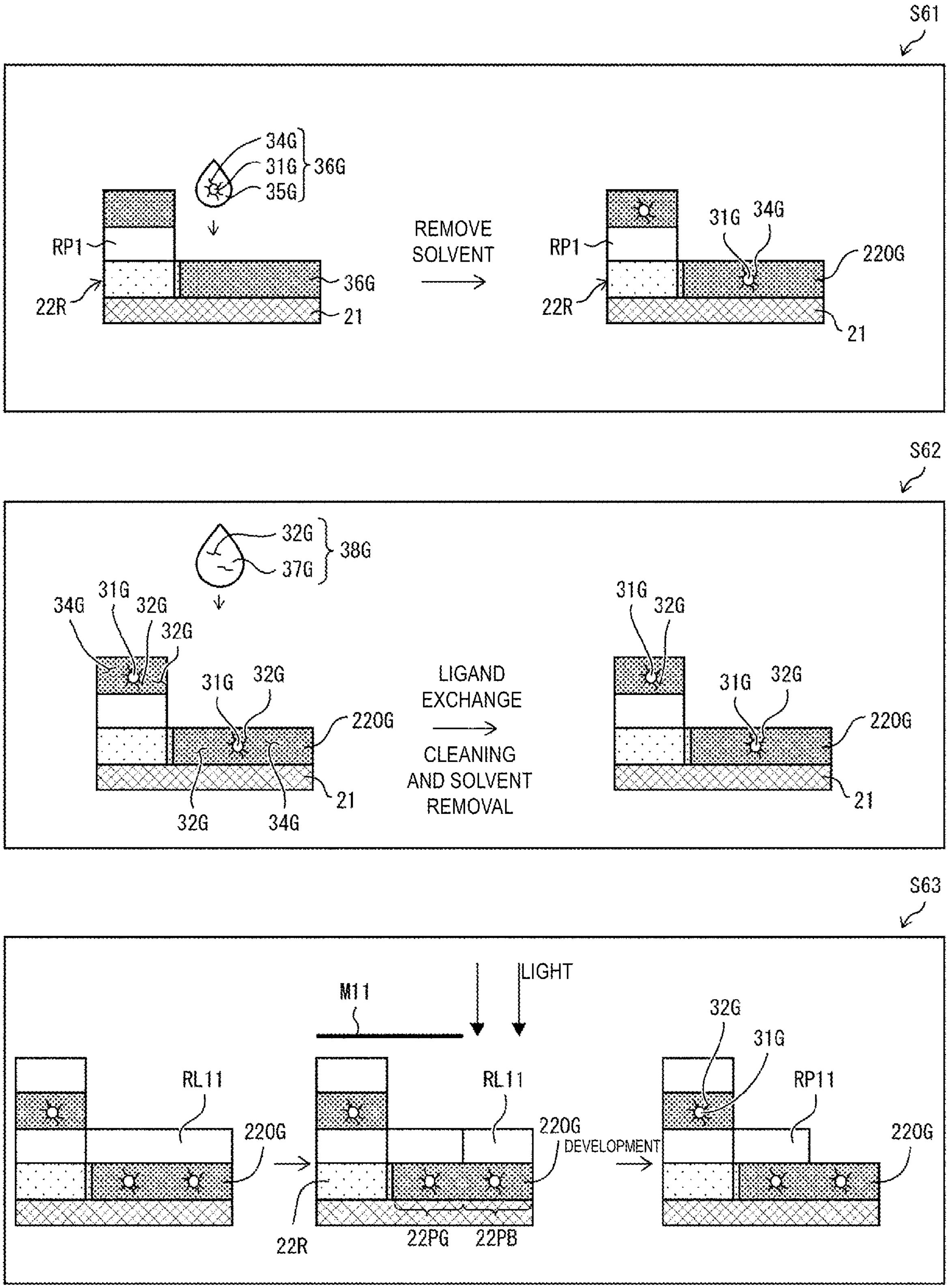
FIG. 10 is a cross-sectional view illustrating an example of processes of a part of the nanoparticle layer patterning process illustrated in FIG. 3 according to the second embodiment in order of the processes.
Figure 11:
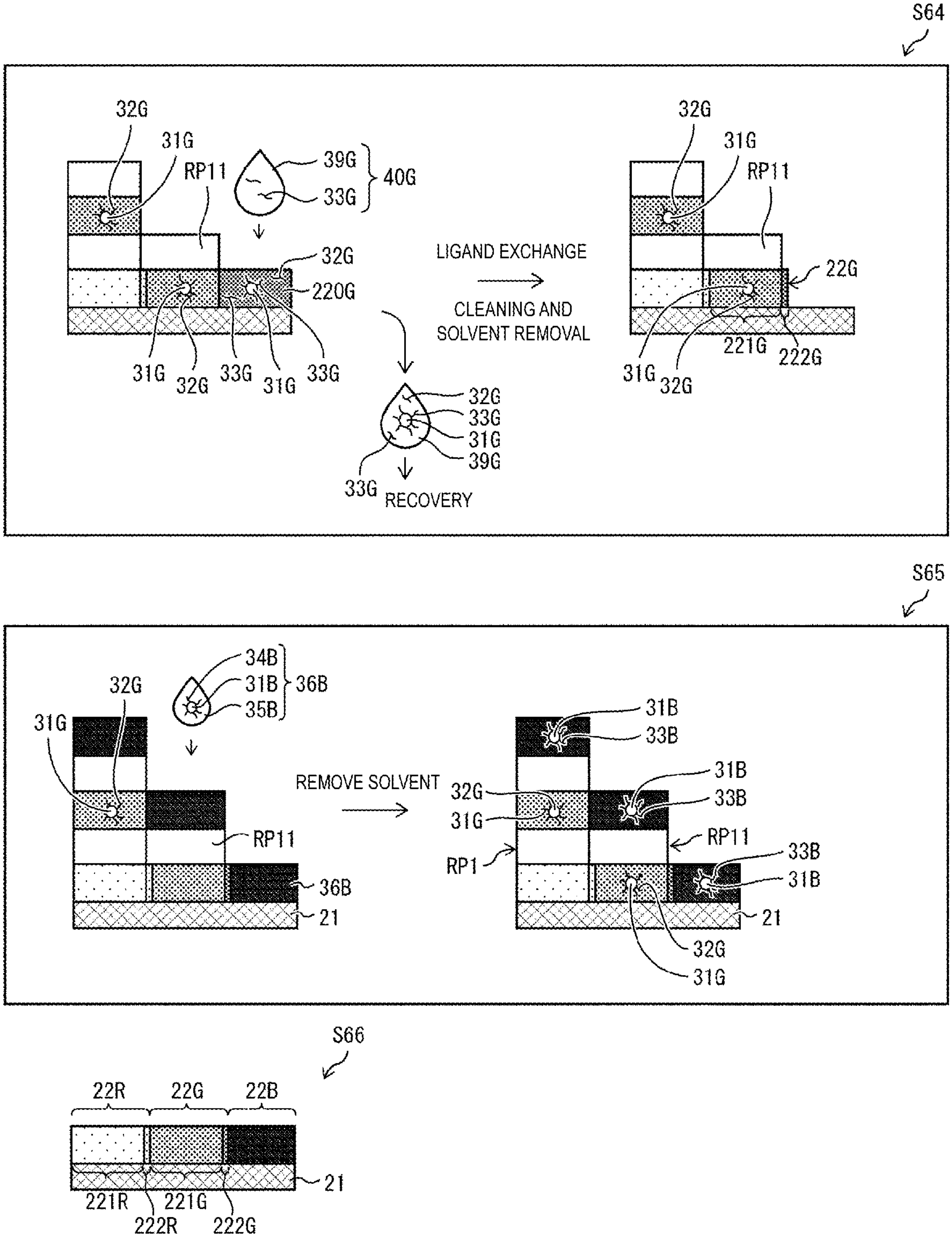
FIG. 11 is a cross-sectional view illustrating an example of processes of a part of the nanoparticle layer patterning process illustrated in FIG. 3 according to the second embodiment in order of the processes.

Each of FIG. 10, and FIG. 11 is cross-sectional views illustrating an example of processes of a part of step S24 illustrated in FIG. 3 according to the present embodiment in order of the processes. FIG. 10 is cross-sectional views each illustrating a process subsequent to step S34 illustrated in FIG. 5 in step S24, and FIG. 11 is cross-sectional views each illustrating a process subsequent to step S63 illustrated in FIG. 10 in step S24. FIG. 10 and FIG. 11 illustrate a portion P2 surrounded by a two-dot chain line in FIG. 9 as an example. Also in FIG. 10, and FIG. 11, the QDs in the EML 22 are enlarged and the number of QDs is omitted. The EML 22R illustrated in FIG. 9 is the same as the EML 22R illustrated in FIG. 4.

Also in the present embodiment, a QD film containing the same QDs is denoted by the same reference numeral regardless of the change in the ligands coordinated to the QDs. Also in the present embodiment, a case will be described as an example in which the EML 22R, the EML 22G, and the EML 22B are formed in this order in step S24.

The method for manufacturing the display device 1 according to the present embodiment is the same as the method for manufacturing the display device 1 according to the first embodiment except for the points described below. In the present embodiment and each of the following embodiments, various conditions such as the concentration of the QDs and the ligands in each QD dispersion, the applying method of the QD dispersion, the drying temperature and the drying time of the coating film, the concentration of the ligands with respect to the solvent in the ligand dispersion, the supply amount of the ligands, the ligand exchange temperature, the layer thickness of each resist layer, the UV irradiation intensity, the type and concentration of the developing solution, the resist solvent and the like may be set similarly to the first embodiment regardless of the type of QDs, type of the ligands, the type of the solvent and the like, and are not particularly limited. Thus, in the present embodiment and each embodiment to be described later, only the flow of processing will be described, and the description of these conditions will be omitted. Also in the present embodiment, a case will be illustrated as an example in which the positive-working photoresist is used as the resist material constituting each resist layer, but it goes without saying that the negative-working photoresist may be used as the resist material.

In the first embodiment, after the EML 22R is formed by the first method, the EML 22G and the EML 22B are formed by the lift-off method. On the other hand, in the present embodiment, the EML 22R and the EML 22G are formed by the first method. Thereafter, the EML 22B is formed by the lift-off method.

Thus, in the present embodiment, first, steps S31 to S34 illustrated in FIG. 5 are performed. Next, as indicated by S61 in FIG. 10, a QD film 220G containing the QDs 31G and ligands 34G (first ligand) is formed in a solid-like shape as the nanoparticle film on the HTL 21 where the EML 22R including the layered resist pattern PR1 is formed (step S61, QD film forming process).

For this purpose, in step S61, first, QD dispersion 36G containing the QDs 31G, the ligands 34G, and a solvent 35G is applied in a solid-like shape on the HTL 21 so as to cover the resist pattern RP1 on the EML 22R. Next, the solvent 35G contained in the coating film made of the QD dispersion 36G applied on the HTL 21 is removed, and the coating film is dried. As a result, the QD film 220G in a solid-like shape containing the QDs 31G and the ligands 34G and common to all the subpixels SP is formed as the nanoparticle film on the HTL 21.

Next, as indicated by S62 in FIG. 10, the ligands 34G in the QD film 220G are substituted with the ligands 32G over the entire QD film 220G (step S62, non-dispersive ligand supplying process, non-dispersive ligand substituting process).

For this purpose, in step S62, first, ligand dispersion 38G (non-dispersive ligand dispersion) containing an excessive amount of ligands 32G relative to the QDs 31R and a solvent 37G (second organic solvent) is supplied to the QD film 220G.

The solvent 37G is not particularly limited as long as the solvent 37G is such a solvent in which the ligands 32G as simple substances (that is, the ligands 32G not coordinated to the QDs 31G) are dispersible and the QDs 31G to which the ligands 34G are coordinated are non-dispersible. As the solvent 37G, a solvent having a polarity opposite to that of the solvent 35G is used so that the QDs 31G contained in the QD film 220G before the ligand exchange will not be dispersed by the supply of the ligand dispersion 38G and the QD film 220G will not be removed.

As a result, the ligand dispersion 38G is allowed to permeate the QD film 220G, and the ligand dispersion 38G is brought into contact with the entire QD film 220G. As a result, the ligands 34G coordinated to the QDs 31G are subjected to the ligand exchange with the ligands 32G.

Note that the QD film 220G after supplying the ligand dispersion 38R contains the QDs 31G to which the ligands 34G are coordinated, the ligands 34G released from the QDs 31G by the ligand exchange, and excess ligands 32G which have not been coordinated to the QDs 31G. "Excess ligands 32G which have not been coordinated to the QDs 31G" is refers to the free ligands 32G which are not coordinated to the QDs 31G.

Next, for example, a sufficient amount of the solvent 37G is supplied as a rinse liquid to the QD film 220G to clean the QD film 220G. As described above, the QDs 31G to which the ligands 32G are coordinated are non-dispersible in any solvent. Thus, the free ligands 34G and the free ligands 32G contained in the QD film 220G are removed by the cleaning, but the QDs 31G to which the ligands 32G are coordinated are not removed.

Next, the unnecessary rinse liquid contained in the QD film 220G is removed by heating and drying or the like, if necessary. As a result, the QD film 220G containing the QDs 31G and the ligands 32G coordinated to the QDs 31G can be obtained.

Next, as indicated by S63 in FIG. 10, a resist pattern RP11 is formed on a part of the QD film 220G so as to cover the QD film 220G after the ligand exchange in a green EML formation scheduled region 22PG (step S63, resist patterning process).

In FIG. 10, a case is illustrated as an example in which the resist pattern RP11 is formed on the QD film 220G in a region other than the blue EML formation scheduled region 22PB.

For this purpose, in step S63, first, a resist layer RL11 covering the QD film 220G is formed in a solid-like shape on the QD film 220G. Next, the resist layer RL11 is exposed using a mask M11 that exposes the resist layer RL11 of the blue EML formation scheduled region 22PB. Next, the resist layer RL11 is developed with a developing solution. As a result, the resist pattern RP11 made of the resist layer RL11 is formed on the QD film 220G other than the blue EML formation scheduled region 22PB.

Next, as indicated by S64 in FIG. 11, ligand dispersion 40G (dispersive ligand dispersion) containing the ligands 33G and a solvent 39G (first organic solvent) is supplied to and brought into contact with a portion of the QD film 220G not covered with the resist pattern RP11. As a result, the ligands 32G coordinated to the QDs 31G in the portion of the QD film 220G not covered with the resist pattern RP11 are subjected to the ligand exchange with the ligands 33G. As a result, the QDs 31G to which only the ligands 33G are coordinated are dispersed in the solvent 39G and removed. As a result, the portion of the QD film 220G not covered with the resist pattern PR11 is removed.

Thereafter, by removing and drying the solvent 39G, the non-dispersive ligand-containing portion 221G is formed (step S64, dispersive ligand supplying process, dispersive ligand substituting process).

Note that as described above, the ligands 33G are ligands (dispersive ligands) that are coordinated to the QDs 31G to render the QDs 31G to be dispersed in any one of the organic solvents of the polar organic solvent and the non-polar organic solvent. When the ligands 33G are the non-polar ligands, the non-polar organic solvent is used as the solvent 39G. When the ligands 33G are the polar ligands, the polar organic solvent is used as the solvent 39G.

Note that the QDs 31G contained in the portion of the QD film 220G removed by the solvent 39G in step S64 and not covered with the resist pattern RP11 (in other words, the portion other than the non-dispersive ligand-containing portion 221G) is less deteriorated and can be reused. Thus, in the present embodiment, it is preferable that a recovering process of recovering the QDs 31G is performed together with step S64.

In addition, also in the present embodiment, in order to disperse the QDs 31G to which only the ligands 33G are coordinated in the solvent 39G and remove the QDs 31G, after supplying the ligand dispersion 40G, the solvent 39G may be supplied as a rinse liquid to further perform cleaning, and then the solvent 39G may be removed (dried).

Also in the present embodiment, as illustrated in FIG. 11, at the boundary surface between the portion covered with the resist pattern RP11 and the portion not covered with the resist pattern RP1 in the QD film 220G formed on the same plane, the QDs 31G having a low substitution rate of the ligands 32G coordinated to the QDs 31G remain without being dispersed in the solvent 39G. Thus, when the above-described method is used, in an outer edge portion of the non-dispersive ligand-containing portion 221G on the subpixel SPB side, the dispersive ligand-containing portion 222G containing the ligands 33G coordinated to the QDs 31G and thinner than the non-dispersive ligand-containing portion 221G is formed.

As a result, the EML 22G including the non-dispersive ligand-containing portion 221G and the dispersive ligand-containing portion 222G is formed as a QD layer pattern (nanoparticle layer pattern) obtained by patterning the QD film 220G. Similarly to the dispersive ligand-containing portion 222R of the EML 22R, the dispersive ligand-containing portion 222G of the EML 22G is evidence that the first method has been used to form the EML 22G.

Next, in the present embodiment, as indicated by S65 in FIG. 11, the QD film 220B containing the QDs 31B and the ligands 34B is formed in a solid-like shape as the nanoparticle film on the HTL 21 where the resist pattern RP11 is formed (step S65, QD film forming process).

For this purpose, in step S65, first, QD dispersion 36B containing the QDs 31B, the ligands 34B, and the solvent 35B is applied in a solid-like shape on the HTL 21 so as to cover the resist pattern RP11. Next, the solvent 35B contained in the coating film made of the QD dispersion 36B applied on the HTL 21 is removed, and the coating film is dried. As a result, the QD film 220B in a solid-like shape containing the QDs 31B and the ligands 34B and common to all the subpixels SP is formed as the nanoparticle film on the HTL 21.

Next, as indicated by S66 in FIG. 11, the QD film 220B on the resist pattern RP11 is removed by lift-off using a resist solvent (step S66, lift-off process). As a result, the EML 22B obtained by patterning the QD film 220B is formed on the HTL 21.

Through the above processes, the EML 22R, the EML 22G, and the EML 22B illustrated in FIG. 9 can be formed.

According to the present embodiment, in step S34, the QDs 31R can be recovered in a state in which deterioration of the QDs 31R is suppressed, and in step S64, the QDs 31G can be recovered in a state in which deterioration of the QDs 31G is suppressed. Thus, according to the present embodiment, not only the QDs 31R but also the QDs 31G can be recovered and reused with less deterioration, and the EML 22R and the EML 22G with less deterioration can be formed.

In addition, according to the present embodiment, the nanoparticle layer patterned previously is insolubilized in a solvent before the formation of the nanoparticle layer patterned later thus having high solvent resistance. Thus, the nanoparticle layer patterned previously is not damaged by repeating the formation of the nanoparticle layer pattern.

First Modified Example

Figure 12:
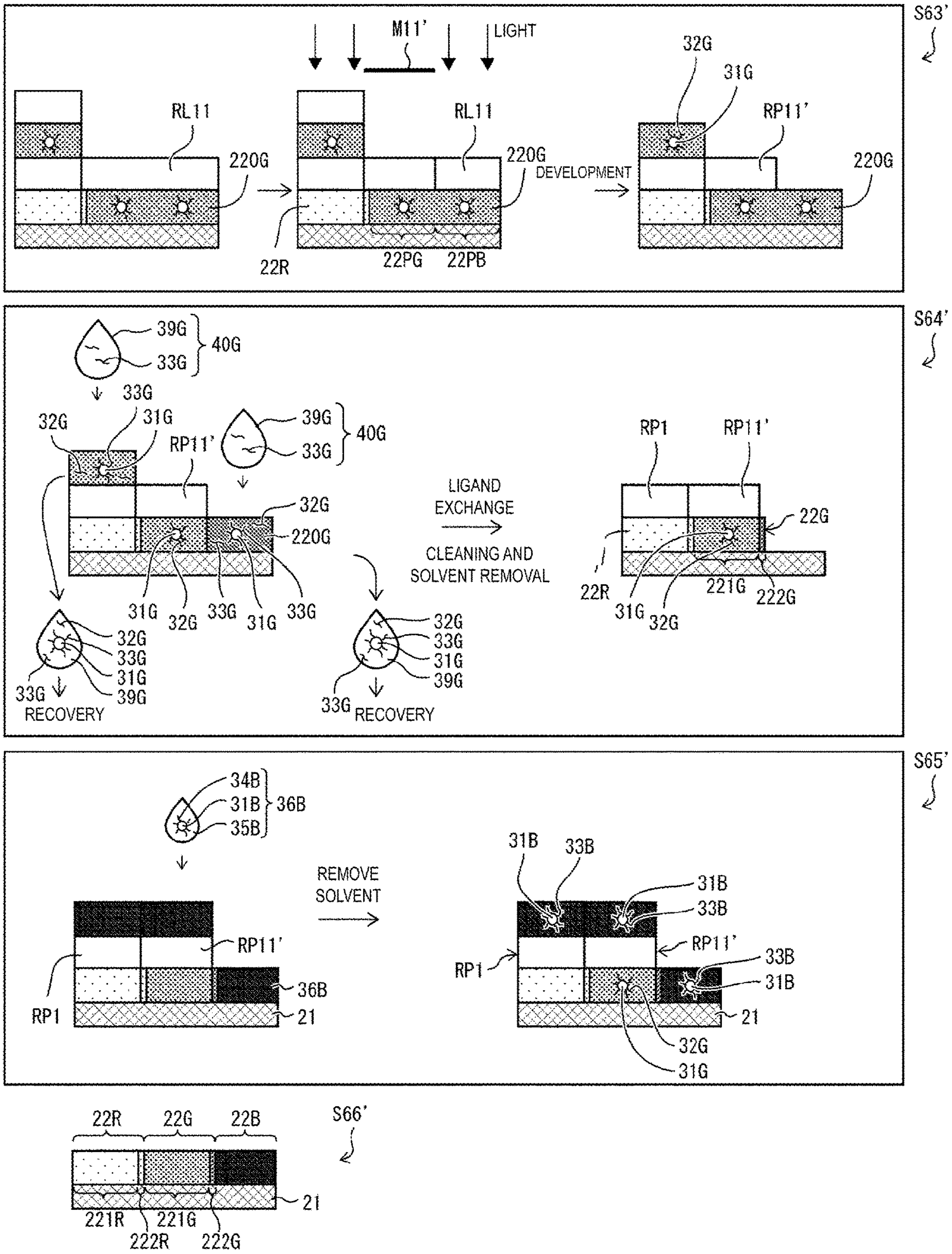
FIG. 12 is a cross-sectional view illustrating an example of processes of a part of the nanoparticle layer patterning process illustrated in FIG. 3 according to a first modified example of the second embodiment in order of the processes.

FIG. 12 is cross-sectional views each illustrating an example of processes of a part of step S24 illustrated in FIG. 3 according to the present modified example in order of the processes. FIG. 12 illustrates processes subsequent to step S62 illustrated in FIG. 10 in step S24. FIG. 12 also illustrates a portion P2 surrounded by a two-dot chain line in FIG. 9 as an example. Also in FIG. 12, the QDs in the EML 22 are enlarged and the number of QDs is omitted.

In the present modified example, after step S62, step S63' to step S66' indicated by S63' to S66' in FIG. 12 are performed instead of step S63 to step S66, respectively.

In step S63' (resist patterning process), a resist pattern RP11' is formed only in the green EML formation scheduled region 22PG. Here, "green EML formation scheduled region 22PG" refers to a formation scheduled region of the EML 22G at a design stage as described above, and in the present embodiment liquid, refers to a region where the non-dispersive ligand-containing portion 221G is to be finally formed.

For this purpose, in the step S63', first, the resist layer RL11 covering the QD film 220G is formed in a solid-like shape on the QD film 220G formed in step S62. The processes up to this point are the same as step S63. Next, the resist layer RL11 is exposed using a mask M11' that exposes the resist layer RL11 in a portion other than the green EML formation scheduled region 22PG. Next, the resist layer RL11 is developed with a developing solution. As a result, the resist pattern RP11' made of the resist layer RL11 is formed only on the QD film 220G of the green EML formation scheduled region 22PG.

Next, in step S64' (dispersive ligand supplying process, dispersive ligand substituting process), the ligand dispersion 40G is supplied to and brought into contact with the QD film 220G other than the green EML formation scheduled region 22PG not covered with the resist pattern RP11'. As a result, the ligands 32G coordinated to the QDs 31G other than the green EML formation scheduled region 22PG are subjected to the ligand exchange with the ligands 33G. Then, the QDs 31G to which the ligands 33G are coordinated other than the green EML formation scheduled region 22PG are dispersed in the solvent 39G and removed, and thus the QD film 220G other than the green EML formation scheduled region 22PG is removed. As a result, the EML 22G including the non-dispersive ligand-containing portion 221G and the dispersive ligand-containing portion 222G formed adjacent to the non-dispersive ligand-containing portion 221G at an outer edge portion of the non-dispersive ligand-containing portion 221G on the subpixel SPB side is formed.

In step S65' (QD film forming process), the QD dispersion 36B is applied in a solid-like shape on the HTL 21 where the EML 22G is formed, and then the solvent 35B contained in the coating film is removed to form the QD film 220B in a solid-like shape common to all the subpixels SP.

The resist pattern RP11' is formed on the EML 22G. The resist pattern RP1 is formed on the EML 22R.

Thus, in step S66' (lift-off process), the QD film 220B on the resist pattern RP11' and the QD film 220G on the resist pattern RP1 are lifted off by the lift-off using the resist solvent. As a result, the EML 22B obtained by patterning the QD film 220B is formed on the HTL 21.

When the resist solvent is, for example, the polar organic solvent such as PGMEA, the QD film 220B in the blue EML formation scheduled region 22PB does not contain the non-dispersive ligand but is not removed by the above-described resist solvent.

Through the above processes, the EML 22R, the EML 22G, and the EML 22B illustrated in FIG. 9 can be formed.

In the present modified example, the QDs 31G in the QD film 220G other than the green EML formation scheduled region 22PG (specifically, the QD film 220G of the subpixels SPR and the subpixels SPB), which are removed by the solvent 39G, are recovered, so that the QDs 31G in which the deterioration is suppressed can be recovered in step S64' more than in step S64.

Second Modified Example

Also in the present embodiment, after step S66 illustrated in FIG. 11 or step S66' illustrated in FIG. 12, similarly to the first modified example according to the first embodiment, the ligand dispersion 103 containing the desired ligands 101 and the solvent 102 may be supplied to the EML 22R, the EML 22G, and the EML 22B to perform the cleaning and drying, and thus at least some of the ligands of the ligands each coordinated to the QDs 31R, the QDs 31G, and the QDs 31B may be substituted with ligands 101. Although the description is omitted, the same modification may be applied to the following embodiment.

Third Embodiment

In the following, description regarding differences from the previous embodiments will be described.

Figure 13:
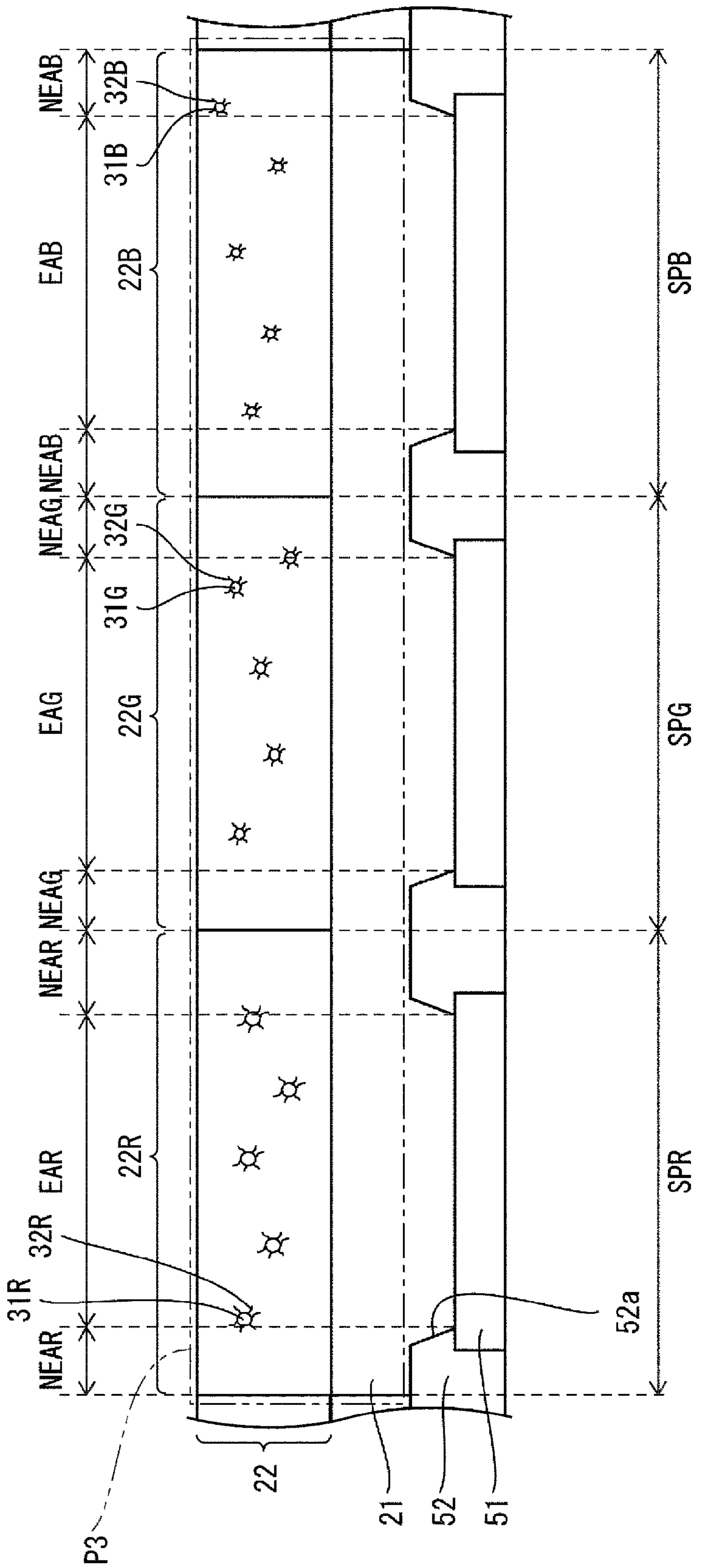
FIG. 13 is a cross-sectional view schematically illustrating an overall configuration of main portions of a display device according to a third embodiment.

FIG. 13 is a cross-sectional view schematically illustrating an overall configuration of the main portions of the display device 1 according to the present embodiment. Also in FIG. 13, the QDs in the EML 22 are enlarged and the number of QDs is omitted.

As illustrated in FIG. 13, in the display device 1 according to the present embodiment, the EML 22R does not include the dispersive ligand-containing portion 222R, and the EML 22G does not include the dispersive ligand-containing portion 222G. That is, the EML 22R is made of only the non-dispersive ligand-containing portion 221R illustrated in FIG. 4. In addition, the EML 22G is made of only the non-dispersive ligand-containing portion 221G illustrated in FIG. 4. Thus, the EML 22R in its entirety contains the QDs 31R and the ligands 32R. The EML 22G in its entirety contains the QDs 31G and ligands 32G. The EML 22B in its entirety contains the QDs 31B and the ligands 32B.

The ligands 32B are monodentate ligands that are coordinated to the QDs 31B to significantly reduce dispersibility of the QDs 31B to any solvent. The QDs 31B to which the ligands 32B are coordinated become non-dispersible in a solvent. Thus, the ligands 32B are monodentate ligands that are coordinated to the QDs 31B to render the QDs 31B non-dispersible in the solvent.

The ligand 32B includes one coordinating functional group that can be coordinated to the QD 31B, and is preferably a monomer having the number of carbons of a main chain skeleton of the ligand 32B of 1 or more and 8 or less, and more preferably a monomer having the number of carbons of 1 or more and 5 or less.

Also in the ligand 32B, similarly to the ligand 32R, when the ligand 32B does not contain the ring, a carbon chain having the largest number of carbons contained in a carbon chain connecting the shortest distance from a carbon to which the coordinating functional group is bonded to a carbon of the terminal group is defined as the main chain skeleton. On the other hand, when the ligand 32B contains the ring, the main chain skeleton is defined by a carbon chain containing more carbons among (i) a carbon chain connecting the shortest distance along the ring from a carbon to which the coordinating functional group is bonded to a carbon in the ring located on the opposite side of a carbon to which the coordinating functional group or the substituent containing the coordinating functional group is bonded and (ii) a carbon chain having the largest number of carbons contained in a carbon chain connecting the shortest distance along the ring from a carbon to which the coordinating functional group is bonded to a carbon at a terminal of a substituent other than the coordinating functional group or the substituent containing the coordinating functional group bonded to the ring when the substituent other than the coordinating functional group or the substituent containing the coordinating functional group is bonded to the ring.

The coordinating functional group may be a functional group that can be coordinated to the QD 31B. Examples of the coordinating functional group include the coordinating functional groups exemplified above. As the ligand 32B, for example, a ligand similar to the ligand exemplified as the ligand 32R in the first embodiment can be used.

As illustrated in FIG. 13, the display device 1 according to the present embodiment has the same configuration as the display device 1 according to the first embodiment and the second embodiment except for this point.

The nanoparticle film patterning method according to the present embodiment and the first embodiment have in common in that it is a method for forming the nanoparticle layer pattern by forming a non-dispersive ligand-containing portion containing a nanoparticle and a monodentate non-dispersive ligand that is coordinated to the nanoparticle to render the nanoparticle non-dispersible in a solvent in a part of a nanoparticle film containing the nanoparticle, and removing a portion of the nanoparticle film other than the non-dispersive ligand-containing portion with a first organic solvent.

In the present embodiment, as the above-described nanoparticle film patterning method, the nanoparticle film is patterned using a nanoparticle film patterning method (hereinafter referred to as "second method") described below.

The second method includes a nanoparticle film forming process, a resist patterning process, a non-dispersive ligand supplying process, a resist pattern removing process, and a non-dispersive ligand-free portion removing process which are described below.

Here, the nanoparticle film forming process is a process of forming, as the nanoparticle film, a nanoparticle film containing at least the nanoparticle among the nanoparticle and a first ligand.

The resist patterning process is a process of forming a resist pattern on a part of the nanoparticle film.

The non-dispersive ligand supplying process is a process of supplying the non-dispersive ligand dispersion containing the non-dispersive ligand and a second organic solvent to the portion of the nanoparticle film not covered with the resist pattern and coordinating the non-dispersive ligand to the nanoparticle, and thus forming the non-dispersive ligand-containing portion and the non-dispersive ligand-free portion not containing the non-dispersive ligand in the nanoparticle film.

When the nanoparticle film contains nanoparticle and the first ligand (in other words, when the nanoparticle film contains nanoparticle to which the first ligand is coordinated), the non-dispersive ligand dispersion is supplied to the portion of the nanoparticle film not covered with the resist pattern, and thus the non-dispersive ligand is coordinated to the nanoparticle by ligand exchange. Thus, the non-dispersive ligand supplying process may be a non-dispersive ligand substituting process of substituting the first ligand in the portion of the nanoparticle film not covered with the resist pattern with the non-dispersive ligand.

The resist pattern removing process is a process of removing the resist pattern after the non-dispersive ligand supplying process.

The non-dispersive ligand-free portion removing process is a process of dispersing the nanoparticle of the non-dispersive ligand-free portion in the first organic solvent and removing the non-dispersive ligand-free portion with the first organic solvent after the resist pattern removing process.

Figure 14:
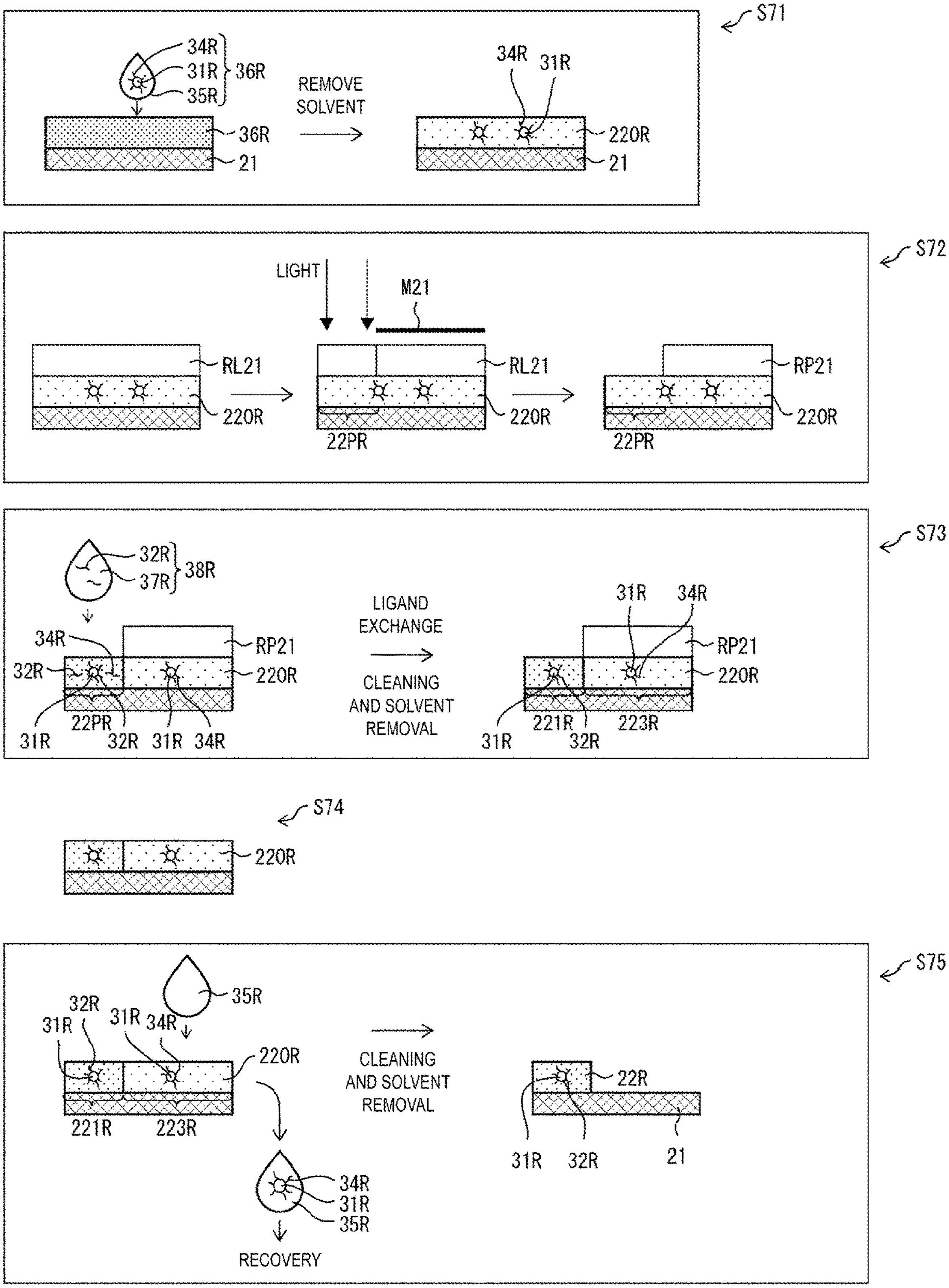
FIG. 14 is a cross-sectional view illustrating an example of processes of a part of the nanoparticle layer patterning process illustrated in FIG. 3 according to the third embodiment in order of the processes.

Also in the present embodiment, a description will be given with reference to the method for forming the EML 22R. FIG. 14 illustrates the method for forming the EML 22R using the second method. In the following, an example of a method will be described in which after the EML 22R is formed using the second method, the EML 22G and the EML 22B are formed.

Figure 15:
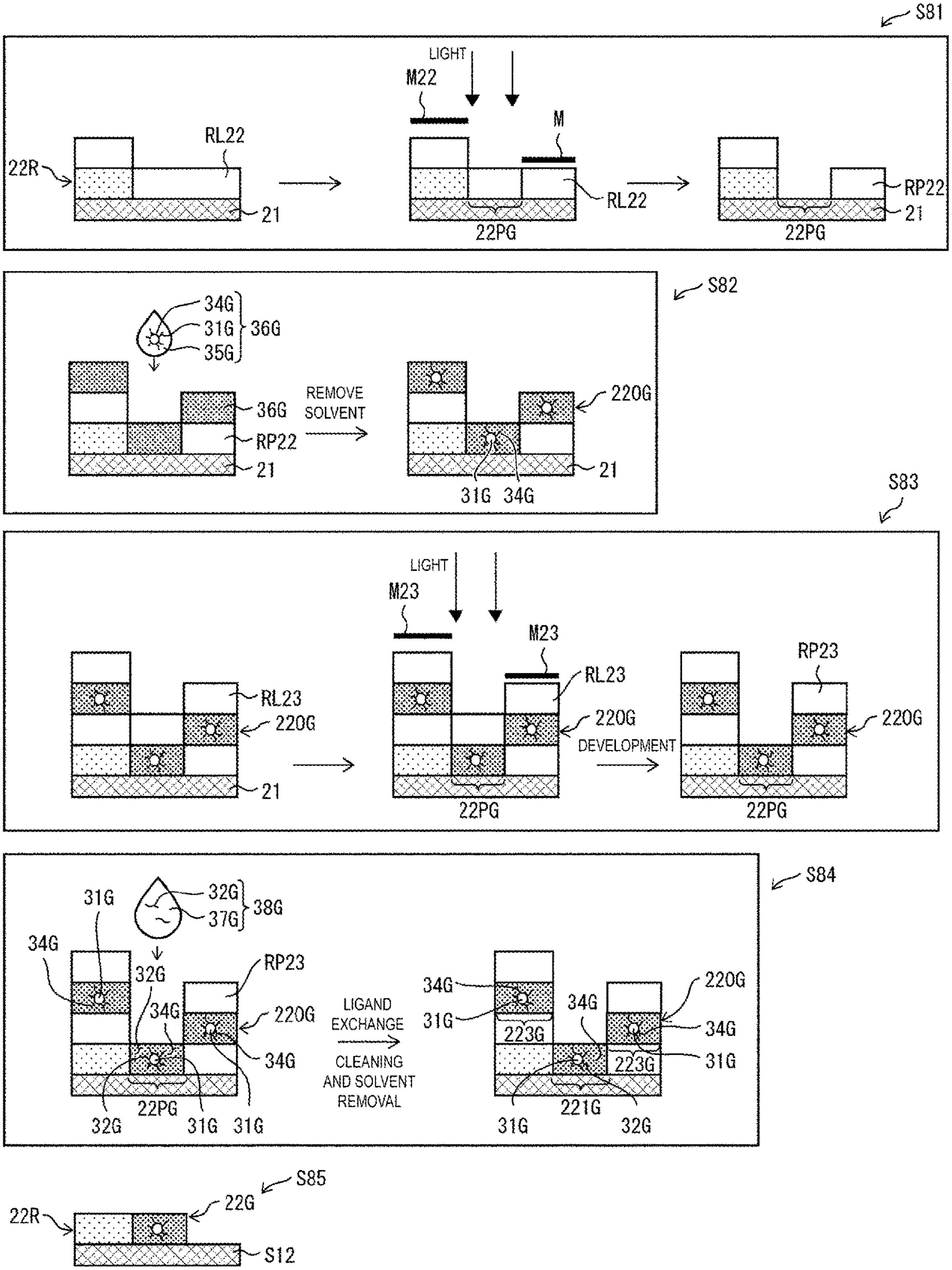
FIG. 15 is a cross-sectional view illustrating an example of processes of a part of the nanoparticle layer patterning process illustrated in FIG. 3 according to the third embodiment in order of the processes.
Figure 16:
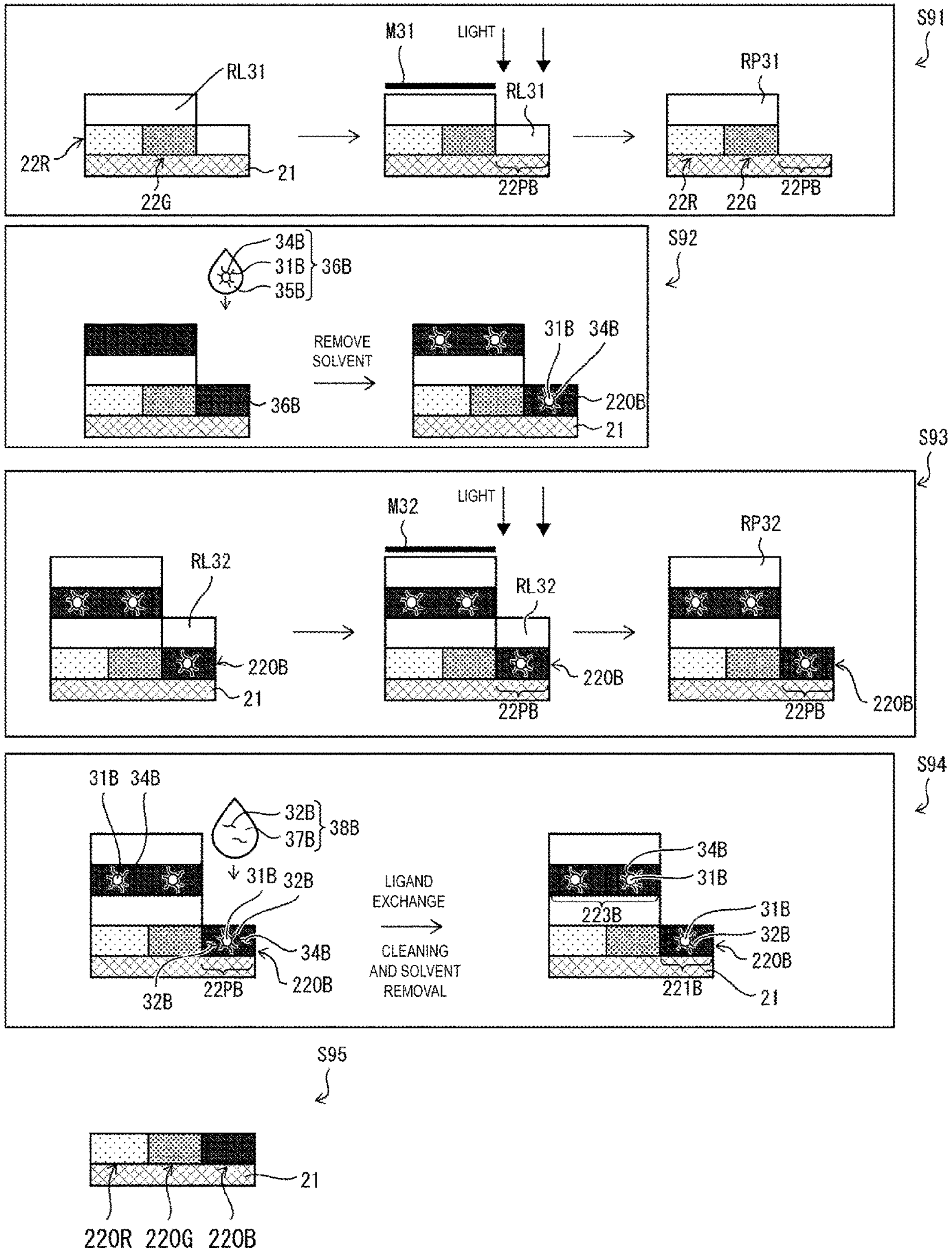
FIG. 16 is a cross-sectional view illustrating an example of processes of a part of the nanoparticle layer patterning process illustrated in FIG. 3 according to the third embodiment in order of the processes.

Each of FIG. 14, and FIG. 16 is cross-sectional views illustrating an example of processes of a part of step S24 illustrated in FIG. 3 according to the present embodiment in order of the processes. FIGS. 14 to 16 illustrate a portion P3 surrounded by a two-dot chain line in FIG. 13 as an example. Also in FIG. 14 to FIG. 16, the QDs in the EML 22 are enlarged and the number of QDs is omitted.

Also in the present embodiment, a QD film containing the same QDs is denoted by the same reference numeral regardless of the change in the ligands coordinated to the QDs. Also in the present embodiment, a case will be described as an example in which the EML 22R, the EML 22G, and the EML 22B are formed in this order in step S24.

As indicated by S71 in FIG. 14, when the second method is used for forming the EML 22R, in step S24, first, a QD film 220R containing the QDs 31R and the ligands 34R (first ligands) is formed in a solid-like shape as the nanoparticle film on the HTL 21 serving as an underlayer (support layer) of the EML 22 of each color (step S71, QD film forming process).

Note that step S71 is similar to step S31. Thus, the description thereof is omitted.

Next, as indicated by S72 in FIG. 14, a resist pattern RP21 is formed in a portion on the QD film 220R other than the red EML formation scheduled region 22PR (step S72, resist patterning process).

For this purpose, in step S72, first, a resist layer RL21 covering the QD film 220R is formed in a solid-like shape on the QD film 220R. Next, the resist layer RL21 is exposed using a mask M21 that exposes the resist layer RL21 of the red EML formation scheduled region 22PR. Next, the resist layer RL21 is developed with a developing solution. As a result, the resist pattern RP21 made of the resist layer RL21 is formed on the QD film 220R other than the red EML formation scheduled region 22PR.

Next, as indicated by S73 in FIG. 14, a non-dispersive ligand-containing portion 221R and a non-dispersive ligand-free portion 223R are formed in the QD film 220R (step S73, non-dispersive ligand supplying process, non-dispersive ligand substituting process).

As described in the first embodiment, the non-dispersive ligand-containing portion 221R refers to the portion containing the QDs 31R and the ligands 32R in the QD film 220R. The non-dispersive ligand-free portion 223R refers to a portion of the QD film 220R that contains the QDs 31R and the ligands 34R (first ligands) that are non-substitutional ligands and that does not contain the ligands 32R that are non-dispersive ligands.

For this purpose, in step S73, first, the ligand dispersion 38R (dispersive ligand dispersion) containing the ligands 32R and the solvent 37R is supplied to and brought into contact with a portion of the QD film 220R not covered with the resist pattern RP21.

As a result, the ligands 34R coordinated to the QDs 31R in the QD film 220R in the portion not covered with the resist pattern RP21 are subjected to the ligand exchange with the ligands 32R. Specifically, the ligands 32R are coordinated to the QDs 31R of the QD film 220R in the red EML formation scheduled region 22PR by the ligand exchange.

The QD film 220R in the red EML formation scheduled region 22PR after the ligand exchange contains the QDs 31R to which the ligands 32R are coordinated, the ligands 34R released from the QDs 31R by the ligand exchange, and the excess ligands 32R not coordinated to the QDs 31R.

Next, for example, a sufficient amount of the solvent 37R is supplied as a rinse liquid to the QD film 220R in the red EML formation scheduled region 22PR to clean the QD film 220R. Thereafter, the unnecessary rinse liquid contained in the QD film 220R is removed by heating and drying or the like, if necessary.

As described above, the QDs 31R to which the ligands 32R are coordinated are non-dispersible in any solvent. Thus, the free ligands 34R and the free ligands 32R in the QD film 220R in the red EML formation scheduled region 22PR are removed by the cleaning, but the QDs 31R to which the ligands 32R are coordinated are not removed.

As a result, the non-dispersive ligand-containing portion 221R is formed in the red EML formation scheduled region 22PR in the QD film 220R, and the non-dispersive ligand-free portion 223R is formed in a portion of the QD film 220R other than the red EML formation scheduled region 22PR.

Next, as indicated by S74 in FIG. 14, the resist pattern RP21 is peeled by, for example, a resist solvent to remove the resist pattern RP21 (step S74, resist pattern removing process).

Next, as indicated by S75 in FIG. 14, the QDs 31R to which the ligands 34R are coordinated in the non-dispersive ligand-free portion 223R is removed by dispersing the QDs 31R in, for example, the solvent 35R serving as the organic solvent (first organic solvent) capable of dispersing the QDs 31R. As a result, the non-dispersive ligand-free portion 223R is removed by the solvent 35R (step S75, non-dispersive ligand-free portion removing process).

As a result, the EML 22R including the non-dispersive ligand-containing portion 221R is formed on the HTL21 as a QD layer pattern (nanoparticle layer pattern) obtained by patterning the QD film 220R.

Note that the QDs 31R contained in the non-dispersive ligand-free portion 223R (in other words, the portion of the QD film 220R other than the non-dispersive ligand-containing portion 221R), which are removed by the solvent 35R in step S75, are less deteriorated and can be reused. Thus, in the present embodiment, it is preferable that a recovering process of recovering the QDs 31R is performed together with step S75.

In the first embodiment, the non-dispersive ligand-containing portion 221R of the QD film 220R subjected to the ligand exchange once is used as the EML 22R of the light-emitting region EAR, while the QDs 31R subjected to the ligand exchange twice are recovered.

In the present embodiment, similarly to the first embodiment, the non-dispersive ligand-containing portion 221R of the QD film 220R subjected to the ligand exchange once is used as the EML 22R of the light-emitting region EAR, while the QDs 31R not subjected to the ligand exchange are recovered. Thus, the QDs 31 in which deterioration is further suppressed as compared with the first embodiment can be recovered.

Also in the present embodiment, the light-emitting element ESR including the EML 22R is manufactured by further layering the ETL 23 and the cathode electrode 54 on the EML 22R as described above.

As described above, in the present embodiment, after the EML 22R is formed, the EML 22G and the EML 22B are formed in this order. In the present embodiment, a case will be described as an example in which the EML 22G and the EML 22B are formed using a method combining the second method and the lift-off method.

FIG. 15 is a cross-sectional view illustrating an example of a method for forming the EML 22G. FIG. 16 is a cross-sectional view illustrating an example of a method for forming the EML 22B.

After step S75, in the present embodiment, as indicated by S81 in FIG. 15, a resist pattern RP22 is formed on a part of the HTL 21 where the EML 22R is formed so that only a green EML formation scheduled region 22PG is exposed (step S81, resist patterning process).

For this purpose, in step S81, first, a resist layer RL22 is formed in a solid-like shape on the HTL 21 where the EML 22R is formed so as to cover the EML 22R. Next, the resist layer RL22 is exposed using a mask M22 that exposes only the resist layer RL22 of the green EML formation scheduled region 22PG. Next, the resist layer RL22 is developed with a developing solution. As a result, the resist pattern RP22 made of the resist layer RL22 is formed only in a portion other than the green EML formation scheduled region 22PG.

Next, as indicated by S82 in FIG. 15, the QD film 220G containing the QDs 31G and ligands 34G is formed in a solid-like shape as the nanoparticle film on the HTL 21 where the EML 22R including the layered resist pattern RP22 is formed (step S82, QD film forming process).

For this purpose, in step S82, first, QD dispersion 36G containing the QDs 31G, the ligands 34G, and a solvent 35G is applied in a solid-like shape on the HTL 21 so as to cover the resist pattern RP22. Next, the solvent 35G contained in the coating film made of the QD dispersion 36G applied on the HTL 21 is removed, and the coating film is dried. As a result, the QD film 220G in a solid-like shape containing the QDs 31G and the ligands 34G and common to all the subpixels SP is formed as the nanoparticle film on the HTL 21.

Next, as indicated by S83 in FIG. 15, in the same manner as step S81, a resist pattern RP23 is formed on a part of the HTL 21 where the QD film 220G is formed so that only the green EML formation scheduled region 22PG is exposed (step S83, resist patterning process).

That is, in step S83, a resist layer RL23 is formed in a solid-like shape on the HTL 21 where the QD film 220G is formed so as to cover the QD film 220G. Next, the resist layer RL23 is exposed using a mask M23 that exposes only the resist layer RL23 of the green EML formation scheduled region 22PG. Next, the resist layer RL23 is developed with a developing solution. As a result, the resist pattern RP23 made of the resist layer RL23 is formed only in a portion other than the green EML formation scheduled region 22PG.

Next, as indicated by S84 in FIG. 15, a non-dispersive ligand-containing portion 221G and a non-dispersive ligand-free portion 223G are formed in the QD film 220G (step S84, non-dispersive ligand supplying process, non-dispersive ligand substituting process).

As described in the first embodiment, the non-dispersive ligand-containing portion 221G refers to the portion containing the QDs 31G and the ligands 32G in the QD film 220G. The non-dispersive ligand-free portion 223G refers to a portion of the QD film 220G containing the QDs 31G and the ligands 34G (first ligands) that are non-substitutional ligands and not containing the ligands 32G that are non-dispersive ligands.

For this purpose, in step S84, first, the ligand dispersion 38G (dispersive ligand dispersion) containing the ligands 32G and the solvent 37G is supplied to and brought into contact with a portion of the QD film 220G not covered with the resist pattern RP23.

As a result, the ligands 34G coordinated to the QDs 31G in the QD film 220G in the portion not covered with the resist pattern RP23 are subjected to the ligand exchange with the ligands 32G. Specifically, the ligands 32G are coordinated to the QDs 31G of the QD film 220G in the green EML formation scheduled region 22PG by the ligand exchange.

The QD film 220G in the green EML formation scheduled region 22PG after the ligand exchange contains the QDs 31G to which the ligands 32G are coordinated, the ligands 34G released from the QDs 31G by the ligand exchange, and the excess ligands 32G not coordinated to the QDs 31G.

Next, for example, a sufficient amount of the solvent 37R is supplied as a rinse liquid to the QD film 220G in the green EML formation scheduled region 22PG to clean the QD film 220G. Thereafter, the unnecessary rinse liquid contained in the QD film 220G is removed by heating and drying or the like, if necessary.

As described above, the QDs 31G to which the ligands 32G are coordinated are non-dispersible in any solvent. Thus, the free ligands 34G and the free ligands 32G in the QD film 220G in the green EML formation scheduled region 22PG are removed by the cleaning, but the QDs 31G to which the ligands 32G are coordinated are not removed.

As a result, the non-dispersive ligand-containing portion 221G is formed in the green EML formation scheduled region 22PG in the QD film 220G, and the non-dispersive ligand-free portion 223G is formed in a portion of the QD film 220G other than the green EML formation scheduled region 22PG.

Next, as indicated by S85 in FIG. 15, the non-dispersive ligand-free portion 223G on the resist pattern RP22 and the resist pattern RP23 are removed by the lift-off using a resist solvent (step S85, lift-off process). As a result, the EML 22G obtained by patterning the QD film 220G is formed on the HTL 21.

As described above, the resist pattern RP22 that is a resist pattern of the lower layer of the QD film 220G is formed for removing the non-dispersive ligand-free portion 223G by the lift-off. On the other hand, the resist pattern RP23 that is the resist pattern of the upper layer of the QD film 220G is formed for forming the non-dispersive ligand-containing portion 221G and the non-dispersive ligand-free portion 223G by the ligand exchange as described above.

Next, as indicated by S91 in FIG. 16, a resist pattern RP31 is formed on a part of the HTL 21 where the EML 22R and the EML 22G are formed so that only the blue EML formation scheduled region 22PB is exposed (step S91, resist patterning process).

For this purpose, in step S91, first, a resist layer RL31 is formed in a solid-like shape on the HTL 21 where the EML 22R and the EML 22G are formed so as to cover the EML 22R and the EML 22G. Next, the resist layer RL31 is exposed using a mask M31 that exposes only the resist layer RL31 of the blue EML formation scheduled region 22PB. Next, the resist layer RL31 is developed with a developing solution. As a result, the resist pattern RP31 made of the resist layer RL31 is formed only in a portion other than the blue EML formation scheduled region 22PB.

Next, as indicated by S92 in FIG. 16, the QD film 220B containing the QDs 31B and the ligands 34B is formed in a solid-like shape as the nanoparticle film on the HTL 21 where the resist pattern RP31 is formed (step S92, QD film forming process).

For this purpose, in step S92, first, QD dispersion 36B containing the QDs 31B, the ligands 34B, and the solvent 35B is applied in a solid-like shape on the HTL 21 so as to cover the resist pattern RP31. Next, the solvent 35B contained in the coating film made of the QD dispersion 36B applied on the HTL 21 is removed, and the coating film is dried. As a result, the QD film 220B in a solid-like shape containing the QDs 31B and the ligands 34B and common to all the subpixels SP is formed as the nanoparticle film on the HTL 21.

Next, as indicated by S93 in FIG. 16, in the same manner as step S91, a resist pattern RP32 is formed on a part of the HTL 21 where the QD film 220B is formed so that only the blue EML formation scheduled region 22PB is exposed (step S93, resist patterning process).

That is, in step S93, a resist layer RL32 is formed in a solid-like shape on the HTL 21 where the QD film 220B is formed so as to cover the QD film 220B. Next, the resist layer RL32 is exposed using a mask M32 that exposes only the resist layer RL32 of the blue EML formation scheduled region 22PB. Next, the resist layer RL32 is developed with a developing solution. As a result, the resist pattern RP32 made of the resist layer RL32 is formed only in a portion other than the blue EML formation scheduled region 22PB.

Next, as indicated by S94 in FIG. 16, a non-dispersive ligand-containing portion 221B and a non-dispersive ligand-free portion 223B are formed in the QD film 220B (step S94, non-dispersive ligand supplying process, non-dispersive ligand substituting process).

As described in the first embodiment, the non-dispersive ligand-containing portion 221B refers to the portion containing the QDs 31B and the ligands 32B in the QD film 220B. The non-dispersive ligand-free portion 223B refers to a portion of the QD film 220B containing the QDs 31B and the ligands 34B (first ligands) that are non-substitutional ligands and not containing the ligands 32B that are non-dispersive ligands.

For this purpose, in step S94, first, the ligand dispersion 38B (dispersive ligand dispersion) containing the ligands 32B and the solvent 37B is supplied to and brought into contact with a portion of the QD film 220B not covered with the resist pattern RP32.

As a result, the ligands 34B coordinated to the QDs 31B in the QD film 220B in the portion not covered with the resist pattern RP32 are subjected to the ligand exchange with the ligands 32B. Specifically, the ligands 32B are coordinated to the QDs 31B of the QD film 220B in the blue EML formation scheduled region 22PB by the ligand exchange.

The QD film 220B in the blue EML formation scheduled region 22PB after the ligand exchange contains the QDs 31B to which the ligands 32B are coordinated, the ligands 34B released from the QDs 31B by the ligand exchange, and the excess ligands 32B not coordinated to the QDs 31G.

Next, for example, a sufficient amount of the solvent 37B is supplied as a rinse liquid to the QD film 220B in the blue EML formation scheduled region 22PB to clean the QD film 220B. Thereafter, the unnecessary rinse liquid contained in the QD film 220B is removed by heating and drying or the like, if necessary.

As described above, the QDs 31B to which the ligands 32B are coordinated are non-dispersible in any solvent. Thus, the free ligands 34B and the free ligands 32B in the QD film 220B in the blue EML formation scheduled region 22PB are removed by the cleaning, but the QDs 31B to which the ligands 32B are coordinated are not removed.

As a result, the non-dispersive ligand-containing portion 221B is formed in the blue EML formation scheduled region 22PB in the QD film 220B, and the non-dispersive ligand-free portion 223B is formed in a portion of the QD film 220B other than the blue EML formation scheduled region 22PB.

Next, as indicated by S95 in FIG. 16, the non-dispersive ligand-free portion 223B on the resist pattern RP31 and the resist pattern RP32 are removed by the lift-off using a resist solvent (step S95, lift-off process). As a result, the EML 22B obtained by patterning the QD film 220B is formed on the HTL 21.

As described above, the resist pattern RP31 that is a resist pattern of the lower layer of the QD film 220B is formed for removing the non-dispersive ligand-free portion 223B by the lift-off. On the other hand, the resist pattern RP32 that is the resist pattern of the upper layer of the QD film 220B is formed for forming the non-dispersive ligand-containing portion 221B and the non-dispersive ligand-free portion 223B by the ligand exchange as described above.

Through the above processes, the EML 22R, the EML 22G, and the EML 22B illustrated in FIG. 13 can be formed.

In the second method according to the present embodiment, the nanoparticles in the nanoparticle film under the resist pattern in the resist patterning process and the resist pattern removing process are brought into contact with the developing solution in a state of not being dispersed in the solvent. Thus, as the nanoparticles, it is desirable to use nanoparticles having solvent resistance to the solvent used as the developing solution.

However, in the second method according to the present embodiment, as described above, the non-dispersive ligands are coordinated to the nanoparticles at any position of the nanoparticle film to render the nanoparticles non-dispersible, and the nanoparticles not being rendered non-dispersible other than above-described any position are dispersed in the solvent and removing the dispersed nanoparticles, and thus patterning the nanoparticle film. Thus, even by the second method, the resist material and the nanoparticles can be separately removed. Thus, it is not necessary to separate the resist material and the nanoparticles from each other, the nanoparticles can be easily recovered, and deterioration of the nanoparticles due to the separation from the resist material does not occur.

As described above, in the first method, the non-dispersive ligand-containing portion of the nanoparticle film subjected to the ligand exchange once is used as the nanoparticle layer pattern, while the nanoparticles subjected to the ligand exchange twice are recovered.

However, in the second method, the non-dispersive ligand-containing portion of the nanoparticle film subjected to the ligand exchange once is used as the nanoparticle layer pattern, while the nanoparticles not subjected to the ligand exchange can be recovered.

In addition, even when the second method is used, the portion not covered with the resist pattern and finally remains as the nanoparticle layer pattern is insolubilized in the solvent before the resist pattern removing process, and has high solvent resistance.

Moreover, also in the present embodiment, the nanoparticle layer patterned previously is insolubilized in a solvent before the formation of the nanoparticle layer patterned later thus having high solvent resistance. Thus, the nanoparticle layer patterned previously is not damaged by repeating the formation of the nanoparticle layer pattern.

Thus, also in the present embodiment, a nanoparticle film patterning method capable of recovering and reusing some of the removed nanoparticles with less deterioration and forming a nanoparticle layer pattern with less deterioration, and a method for manufacturing a light-emitting element, a method for manufacturing a display device, and a light-emitting element using the same can be provided.

Fourth Embodiment

In the following, description regarding differences from the previous embodiments will be described.

Note that a cross-sectional view illustrating the schematic configuration of the main portions of the display device 1 according to the present embodiment is the same as FIG. 13. Thus, in the present embodiment, the illustration of the cross-sectional view and the description of the display device 1 are omitted.

In the present embodiment, the forming process of the EML 22 illustrated in FIG. 13 will be described below with reference to FIGS. 14, 17 and 18.

As described above, in the first embodiment, the case is described as an example in which after the EML 22R is formed using the second method, the EML 22G and the EML 22B are formed using the method combining the second method and the lift-off method.

In the present embodiment, all of the EML 22R, the EML 22G, and the EML 22B are formed in this order using the second method described above.

Figure 17:
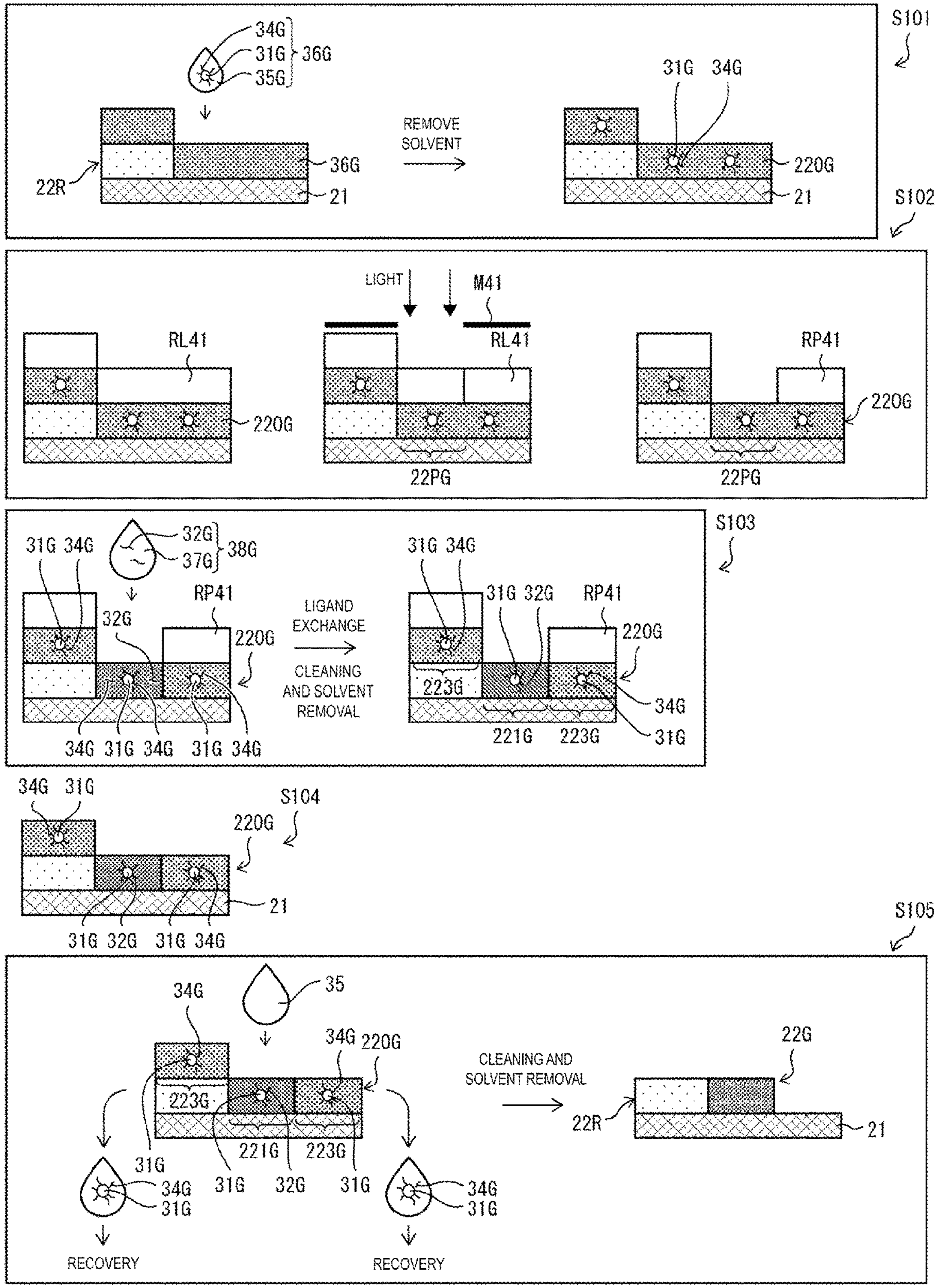
FIG. 17 is a cross-sectional view illustrating an example of processes of a part of the nanoparticle layer patterning process illustrated in FIG. 3 according to a fourth embodiment in order of the processes.
Figure 18:
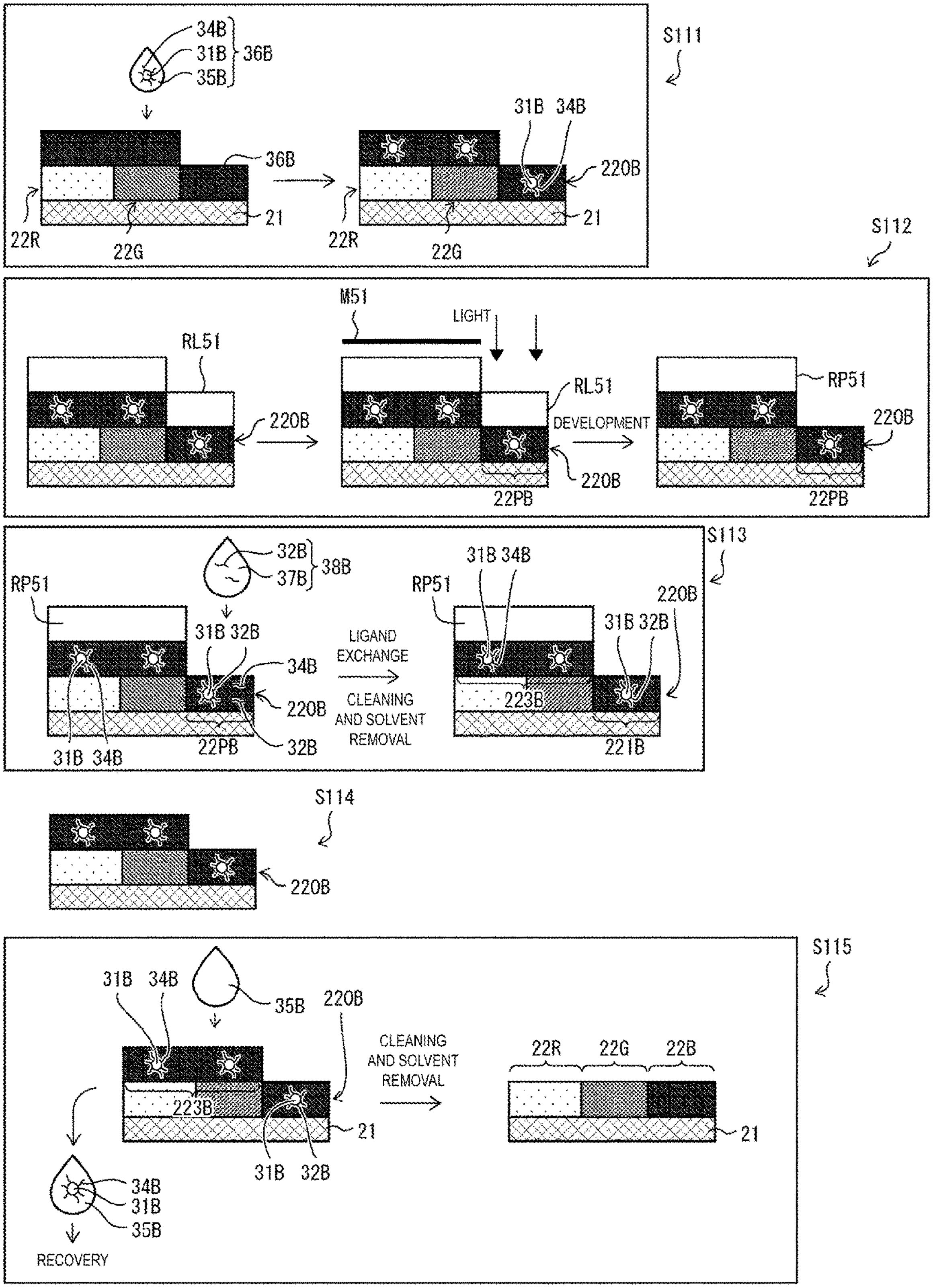
FIG. 18 is a cross-sectional view illustrating an example of processes of a part of the nanoparticle layer patterning process illustrated in FIG. 3 according to the fourth embodiment in order of the processes.

Similarly to FIG. 14, FIG. 17 and FIG. 18 are cross-sectional views each illustrating an example of processes of a part of step S24 illustrated in FIG. 3 according to the present embodiment in order of the processes. FIG. 17 is cross-sectional views each illustrating processes subsequent to step S75 illustrated in FIG. 14 in step S24, and illustrates a method for forming the EML 22G by using the second method. FIG. 18 is cross-sectional views each illustrating processes subsequent to step S105 illustrated in FIG. 17 in step S24, and illustrates a method for forming the EML 22B by using the second method.

Also in FIG. 17 and FIG. 18, similarly to FIG. 14, the portion P3 surrounded by the two-dot chain line in FIG. 13 is illustrated as an example. Also in FIG. 17 and FIG. 18, the QDs in the EML 22 are enlarged and the number of QDs is omitted. Also in the present embodiment, a QD film containing the same QDs is denoted by the same reference numeral regardless of the change in the ligands coordinated to the QDs.

In the present embodiment, first, steps S71 to S75 illustrated in FIG. 14 are performed. Next, in the present embodiment, as indicated by S101 in FIG. 17, in the same manner as step S82, the QD film 220G containing the QDs 31G and the ligands 34G (first ligands) is formed in a solid-like shape as the nanoparticle film on the HTL 21 where the EML 22R is formed (step S101, QD film forming process).

Next, as indicated by S102 in FIG. 17, in the same manner as step S83, a resist pattern RP41 is formed instead of the resist pattern RP23 on a part of the HTL 21 where the QD film 220G is formed so that only the green EML formation scheduled region 22PG is exposed (step S102, resist patterning process).

That is, in step S102, a resist layer RL41 is formed in a solid-like shape on the HTL 21 where the QD film 220G is formed so as to cover the QD film 220G. Next, the resist layer RL41 is exposed using a mask M41 that exposes only the resist layer RL41 of the green EML formation scheduled region 22PG. Next, the resist layer RL41 is developed with a developing solution. As a result, the resist pattern RP41 made of the resist layer RL41 is formed only in a portion other than the green EML formation scheduled region 22PG.

Next, as indicated by S103 in FIG. 17, in the same manner as step S84, the non-dispersive ligand-containing portion 221G and the non-dispersive ligand-free portion 223G are formed in the QD film 220G (step S103, non-dispersive ligand supplying process, non-dispersive ligand substituting process).

For this purpose, in step S103, first, the ligand dispersion 38G (dispersive ligand dispersion) containing the ligands 32G and the solvent 37G is supplied to and brought into contact with a portion of the QD film 220G not covered with the resist pattern RP41.

As a result, the ligands 34G coordinated to the QDs 31G in the QD film 220G in the portion not covered with the resist pattern RP41 are subjected to the ligand exchange with the ligands 32G. Thereafter, for example, a sufficient amount of the solvent 37G is supplied as a rinse liquid to the QD film 220G in the green EML formation scheduled region 22PG to clean the QD film 220G, and the unnecessary rinse liquid contained in the QD film 220G is removed by heating and drying or the like if necessary.

As a result, the non-dispersive ligand-containing portion 221G is formed in the green EML formation scheduled region 22PG in the QD film 220G, and the non-dispersive ligand-free portion 223G is formed in a portion of the QD film 220G other than the green EML formation scheduled region 22PG.

Next, as indicated by S104 in FIG. 17, the resist pattern RP41 is peeled by, for example, a resist solvent to remove the resist pattern RP41 (step S104, resist pattern removing process).

Next, as indicated by S105 in FIG. 17, the QDs 31G to which the ligands 34G are coordinated in the non-dispersive ligand-free portion 223G is removed by dispersing the QDs 31G in, for example, the solvent 35G serving as the organic solvent (first organic solvent) capable of dispersing the QDs 31G. As a result, the non-dispersive ligand-free portion 223G is removed by the solvent 35G (step S105, non-dispersive ligand-free portion removing process).

As a result, the EML 22G including the non-dispersive ligand-containing portion 221G is formed on the HTL21 as a QD layer pattern (nanoparticle layer pattern) obtained by patterning the QD film 220G.

Note that the QDs 31G contained in the non-dispersive ligand-free portion 223G (in other words, the portion of the QD film 220G other than the non-dispersive ligand-containing portion 221G), which are removed by the solvent 35G in step S105, are less deteriorated and can be reused. Thus, in the present embodiment, it is preferable that a recovering process of recovering the QDs 31G is performed together with step S105.

Next, in the present embodiment, as indicated by S111 in FIG. 18, in the same manner as step S92, the QD film 220B containing the QDs 31B and the ligands 34B (first ligands) is formed in a solid-like shape as the nanoparticle film on the HTL 21 where the EML 22R and the EML 22G are formed (step S111, QD film forming process).

Next, as indicated by S112 in FIG. 18, in the same manner as step S93, a resist pattern RP51 is formed instead of the resist pattern RP32 on a part of the HTL 21 where the QD film 220B is formed so that only the blue EML formation scheduled region 22PB is exposed (step S112, resist patterning process).

That is, in step S112, a resist layer RL51 is formed in a solid-like shape on the HTL 21 where the QD film 220B is formed so as to cover the QD film 220B. Next, the resist layer RL51 is exposed using a mask M51 that exposes only the resist layer RL51 of the blue EML formation scheduled region 22PB. Next, the resist layer RL51 is developed with a developing solution. As a result, the resist pattern RP51 made of the resist layer RL51 is formed only in a portion other than the blue EML formation scheduled region 22PB.

Next, as indicated by S113 in FIG. 18, in the same manner as step S94, the non-dispersive ligand-containing portion 221B and the non-dispersive ligand-free portion 223B are formed in the QD film 220B (step S113, non-dispersive ligand supplying process, non-dispersive ligand substituting process).

For this purpose, in step S113, first, the ligand dispersion 38B (dispersive ligand dispersion) containing the ligands 32B and the solvent 37B is supplied to and brought into contact with a portion of the QD film 220B not covered with the resist pattern RP51.

As a result, the ligands 34B coordinated to the QDs 31B in the QD film 220B in the portion not covered with the resist pattern RP51 are subjected to the ligand exchange with the ligands 32B. Thereafter, for example, a sufficient amount of the solvent 37B is supplied as a rinse liquid to the QD film 220B in the blue EML formation scheduled region 22PB to clean the QD film 220B, and the unnecessary rinse liquid contained in the QD film 220B is removed by heating and drying or the like if necessary.

As a result, the non-dispersive ligand-containing portion 221B is formed in the blue EML formation scheduled region 22PB in the QD film 220B, and the non-dispersive ligand-free portion 223B is formed in a portion of the QD film 220B other than the blue EML formation scheduled region 22PB.

Next, as indicated by S114 in FIG. 18, the resist pattern RP51 is peeled by, for example, a resist solvent to remove the resist pattern RP51 (step S114, resist pattern removing process).

Next, as indicated by S115 in FIG. 18, the QDs 31B to which the ligands 34B are coordinated in the non-dispersive ligand-free portion 223B is removed by dispersing the QDs 31B in, for example, the solvent 35B serving as the organic solvent (first organic solvent) capable of dispersing the QDs 31B. As a result, the non-dispersive ligand-free portion 223B is removed by the solvent 35B (step S115, non-dispersive ligand-free portion removing process).

As a result, the EML 22B including the non-dispersive ligand-containing portion 221B is formed on the HTL21 as a QD layer pattern (nanoparticle layer pattern) obtained by patterning the QD film 220B.

Note that the QDs 31B contained in the non-dispersive ligand-free portion 223B (in other words, the portion of the QD film 220B other than the non-dispersive ligand-containing portion 221B), which are removed by the solvent 35B in step S115, are less deteriorated and can be reused. Thus, in the present embodiment, it is preferable that a recovering process of recovering the QDs 31B is performed together with step S115.

Through the above processes, the EML 22R, the EML 22G, and the EML 22B illustrated in FIG. 13 can be formed.

Also in the present embodiment, the same advantageous effects as in the third embodiment can be obtained using the second method. In addition, according to the present embodiment, by forming all of the EML 22R, the EML 22G, and the EML 22B by using the second method, the QDs can be recovered in a state in which the deterioration of the QDs is suppressed not only for the QDs 31R but also for the QDs 31G and the QDs 31B.

In addition, also in the present embodiment, the nanoparticle layer patterned previously is insolubilized in a solvent before the formation of the nanoparticle layer patterned later thus having high solvent resistance. Thus, the nanoparticle layer patterned previously is not damaged by repeating the formation of the nanoparticle layer pattern.

Thus, also in the present embodiment, the nanoparticle film patterning method capable of recovering and reusing all of the removed nanoparticles with less deterioration and forming a nanoparticle layer pattern with less deterioration, and a method for manufacturing a light-emitting element, a method for manufacturing a display device, and a light-emitting element using the same can be provided.

Fifth Embodiment

In the following, description regarding differences from the previous embodiments will be described.

Figure 19:
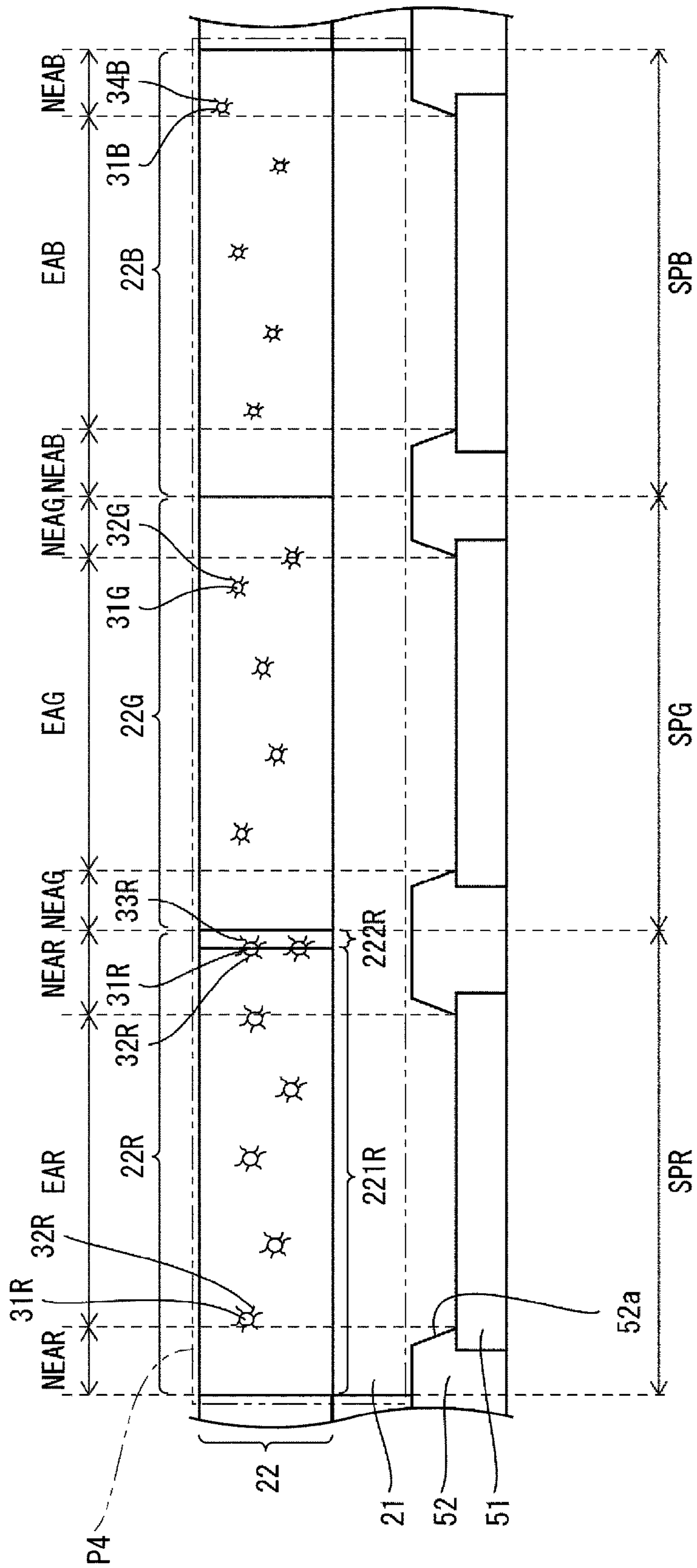
FIG. 19 is a cross-sectional view schematically illustrating an overall configuration of main portions of a display device according to a fifth embodiment.

FIG. 19 is a cross-sectional view schematically illustrating an overall configuration of the main portions of the display device 1 according to the present embodiment. Also in FIG. 19, the QDs in the EML 22 are enlarged and the number of QDs is omitted.

As illustrated in FIG. 19, in the display device 1 according to the present embodiment, the EML 22R includes the non-dispersive ligand-containing portion 221R containing the ligands 32R (non-dispersive ligands) as the ligands and the dispersive ligand-containing portion 222R containing the ligands 33R (dispersive ligands) as the ligands. The EML 22G is made of only the non-dispersive ligand-containing portion 221G, and the entirety thereof contains the QDs 31G and the ligands 32G. The EML 22B in its entirety contains the QDs 31B and the ligands 34B.

As illustrated in FIG. 19, the display device 1 according to the present embodiment has the same configuration as the display device 1 according to the first to the fourth embodiments except for this point.

In the following, a forming process of the EML 22 according to the present embodiment will be described with reference to FIG. 5, FIG. 20, and FIG. 21.

In the first embodiment, after the EML 22R is formed using the first method, the EML 22G is formed using the method combing the second method and the lift-off method, and then the EML 22B is formed by the lift-off method.

Figure 20:
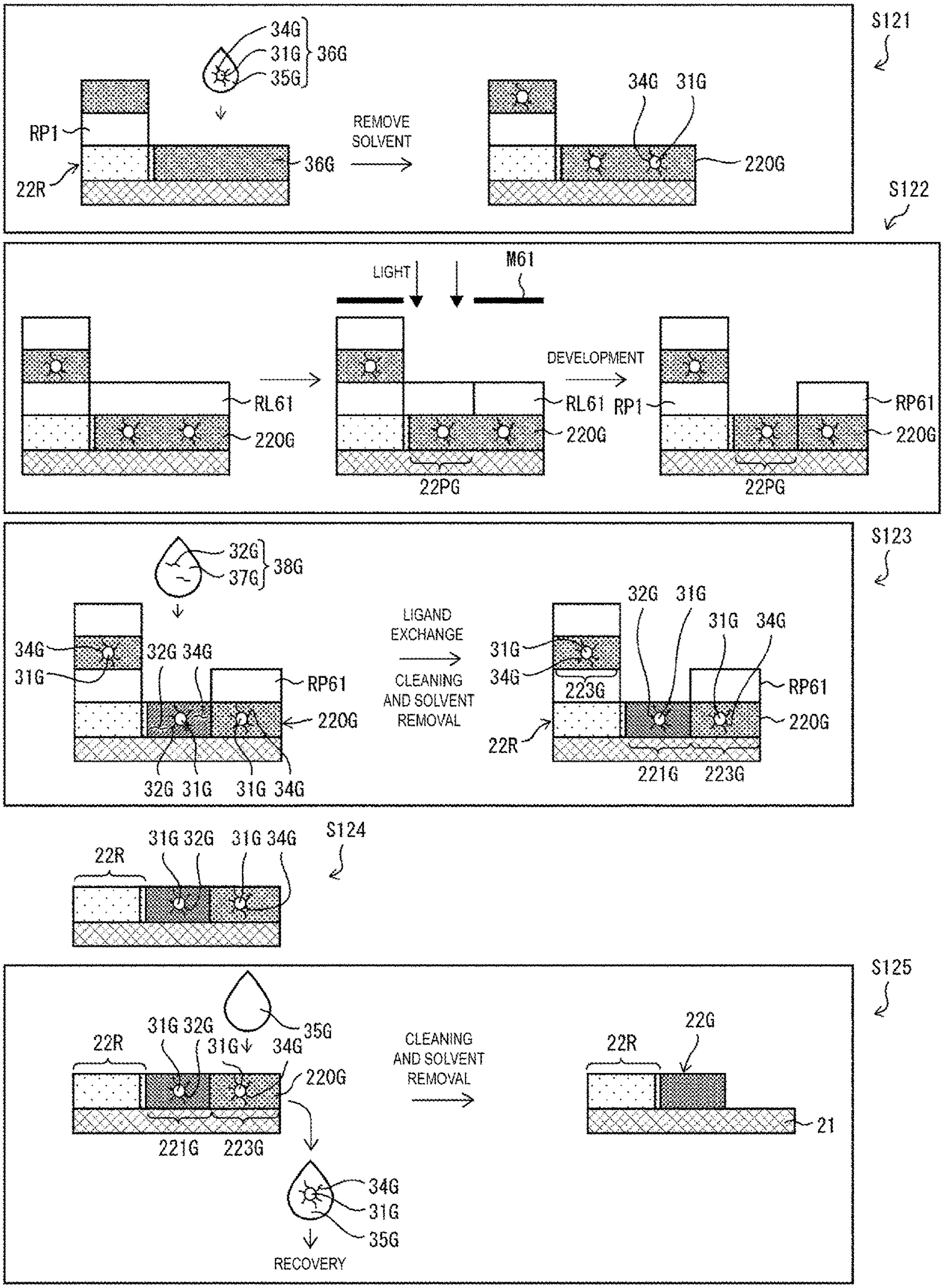
FIG. 20 is a cross-sectional view illustrating an example of processes of a part of the nanoparticle layer patterning process illustrated in FIG. 3 according to the fifth embodiment in order of the processes.
Figure 21:
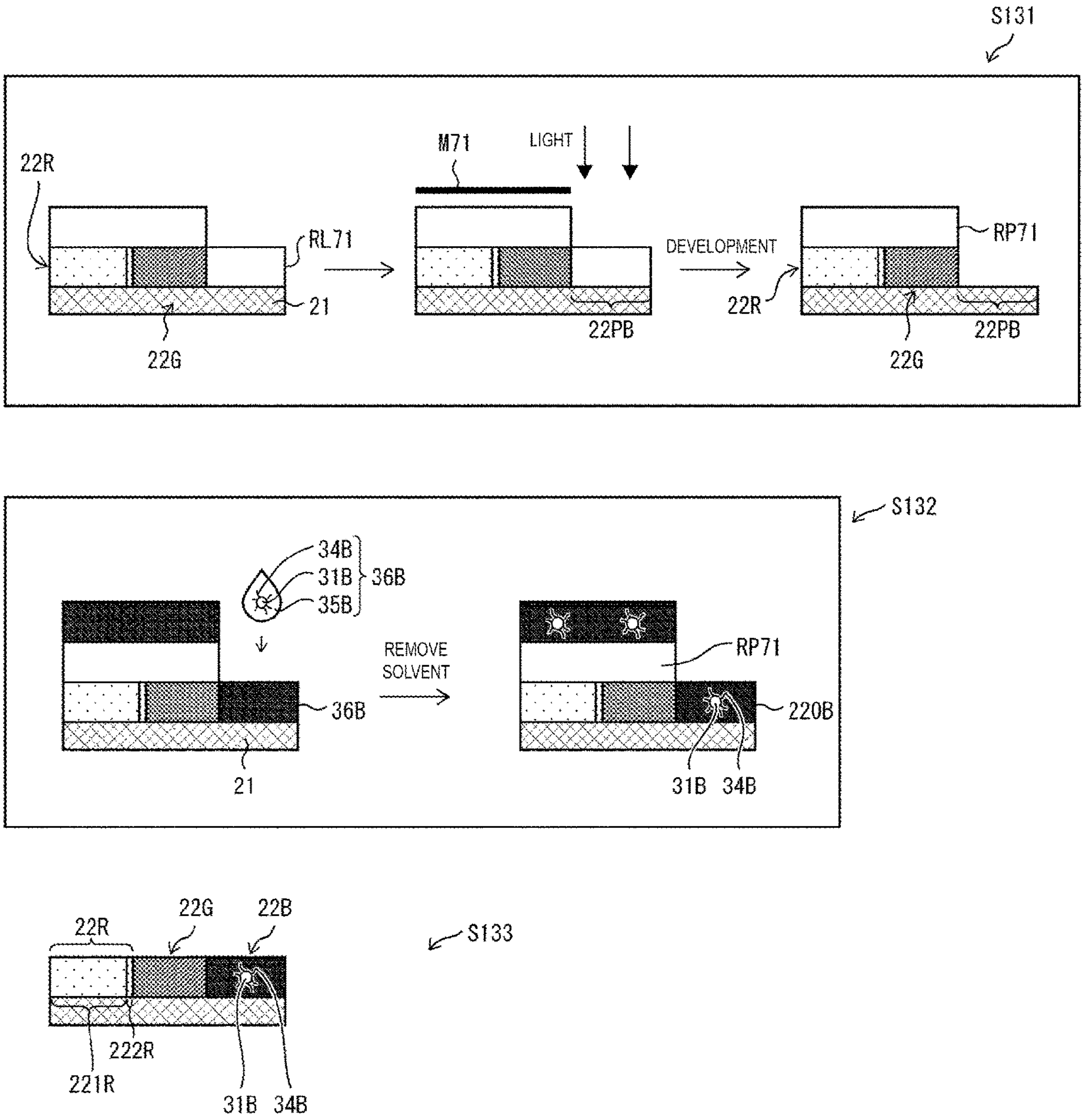
FIG. 21 is a cross-sectional view illustrating an example of processes of a part of the nanoparticle layer patterning process illustrated in FIG. 3 according to the fifth embodiment in order of the processes.

Each of FIG. 20, and FIG. 21 is cross-sectional views illustrating an example of processes of a part of step S24 illustrated in FIG. 3 according to the present embodiment in order of the processes. FIG. 20 is cross-sectional views each illustrating processes subsequent to step S34 illustrated in FIG. 5 in step S24, and illustrates a method for forming the EML 22G by using the method combining the second method and the lift-off method. FIG. 21 is cross-sectional views each illustrating processes subsequent to step S125 illustrated in FIG. 20 in step S24, and illustrates a method for forming the EML 22B by using the lift-off method.

FIG. 20 and FIG. 21 illustrate a portion P4 surrounded by a two-dot chain line in FIG. 19 as an example. Also in FIG. 20, and FIG. 21, the QDs in the EML 22 are enlarged and the number of QDs is omitted. The EML 22R illustrated in FIG. 19 is the same as the EML 22R illustrated in FIG. 4. Also in the present embodiment, a QD film containing the same QDs is denoted by the same reference numeral regardless of the change in the ligands coordinated to the QDs.

In the present embodiment, first, steps S31 to S34 illustrated in FIG. 5 are performed. Next, in the present embodiment, as indicated by S121 in FIG. 20, in the same manner as step S101, the QD film 220G containing the QDs 31G and the ligands 34G (first ligands) is formed in a solid-like shape as the nanoparticle film on the HTL 21 where the EML 22R including the layered resist pattern PR1 is formed (step S121, QD film forming process).

Next, as indicated by S122 in FIG. 20, in the same manner as step S102, a resist pattern RP61 is formed instead of the resist pattern RP41 on a part of the HTL 21 where the QD film 220G is formed so that only the green EML formation scheduled region 22PG is exposed (step S122, resist patterning process).

That is, in step S122, a resist layer RL61 is formed in a solid-like shape on the HTL 21 where the QD film 220G is formed so as to cover the QD film 220G. Next, the resist layer RL61 is exposed using a mask M61 that exposes only the resist layer RL61 of the green EML formation scheduled region 22PG. Next, the resist layer RL61 is developed with a developing solution. As a result, the resist pattern RP61 made of the resist layer RL61 is formed only in a portion other than the green EML formation scheduled region 22PG.

Next, as indicated by S123 in FIG. 20, in the same manner as step S103, the non-dispersive ligand-containing portion 221G and the non-dispersive ligand-free portion 223G are formed in the QD film 220G (step S123, non-dispersive ligand supplying process, non-dispersive ligand substituting process).

For this purpose, in step S123, first, the ligand dispersion 38G (dispersive ligand dispersion) containing the ligands 32G and the solvent 37G is supplied to and brought into contact with a portion of the QD film 220G not covered with the resist pattern RP61.

As a result, the ligands 34G coordinated to the QDs 31G in the QD film 220G in the portion not covered with the resist pattern RP61 are subjected to the ligand exchange with the ligands 32G. Thereafter, for example, a sufficient amount of the solvent 37G is supplied as a rinse liquid to the QD film 220G in the green EML formation scheduled region 22PG to clean the QD film 220G, and the unnecessary rinse liquid contained in the QD film 220G is removed by heating and drying or the like if necessary.

As a result, the non-dispersive ligand-containing portion 221G is formed in the green EML formation scheduled region 22PG in the QD film 220G, and the non-dispersive ligand-free portion 223G is formed in a portion of the QD film 220G other than the green EML formation scheduled region 22PG.

Next, as indicated by S124 in FIG. 20, the non-dispersive ligand-free portion 223G on the resist pattern RP61 is removed by the lift-off, and the resist pattern RP61 in the blue EML formation scheduled region 22PB is removed (step S124, lift-off process).

Next, as indicated by S125 in FIG. 20, the QDs 31G to which the ligands 34G are coordinated in the non-dispersive ligand-free portion 223G is removed by dispersing the QDs 31G in, for example, the solvent 35G serving as the organic solvent (first organic solvent) capable of dispersing the QDs 31G. As a result, the non-dispersive ligand-free portion 223G is removed by the solvent 35G (step S125, non-dispersive ligand-free portion removing process).

As a result, the EML 22G including the non-dispersive ligand-containing portion 221G is formed on the HTL21 as a QD layer pattern (nanoparticle layer pattern) obtained by patterning the QD film 220G.

In the present embodiment, the QDs 31G contained in the QD film 220G removed by the lift-off in step S124 cannot be reused. However, the QDs 31G contained in the non-dispersive ligand-free portion 223G (in other words, the portion of the QD film 220G other than the non-dispersive ligand-containing portion 221G), which are removed by the solvent 35G in step S125, are less deteriorated and can be reused. Thus, in the present embodiment, it is preferable that a recovering process of recovering the QDs 31R removed in step S125 is performed together with step S125.

Next, in the present embodiment, as indicated by S131 in FIG. 21, in the same manner as step S51, a resist pattern RP71 is formed instead of the resist pattern RP3 on a part of the HTL 21 where the EML 22R and the EML 22G are formed so that only the blue EML formation scheduled region 22PB is exposed (step S131, resist patterning process).

That is, in step S131, a resist layer RL71 is formed in a solid-like shape on the HTL 21 where the EML 22R and the EML 22G are formed so as to cover the EML 22R and the EML 22G. Next, the resist layer RL71 is exposed using a mask M71 that exposes only the resist layer RL71 of the blue EML formation scheduled region 22PB. Next, the resist layer RL71 is developed with a developing solution. As a result, the resist pattern RP71 made of the resist layer RL71 is formed only in a portion other than the blue EML formation scheduled region 22PB.

Next, as indicated by S132 in FIG. 21, in the same manner as step S52, the QD film 220B containing the QDs 31B and the ligands 34B is formed in a solid-like shape as the nanoparticle film on the HTL 21 (step S132, QD film forming process).

Next, as indicated by S133 in FIG. 21, the QD film 220B on the resist pattern RP71 is removed by lift-off using a resist solvent (step S133, lift-off process). As a result, the EML 22B obtained by patterning the QD film 220B is formed on the HTL 21.

Through the above processes, the EML 22R, the EML 22G, and the EML 22B illustrated in FIG. 19 can be formed.

In the present embodiment, the same advantageous effects as in the first embodiment can be obtained using the first method for forming the EML 22R. In the present embodiment, the same advantageous effects as in the third embodiment can be obtained using the second method for forming the EML 22G.

In the present embodiment, the QDs 31G removed in step S124 cannot be reused, but some of the QDs 31G removed in step S125 can be reused. Thus, the removed QDs 31R can be recovered and reused, and some of the removed QDs 31G can be recovered and reused.

In addition, also in the present embodiment, the nanoparticle layer patterned previously is insolubilized in a solvent before the formation of the nanoparticle layer patterned later thus having high solvent resistance. Thus, the nanoparticle layer patterned previously is not damaged by repeating the formation of the nanoparticle layer pattern.

Thus, according to the present embodiment, a nanoparticle film patterning method capable of recovering and reusing some of the removed nanoparticles with less deterioration and forming a nanoparticle layer pattern with less deterioration, and a method for manufacturing a light-emitting element, a method for manufacturing a display device, and a light-emitting element using the same can be provided.

Sixth Embodiment

In the following, description regarding differences from the previous embodiments will be described.

Figure 22:
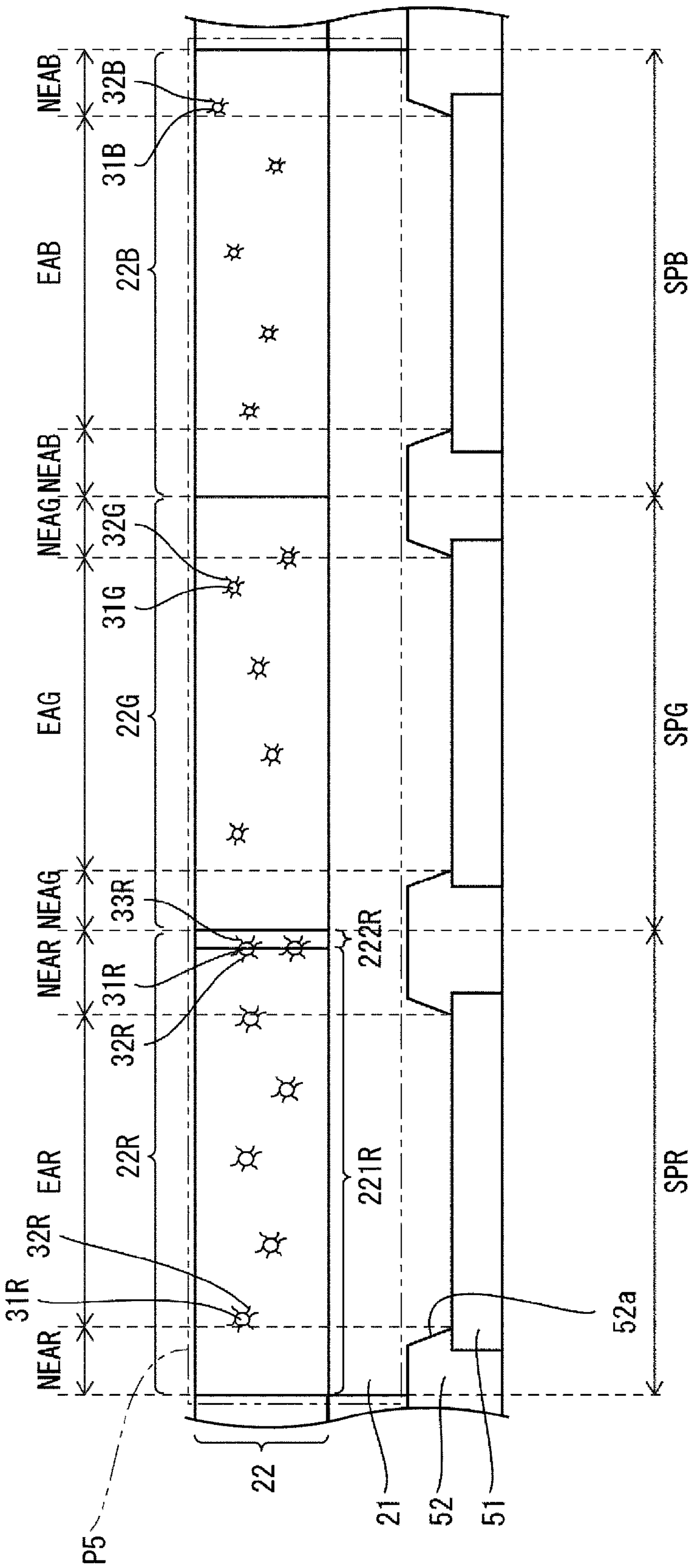
FIG. 22 is a cross-sectional view schematically illustrating an overall configuration of the main portions of the display device according to a sixth embodiment.

FIG. 22 is a cross-sectional view schematically illustrating an overall configuration of the main portions of the display device 1 according to the present embodiment. Also in FIG. 22, the QDs in the EML 22 are enlarged and the number of QDs is omitted.

As illustrated in FIG. 22, in the display device 1 according to the present embodiment, the EML 22R includes the non-dispersive ligand-containing portion 221R containing the ligands 32R (non-dispersive ligands) as the ligands and the dispersive ligand-containing portion 222R containing the ligands 33R (dispersive ligands) as the ligands. The EML 22G is made of only the non-dispersive ligand-containing portion 221G, and the entirety thereof contains the QDs 31G and the ligands 32G. The EML 22B is made of only the non-dispersive ligand-containing portion 221B, and the entirety thereof contains the QDs 31B and the ligands 32B.

As illustrated in FIG. 22, the display device 1 according to the present embodiment has the same configuration as the display device 1 according to the first to the fifth embodiments except for this point.

In the following, a forming process of the EML 22 according to the present embodiment will be described with reference to FIG. 5, FIG. 20, and FIG. 23.

In the first embodiment, after the EML 22R is formed using the first method, the EML 22G is formed using the method combing the second method and the lift-off method, and then the EML 22B is formed by the second method.

Figure 23:
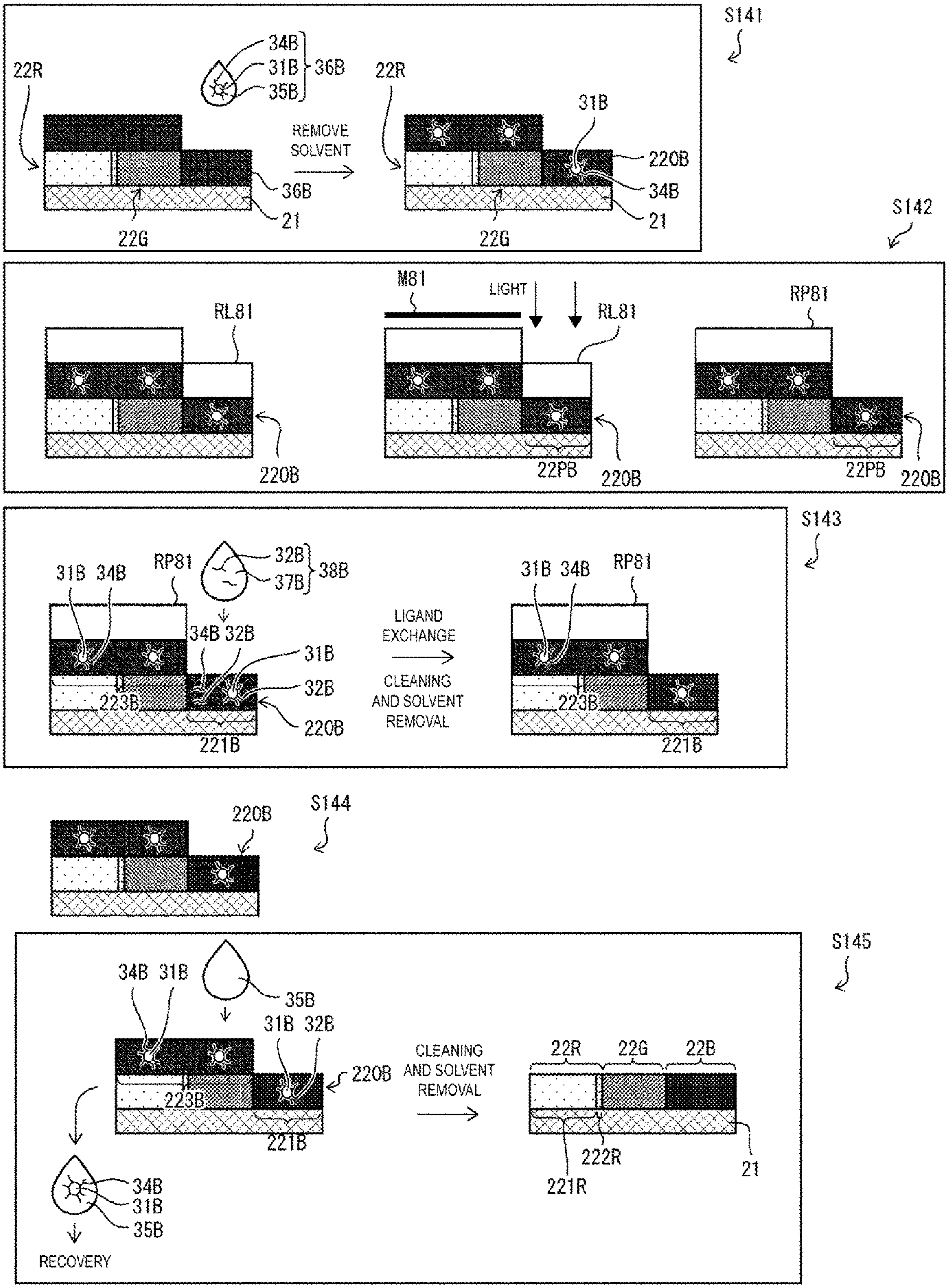
FIG. 23 is a cross-sectional view illustrating an example of processes of a part of the nanoparticle layer patterning process illustrated in FIG. 3 according to the sixth embodiment in order of the processes.

FIG. 23 is cross-sectional views each illustrating an example of processes of a part of step S24 illustrated in FIG. 3 according to the present example in order of the processes. FIG. 23 is cross-sectional views each illustrating processes subsequent to step S125 illustrated in FIG. 20 in step S24, and illustrates a method for forming the EML 22B by using the second method.

FIG. 23 also illustrates a portion P5 surrounded by a two-dot chain line in FIG. 22 as an example. Also in FIG. 23, the QDs in the EML 22 are enlarged and the number of QDs is omitted. The EML 22R illustrated in FIG. 22 is the same as the EML 22R illustrated in FIG. 4 and FIG. 19. The EML 22G illustrated in FIG. 22 is the same as the EML 22G illustrated in FIG. 19. Also in the present embodiment, a QD film containing the same QDs is denoted by the same reference numeral regardless of the change in the ligands coordinated to the QDs.

In the present embodiment, first, steps S31 to S34 illustrated in FIG. 5 are performed. Next, step S121 to step S125 illustrated in FIG. 20 are performed. Thereafter, in the present embodiment, as indicated by S141 in FIG. 23, in the same manner as step S111, the QD film 220B containing the QDs 31B and the ligands 34B (first ligands) is formed in a solid-like shape as the nanoparticle film on the HTL 21 where the EML 22R and the EML 22G are formed (step S141, QD film forming process).

Next, as indicated by S142 in FIG. 23, in the same manner as step S112, a resist pattern RP81 is formed instead of the resist pattern RP51 on a part of the HTL 21 where the QD film 220B is formed so that only the blue EML formation scheduled region 22PB is exposed (step S142, resist patterning process).

That is, in step S142, a resist layer RL81 is formed in a solid-like shape on the HTL 21 where the QD film 220B is formed so as to cover the QD film 220B. Next, the resist layer RL81 is exposed using a mask M81 that exposes only the resist layer RL81 of the blue EML formation scheduled region 22PB. Next, the resist layer RL81 is developed with a developing solution. As a result, the resist pattern RP81 made of the resist layer RL81 is formed only in a portion other than the blue EML formation scheduled region 22PB.

Next, as indicated by S143 in FIG. 23, in the same manner as step S113, the non-dispersive ligand-containing portion 221B and the non-dispersive ligand-free portion 223B are formed in the QD film 220B (step S143, non-dispersive ligand supplying process, non-dispersive ligand substituting process).

That is, in step S143, first, the ligand dispersion 38B (dispersive ligand dispersion) containing the ligands 32B and the solvent 37B is supplied to and brought into contact with a portion of the QD film 220B not covered with the resist pattern RP81.

As a result, the ligands 34B coordinated to the QDs 31B in the QD film 220B in the portion not covered with the resist pattern RP81 are subjected to the ligand exchange with the ligands 32B. Thereafter, for example, a sufficient amount of the solvent 37B is supplied as a rinse liquid to the QD film 220B in the blue EML formation scheduled region 22PB to clean the QD film 220B, and the unnecessary rinse liquid contained in the QD film 220B is removed by heating and drying or the like if necessary.

As a result, the non-dispersive ligand-containing portion 221B is formed in the blue EML formation scheduled region 22PB in the QD film 220B, and the non-dispersive ligand-free portion 223B is formed in a portion of the QD film 220B other than the blue EML formation scheduled region 22PB.

Next, as indicated by S143 in FIG. 23, the resist pattern RP81 is peeled by, for example, a resist solvent to remove the resist pattern RP81 (step S143, resist pattern removing process).

Next, as indicated by S144 in FIG. 23, the QDs 31B to which the ligands 34B are coordinated in the non-dispersive ligand-free portion 223B is removed by dispersing the QDs 31B in, for example, the solvent 35B serving as the organic solvent (first organic solvent) capable of dispersing the QDs 31B. As a result, the non-dispersive ligand-free portion 223B is removed by the solvent 35B (step S144, non-dispersive ligand-free portion removing process).

As a result, the EML 22B including the non-dispersive ligand-containing portion 221B is formed on the HTL21 as a QD layer pattern (nanoparticle layer pattern) obtained by patterning the QD film 220B.

Note that the QDs 31B contained in the non-dispersive ligand-free portion 223B (in other words, the portion of the QD film 220B other than the non-dispersive ligand-containing portion 221*i*), which are removed by the solvent 35B in step S145, are less deteriorated and can be reused. Thus, in the present embodiment, it is preferable that a recovering process of recovering the QDs 31B is performed together with step S145.

Through the above processes, the EML 22R, the EML 22G, and the EML 22B illustrated in FIG. 22 can be formed.

In the present embodiment, the same advantageous effects as in the sixth embodiment can be obtained in forming the EML 22R and the EML 22G. In the present embodiment, in step S145, the QDs 31B can be recovered in a state in which deterioration of the QDs 31B is suppressed. Thus, according to the present embodiment, in addition to some of the QDs 31R and the QDs 31G, the QDs 31B can be recovered and reused with less deterioration, and the EML 22R, the EML 22G, and the EML 22B with less deterioration can be formed.

Seventh Embodiment

In the following, description regarding differences from the previous embodiments will be described.

Note that a cross-sectional view illustrating the schematic configuration of the main portions of the display device 1 according to the present embodiment is the same as FIG. 22. Thus, in the present embodiment, the illustration of the cross-sectional view and the description of the display device 1 are omitted.

In the present embodiment, the forming process of the EML 22 illustrated in FIG. 22 will be described below with reference to FIG. 5, FIG. 23 and FIG. 24.

In the first embodiment, after the EML 22R is formed using the first method, the EML 22G and the EML 22B are formed in this order using the second method.

Figure 24:
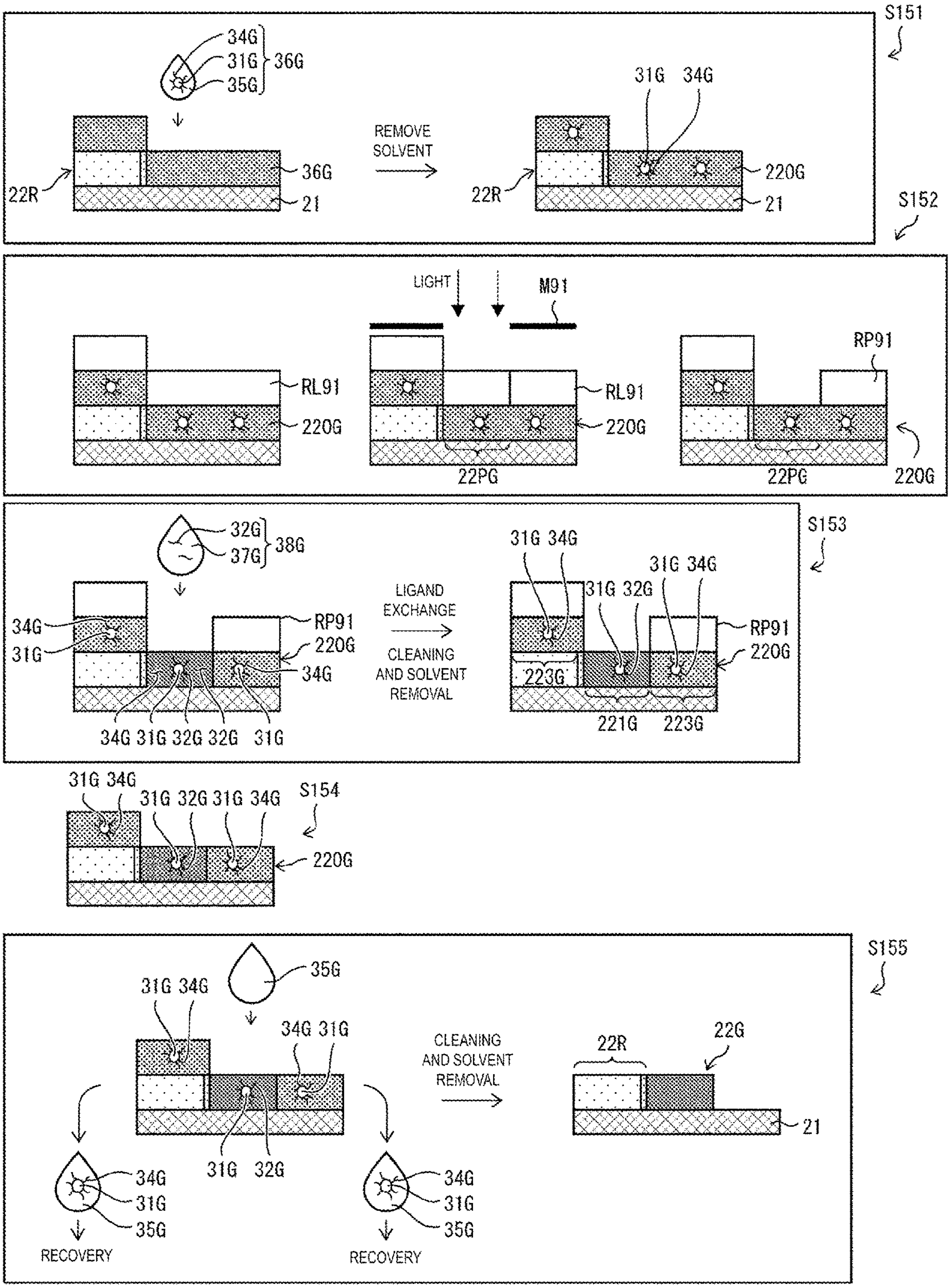
FIG. 24 is a cross-sectional view illustrating an example of processes of a part of the nanoparticle layer patterning process illustrated in FIG. 3 according to a seventh embodiment in order of the processes.

FIG. 24 is cross-sectional views each illustrating an example of processes of a part of step S24 illustrated in FIG. 3 according to the present example in order of the processes. FIG. 17 is cross-sectional views each illustrating processes subsequent to step S35 illustrated in FIG. 5 in step S24, and illustrates a method for forming the EML 22G by using the second method. FIG. 24 also illustrates a portion P5 surrounded by a two-dot chain line in FIG. 22 as an example. Also in FIG. 24, the QDs in the EML 22 are enlarged and the number of QDs is omitted. Also in the present embodiment, a QD film containing the same QDs is denoted by the same reference numeral regardless of the change in the ligands coordinated to the QDs.

In the present embodiment, first, steps S31 to S34 illustrated in FIG. 5 are performed. Next, in the present embodiment, as indicated by S151 in FIG. 24, in the same manner as step S101, the QD film 220G containing the QDs 31G and the ligands 34G (first ligands) is formed in a solid-like shape as the nanoparticle film on the HTL 21 where the EML 22R is formed (step S151, QD film forming process).

Next, as indicated by S152 in FIG. 24, in the same manner as step S102, a resist pattern RP91 is formed instead of the resist pattern RP41 on a part of the HTL 21 where the QD film 220G is formed so that only the green EML formation scheduled region 22PG is exposed (step S152, resist patterning process).

That is, in step S152, a resist layer RL91 is formed in a solid-like shape on the HTL 21 where the QD film 220G is formed so as to cover the QD film 220G. Next, the resist layer RL91 is exposed using a mask M91 that exposes only the resist layer RL91 of the green EML formation scheduled region 22PG. Next, the resist layer RL91 is developed with a developing solution. As a result, the resist pattern RP91 made of the resist layer RL91 is formed only in a portion other than the green EML formation scheduled region 22PG.

Next, as indicated by S153 in FIG. 24, in the same manner as step S103, the non-dispersive ligand-containing portion 221G and the non-dispersive ligand-free portion 223G are formed in the QD film 220G (step S153, non-dispersive ligand supplying process, non-dispersive ligand substituting process).

That is, in step S153, first, the ligand dispersion 38G (dispersive ligand dispersion) containing the ligands 32G and the solvent 37G is supplied to and brought into contact with a portion of the QD film 220G not covered with the resist pattern RP91.

As a result, the ligands 34G coordinated to the QDs 31G in the QD film 220G in the portion not covered with the resist pattern RP91 are subjected to the ligand exchange with the ligands 32G. Thereafter, for example, a sufficient amount of the solvent 37G is supplied as a rinse liquid to the QD film 220G in the green EML formation scheduled region 22PG to clean the QD film 220G, and the unnecessary rinse liquid contained in the QD film 220G is removed by heating and drying or the like if necessary.

As a result, the non-dispersive ligand-containing portion 221G is formed in the green EML formation scheduled region 22PG in the QD film 220G, and the non-dispersive ligand-free portion 223G is formed in a portion of the QD film 220G other than the green EML formation scheduled region 22PG.

Next, as indicated by S154 in FIG. 24, in the same manner as step S104, the resist pattern RP91 is peeled by, for example, a resist solvent to remove the resist pattern RP91 (step S154, resist pattern removing process).

Next, as indicated by S155 in FIG. 24, in the same manner as step S105, the QDs 31G to which the ligands 34G are coordinated in the non-dispersive ligand-free portion 223G is removed by dispersing the QDs 31G in, for example, the solvent 35G serving as the organic solvent (first organic solvent) capable of dispersing the QDs 31G. As a result, the non-dispersive ligand-free portion 223G is removed by the solvent 35G (step S155, non-dispersive ligand-free portion removing process).

As a result, the EML 22G including the non-dispersive ligand-containing portion 221G is formed on the HTL21 as a QD layer pattern (nanoparticle layer pattern) obtained by patterning the QD film 220G.

Note that the QDs 31G contained in the non-dispersive ligand-free portion 223G (in other words, the portion of the QD film 220G other than the non-dispersive ligand-containing portion 221G), which are removed by the solvent 35G in step S155, are less deteriorated and can be reused. Thus, in the present embodiment, it is preferable that a recovering process of recovering the QDs 31G is performed together with step S155.

Thereafter, step S141 to step S145 illustrated in FIG. 23 are performed.

Through the above processes, the EML 22R, the EML 22G, and the EML 22B illustrated in FIG. 22 can be formed.

In the present embodiment, the same advantageous effects as in the seventh embodiment can be obtained in forming the EML 22R and the EML 22B. In the present embodiment, unlike the sixth embodiment and the seventh embodiment, the removal of the QD film 220G is collectively performed in step S155. At this time, the QDs 31G can be recovered in a state in which deterioration of the QDs 31G is suppressed. Thus, according to the present embodiment, all of the QDs 31R, the QDs 31G, and the QDs 31G can be recovered and reused with less deterioration, and the EML 22R, the EML 22G, and the EML 22B with less deterioration can be formed.

Thus, also in the present embodiment, the nanoparticle film patterning method capable of recovering and reusing all of the removed nanoparticles with less deterioration and forming a nanoparticle layer pattern with less deterioration, and a method for manufacturing a light-emitting element, a method for manufacturing a display device, and a light-emitting element using the same can be provided.

Eighth Embodiment

In the following, description regarding differences from the previous embodiments will be described.

In the first, second, fifth to seventh embodiments, the case is described as an example in which, for example, the QD film 220R is patterned using the first method, and the non-dispersive ligand supplying process is the non-dispersive ligand substituting process of substituting the ligands 34R contained in the QD film 220R with the ligands 32R. However, the first method is not limited thereto.

Hereinafter, a case will be described as an example in which in the non-dispersive ligand supplying process in the first method, the non-dispersive ligands are supplied to the nanoparticles contained in the nanoparticle film, and thus the non-dispersive ligands are applied to the nanoparticles.

Figure 25:
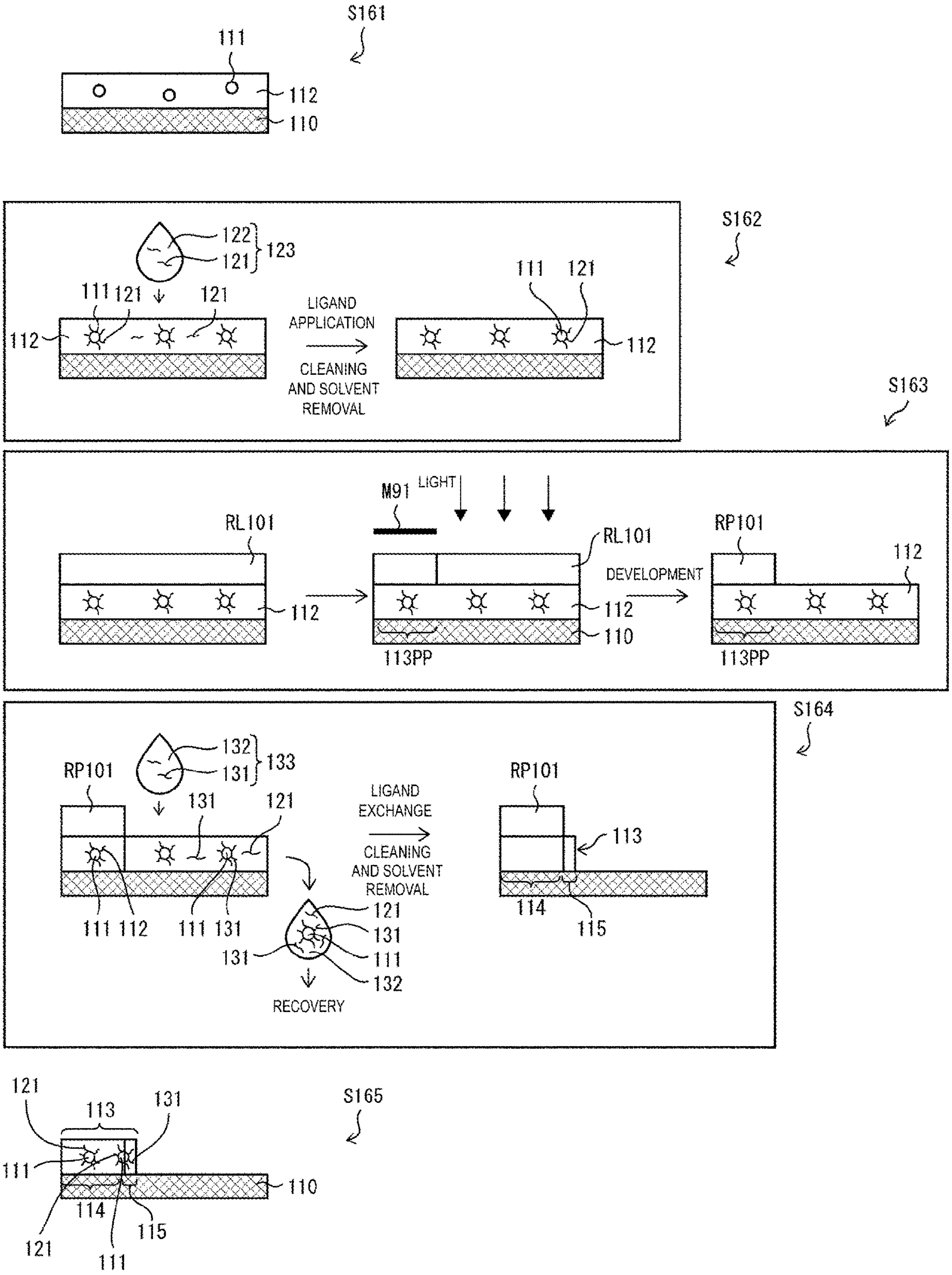
FIG. 25 is a cross-sectional view illustrating an example of a nanoparticle film patterning method according to an eighth embodiment.

FIG. 25 is a cross-sectional view illustrating an example of a nanoparticle film patterning method according to the present embodiment. In the following, as illustrated in FIG. 25, a method for forming a nanoparticle layer 113 as a nanoparticle layer pattern containing nanoparticles 111 by patterning a nanoparticle film 112 containing the nanoparticles 111 will be described. Also in the following, a nanoparticle film containing the same nanoparticles is denoted by the same reference numeral regardless of the change in the ligands coordinated to the nanoparticles. In FIG. 25, the nanoparticles 111 in the nanoparticle film 112 and the nanoparticle layer 113 are enlarged and the number thereof is omitted.

The nanoparticles 111 may be, for example, the QDs or may be the inorganic nanoparticles having carrier transport properties. Examples of the inorganic nanoparticles having carrier transport properties include the p-type semiconductor materials and the n-type semiconductor materials exemplified in the first embodiment. Thus, the nanoparticle layer 113 may be the light-emitting layer of the light-emitting element, a QD layer of a photoelectric conversion element such as a solar cell, or the HTL 21 or the ETL 23 of the light-emitting element.

In the present embodiment, various conditions such as the concentration of the nanoparticles in the nanoparticle dispersion, the applying method of the nanoparticle dispersion, the drying temperature and the drying time of the coating film, the concentration of the ligands with respect to the solvent in the ligand dispersion, the supply amount of the ligands, the ligand exchange temperature, the layer thickness of the resist layer, the UV irradiation intensity, the type and concentration of the developing solution, the resist solvent and the like may be set similarly to the above-described embodiments regardless of the type of the nanoparticles, type of the ligands, the type of the solvent and the like, and are not particularly limited. Thus, in the present embodiment, only the flow of processing will be described, and the description of these conditions will be omitted. Also in the present embodiment, a case will be illustrated as an example in which the positive-working photoresist is used as the resist material constituting the resist layer, but it goes without saying that the negative-working photoresist may be used as the resist material.

When the first method is used for forming the nanoparticle layer 113, first, as indicated by S161 in FIG. 25, the nanoparticle film 112 containing the nanoparticles 111 is formed in a solid-like shape on a support body 110 serving as an underlayer (support layer) of the nanoparticle layer 113 (step S161, nanoparticle film forming process).

For this purpose, in step S161, first, for example, the nanoparticle film 112 in a solid-like shape made of the nanoparticles 111 is formed as the nanoparticle film 112 in a solid-like shape containing the nanoparticles 111 on the support body 110.

The nanoparticle film 112 can be formed, for example, by applying the nanoparticle dispersion containing the nanoparticles 111 and a solvent to the support body 110 in a solid-like shape, and then removing the solvent contained in the coating film made of the nanoparticle dispersion applied to the support body 110, and drying the coating film.

Next, as indicated by S162 in FIG. 25, ligand dispersion 123 (non-dispersive ligand dispersion) containing an excess amount of the ligands 121 (non-dispersive ligands) and a solvent 122 (second organic solvent) with respect to the nanoparticles 111 is supplied to the entire nanoparticle film 112. As a result, the ligands 121 are coordinated to the nanoparticles 111 in the nanoparticle film 112. In other words, the ligands 121 are applied to the nanoparticles 111 in the nanoparticle film 112 (step S162, non-dispersive ligand supplying process, non-dispersive ligand applying step).

The ligands 121 are the non-dispersive ligands, and coordinated to the nanoparticles 111 to significantly reduce the dispersibility of the nanoparticles 111 in any solvent to render the nanoparticles 111 non-dispersible in the solvent.

As the ligands 121, monodentate ligands similar to the ligands 32R, the ligands 32G, or the ligands 32B can be used.

The solvent 122 is not particularly limited as long as the ligands 121 as simple substances are dispersible in the solvent and the nanoparticles 111 as simple substances are non-dispersible in the solvent. Here, “ligands 121 as simple substances” refers to the ligands 121 not coordinated to the nanoparticles 111. In addition, “nanoparticles 111 as simple substances” refers to the nanoparticles 111 to which no ligand is coordinated. As the solvent 122, for example, a solvent having a polarity opposite to that of the solvent used for applying the nanoparticles 111 is used so that the nanoparticles 111 contained in the nanoparticle film 112 before the ligands are applied will not be dispersed by the supply of the ligand dispersion 123 and the nanoparticle film 112 will not be removed.

The nanoparticle film 112 after the supply of the ligand dispersion 123 contains the nanoparticles 111 to which the ligands 121 are coordinated and the excess ligands 121 that are not coordinated to the nanoparticles 111. “Excess ligands 121 that are not coordinated to the nanoparticles 111” refers to free ligands 121 that are not coordinated to the nanoparticles 111.

Next, for example, a sufficient amount of the solvent 122 is supplied as a rinse liquid to the nanoparticle film 112 to clean the nanoparticle film 112. This cleaning allows the free ligands 121 contained in the nanoparticle film 112 to be removed.

Next, the unnecessary rinse liquid contained in the nanoparticle film 112 is removed by heating and drying or the like, if necessary. As a result, the nanoparticle film 112 containing the nanoparticles 111 and the ligands 121 coordinated to the nanoparticles can be obtained.

Next, as indicated by S163 in FIG. 25, a resist pattern RP101 is formed on a part of the nanoparticle film 112 so as to cover the nanoparticle film 112 after the ligands are applied in a nanoparticle layer patterning scheduled region 113PP (step S163, resist patterning process). Here, nanoparticle layer patterning scheduled region 113PP refers to a formation scheduled region of the nanoparticle layer 113 at the design stage, and refers to a region where the non-dispersive ligand-containing portion 114 described later is to be finally formed in the present embodiment liquid.

For this purpose, in step S163, first, a resist layer RL101 covering the nanoparticle film 112 is formed in a solid-like shape on the nanoparticle film 112. Next, the resist layer RL101 is exposed using a mask M101 that exposes the resist layer RL101 other than the nanoparticle layer patterning scheduled region 113PP. Next, the resist layer RL101 is developed with a developing solution. As a result, the resist pattern RP101 made of the resist layer RL101 is formed only in the nanoparticle layer patterning scheduled region 113PP.

Next, as indicated by S164 in FIG. 25, a ligand dispersion 133 (dispersive ligand dispersion) containing the ligands 131 and a solvent 132 (first organic solvent) is supplied to and brought into contact with a portion of the nanoparticle film 112 not covered with the resist pattern RP101. As a result, the ligands 121 coordinated to the nanoparticles 111 in the portion of the nanoparticle film 112 not covered with the resist pattern RP101 are subjected to the ligand exchange with the ligands 131.

The ligands 131 are dispersive ligands that are coordinated to the nanoparticles 111 to disperse the nanoparticles 111 in any one of the organic solvents of the polar organic solvent and the non-polar organic solvent. The ligand 131G are not particularly limited as long as the ligands 131G are ligands capable of dispersing the nanoparticles 111 to which the ligands 131G are coordinated in any one of the organic solvents described above. The ligands 131G may be the non-polar ligands and may be the polar ligands. When the ligands 131 are the non-polar ligands, the non-polar organic solvent is used as the solvent 132. When the ligands 131 are the polar ligands, the polar organic solvent is used as the solvent 132.

Thus, when the ligand dispersion 133 is brought into contact with the portion of the nanoparticle film 112 not covered with the resist pattern RP101, the nanoparticles 111 to which the ligands 131 are coordinated by the ligand exchange are dispersed in the solvent 132. As a result, in the portion of the nanoparticle film 112 not covered with the resist pattern RP101, a portion other than a boundary surface between the portion covered with the resist pattern RP101 and the portion not covered with the resist pattern RP101 is removed by the solvent 132 in association with the ligand exchange. Next, by removing and drying the solvent 132, the non-dispersive ligand-containing portion 114 containing the nanoparticles 111 to which the ligands 121 are coordinated, which remains without being removed by the solvent 132, is formed in the portion covered with the resist pattern RP101 (the nanoparticle layer patterning scheduled region 113PP) (step S164, the dispersive ligand substituting process).

Similarly to the first embodiment, the nanoparticles removed in the dispersive ligand substituting process are less deteriorated and can be reused. Thus, also in the present embodiment, it is preferable that the recovery step of recovering the nanoparticles 111 removed in step S164 is performed together with step S164.

In addition, also in the present embodiment, in order to disperse the nanoparticles to which only the dispersive ligands are coordinated in the solvent and remove the nanoparticles, after supplying the ligand dispersion 133, the solvent 132 may be supplied as a rinse liquid to further perform cleaning, and then the solvent 132 may be removed (dried).

Next, as indicated by S165 in FIG. 25, the resist pattern RP101 covering the non-dispersive ligand-containing portion 114 is peeled by, for example, a resist solvent to remove the resist pattern RP101 (step S165, resist pattern removing process). As a result, the patterning of the nanoparticle film 112 is completed.

Also in the present embodiment, by using the first method, at the boundary surface between the portion covered with the resist pattern RP101 and the portion not covered with the resist pattern RP101 of the nanoparticle film 112, the nanoparticles 111 having a low substitution rate of the ligands 121 coordinated to the nanoparticles 111 remain without being dispersed in the solvent 132. Thus, in a part of an outer edge portion of the non-dispersive ligand-containing portion 114 a dispersive ligand-containing portion 115 containing the ligands 131 coordinated to the nanoparticles 111 and thinner than the non-dispersive ligand-containing portion 114 is formed adjacent to the non-dispersive ligand-containing portion 114.

As a result, the nanoparticle layer 113 including the non-dispersive ligand-containing portion 114 and the dispersive ligand-containing portion 115 is formed as a nanoparticle layer pattern obtained by patterning the nanoparticle film 112 on the support body 110.

As described above, the non-dispersive ligand-containing portion 114 contains the nanoparticles 111 to which the ligands 121 are coordinated. In other words, the non-dispersive ligand-containing portion 114 contains the nanoparticles 111 and the ligands 121 coordinated to the nanoparticles 111. On the other hand, the dispersive ligand-containing portion 115 contains at least ligands 131 among the nanoparticles 111 and the ligands 131. The ligands 131 are coordinated to the nanoparticles 111 to which the ligands 121 are coordinated. As long as the ligands 131 and the ligands 121 are coordinated to the nanoparticles 111, the nanoparticles 111 to which the ligands 131 are coordinated themselves (that is, the nanoparticles 111 themselves) may be located in the non-dispersive ligand-containing portion 114 or may be located in the dispersive ligand-containing portion 115. Thus, in an extreme case, the dispersive ligand-containing portion 115 may be made of only the ligands 131. As described above, in a part of the outer edge portion of the non-dispersive ligand-containing portion 114, the dispersive ligand-containing portion 115 is formed adjacent to the non-dispersive ligand-containing portion 114 and is formed thinner than the non-dispersive ligand-containing portion 114.

Note that the fact that the nanoparticle film 112 includes the above-described dispersive ligand-containing portion 115 is evidence that the first method has been used for forming the nanoparticle film 112.

According to the present embodiment, advantageous effects similar to those of the first embodiment can be obtained.

Ninth Embodiment

In the following, description regarding differences from the previous embodiments will be described.

In the present embodiment, a case will be described as an example in which in the non-dispersive ligand supplying process in the second method, the non-dispersive ligands are supplied to the nanoparticles contained in the nanoparticle film, and thus the non-dispersive ligands are applied to the nanoparticles.

Figure 26:
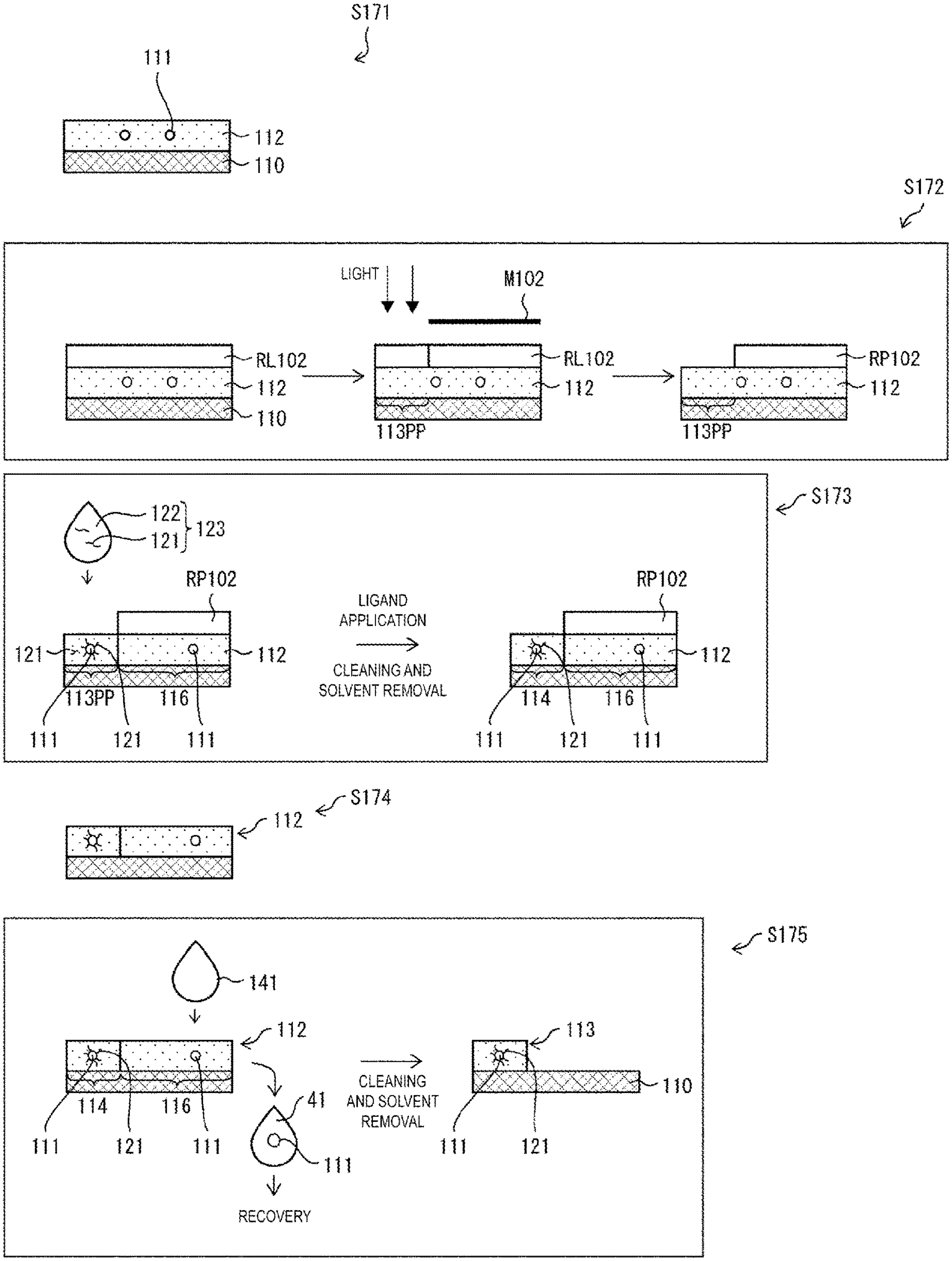
FIG. 26 is a cross-sectional view illustrating an example of a nanoparticle film patterning method according to a ninth embodiment.

FIG. 26 is a cross-sectional view illustrating an example of a nanoparticle film patterning method according to the present embodiment. As illustrated in FIG. 26, also in the present embodiment, similarly to the eighth embodiment, a method for forming a nanoparticle layer 113 as a nanoparticle layer pattern containing nanoparticles 111 by patterning a nanoparticle film 112 containing the nanoparticles 111 will be described. Also in the following, a nanoparticle film containing the same nanoparticles is denoted by the same reference numeral regardless of the change in the ligands coordinated to the nanoparticles. In FIG. 26, the nanoparticles 111 in the nanoparticle film 112 and the nanoparticle layer 113 are enlarged and the number thereof is omitted.

As described in the eighth embodiment, the nanoparticles 111 may be, for example, the QDs or may be the inorganic nanoparticles having carrier transport properties. Examples of the inorganic nanoparticles having carrier transport properties include the p-type semiconductor materials and the n-type semiconductor materials exemplified in the first embodiment. Thus, the nanoparticle layer 113 may be the light-emitting layer of the light-emitting element, a QD layer of a photoelectric conversion element such as a solar cell, or the HTL 21 or the ETL 23 of the light-emitting element.

Also in the present embodiment, various conditions such as the concentration of the nanoparticles in the nanoparticle dispersion, the applying method of the nanoparticle dispersion, the drying temperature and the drying time of the coating film, the concentration of the ligands with respect to the solvent in the ligand dispersion, the supply amount of the ligands, the ligand exchange temperature, the layer thickness of the resist layer, the UV irradiation intensity, the type and concentration of the developing solution, the resist solvent and the like may be set similarly to the above-described embodiments regardless of the type of the nanoparticles, type of the ligands, the type of the solvent and the like, and are not particularly limited. Thus, also in the present embodiment, only the flow of processing will be described, and the description of these conditions will be omitted. Also in the present embodiment, a case will be illustrated as an example in which the positive-working photoresist is used as the resist material constituting the resist layer, but it goes without saying that the negative-working photoresist may be used as the resist material.

When the second method is used for forming the nanoparticle layer 113, first, as indicated by S171 in FIG. 26, the nanoparticle film 112 containing the nanoparticles 111 is formed in a solid-like shape on a support body 110 serving as an underlayer (support layer) of the nanoparticle layer 113 (step S171, nanoparticle film forming process).

Note that step S171 is similar to step S161. Thus, the description thereof is omitted.

Next, as indicated by S172 in FIG. 26, a resist pattern RP102 is formed in a portion on the nanoparticle film 112 other than the nanoparticle layer patterning scheduled region 113PP (step S172, resist patterning process).

For this purpose, in step S172, first, a resist layer RL102 covering the nanoparticle film 112 is formed in a solid-like shape on the nanoparticle film 112. Next, the resist layer RL102 is exposed using a mask M102 that exposes the resist layer RL102 in the nanoparticle layer patterning scheduled region 113PP. Next, the resist layer RL102 is developed with a developing solution. As a result, the resist pattern RP102 made of the resist layer RL102 is formed on the nanoparticle film 112 other than the nanoparticle layer patterning scheduled region 113PP.

Next, as indicated by S173 in FIG. 26, the non-dispersive ligand-containing portion 114 and a non-dispersive ligand-free portion 116 are formed in the nanoparticle film 112 (step S173, non-dispersive ligand supplying process, non-dispersive ligand applying process).

Here, as described in the eighth embodiment, the non-dispersive ligand-containing portion 114 refers to the portion containing the nanoparticles 111 and the ligands 121 of the nanoparticle film 112. In the present embodiment, the non-dispersive ligand-free portion 116 refers to a portion of the nanoparticle film 112 that does not contain the ligand 121 that are the non-dispersive ligand, that is, a portion that contains only the nanoparticles 111.

For this purpose, in step S173, first, the ligand dispersion 123 (dispersive ligand dispersion) containing the ligands 121 and the solvent 122 is supplied to and brought into contact with the portion of the nanoparticle film 112 not covered with the resist pattern RP102. As a result, the ligands 121 are coordinate to the nanoparticles 111 in the portion of the nanoparticle film 112 not covered with the resist pattern RP102. In other words, the ligands 121 are applied to the nanoparticles 111.

The nanoparticle film 112 in the nanoparticle layer patterning scheduled region 113PP after the supply of the ligands contains the nanoparticles 111 to which the ligands 121 are coordinated and the excess ligands 121 that are not coordinated to the nanoparticles 111.

Next, for example, a sufficient amount of the solvent 122 is supplied as a rinse liquid to the nanoparticle film 112 in the nanoparticle layer patterning scheduled region 113PP to clean the nanoparticle film 112. Thereafter, the unnecessary rinse liquid contained in the nanoparticle film 112 is removed by heating and drying or the like, if necessary.

As a result, the non-dispersive ligand-containing portion 114 is formed in the nanoparticle layer patterning scheduled region 113PP of the nanoparticle film 112, and the non-dispersive ligand-free portion 116 is formed in a portion of the nanoparticle film 112 other than the nanoparticle layer patterning scheduled region 113PP.

Next, as indicated by S174 in FIG. 26, the resist pattern RP102 is peeled by, for example, a resist solvent to remove the resist pattern RP102 (step S174, resist pattern removing process).

Next, as indicated by S175 in FIG. 26, the nanoparticles 111 to which the ligands 121 are not coordinated in the non-dispersive ligand-free portion 116 is removed by dispersing the nanoparticles 111 in, for example, a solvent 141 (first organic solvent) that is the organic solvent capable of dispersing the nanoparticles 111. As a result, the non-dispersive ligand-free portion 116 is removed by the solvent 141 (step S75, non-dispersive ligand-free portion removing process).

The solvent 141 is not particularly limited as long as the solvent 141 is such an organic solvent capable of dispersing the nanoparticles 111 to which the ligands 121 are not coordinated.

As a result, the nanoparticle layer 113 including the non-dispersive ligand-containing portion 114 is formed on the support body 110 as a nanoparticle layer pattern obtained by patterning the nanoparticle film 112.

Note that the nanoparticles 111 contained in the non-dispersive ligand-free portion 116 (in other words, the portion of the nanoparticle film 112 other than the non-dispersive ligand-containing portion 114), which are removed by the solvent 141 in step S175, are less deteriorated and can be reused. Thus, in the present embodiment, it is preferable that a recovering process of recovering the nanoparticles 111 is performed together with step S175.

In the eighth embodiment, the non-dispersive ligand-containing portion 114 of the nanoparticle film 112 subjected to the ligand exchange once is used as the nanoparticle layer 113, while the nanoparticles 111 subjected to the ligand exchange twice are recovered.

In the present embodiment, the non-dispersive ligand-containing portion 114 of the nanoparticle film 112 subjected to the ligand exchange once is used as the nanoparticle layer 113, while the nanoparticles 111 not subjected to the ligand exchange are recovered. Thus, the nanoparticles 111 in which deterioration is further suppressed than in the eighth embodiment or the nanoparticles 111 which are not deteriorated can be recovered.

According to the present embodiment, advantageous effects similar to those of the third embodiment can be obtained.

The disclosure is not limited to the embodiments described above, and various modifications may be made within the scope of the claims. Embodiments obtained by appropriately combining technical approaches disclosed in the different embodiments also fall within the technical scope of the disclosure. Furthermore, novel technical features can be formed by combining the technical approaches disclosed in each of the embodiments.

The invention claimed is:

1. A nanoparticle film patterning method comprising:

forming a non-dispersive ligand-containing portion containing a nanoparticle and a monodentate non-dispersive ligand that is coordinated to the nanoparticle to render the nanoparticle non-dispersible in a solvent in a part of a nanoparticle film containing the nanoparticle; and removing a portion of the nanoparticle film other than the non-dispersive ligand-containing portion with a first organic solvent to form a nanoparticle layer pattern.

2. The nanoparticle film patterning method according to claim 1, further comprising:

recovering the nanoparticle contained in the portion of the nanoparticle film other than the non-dispersive ligand-containing portion removed by the first organic solvent.

3. The nanoparticle film patterning method according to claim 1, further comprising:

performing nanoparticle film formation of forming, as the nanoparticle film, a nanoparticle film containing at least the nanoparticle among the nanoparticle and a first ligand;

performing non-dispersive ligand supply of supplying a non-dispersive ligand dispersion containing the non-dispersive ligand and a second organic solvent to the entire nanoparticle film and coordinating the non-dispersive ligand to the nanoparticle;

performing resist patterning of forming a resist pattern on a part of the nanoparticle film after the non-dispersive ligand supply;

performing dispersive ligand exchange of supplying dispersive ligand dispersion containing a dispersive ligand that is coordinated to the nanoparticles to disperse the nanoparticle in the first organic solvent and the first organic solvent to a portion of the nanoparticle film not covered with the resist pattern, substituting the non-dispersive ligand in the portion not covered with the resist pattern with the dispersive ligand, dispersing the nanoparticle to which the dispersive ligand is coordinated and that is dispersible in the first organic solvent in the first organic solvent and removing the nanoparticle to form the non-dispersive ligand-containing portion; and performing resist pattern removal of removing the resist pattern after the dispersive ligand exchange.

4. The nanoparticle film patterning method according to claim 3, wherein in the nanoparticle film formation, a nanoparticle film containing the nanoparticle and the first ligand is formed as the nanoparticle film, and in the non-dispersive ligand supply, the first ligand is substituted with the non-dispersive ligand by supplying the non-dispersive ligand dispersion and the non-dispersive ligand is coordinated to the nanoparticle.

5. The nanoparticle film patterning method according to claim 3, wherein in the nanoparticle film formation, a nanoparticle film containing only the nanoparticle among the nanoparticle and the first ligand is formed as the nanoparticle film, and in the non-dispersive ligand supply, the non-dispersive ligand is coordinated to the nanoparticle by supplying the non-dispersive ligand dispersion.

6. The nanoparticle film patterning method according to claim 3, wherein the nanoparticle is a quantum dot, the first organic solvent is a non-polar organic solvent and the second organic solvent is a polar organic solvent.

7. The nanoparticle film patterning method according to claim 6, wherein the non-polar organic solvent is a solvent having a dielectric constant of 1.8 or more and 6.1 or less.

8. The nanoparticle film patterning method according to claim 6, wherein the polar organic solvent is a solvent having a dielectric constant more than 6.1 and 50 or less.

9. The nanoparticle film patterning method according to claim 3, wherein the nanoparticle is an inorganic nanoparticle having carrier transport properties, the first organic solvent is a polar organic solvent and the second organic solvent is a non-polar organic solvent.

10. The nanoparticle film patterning method according to claim 3, further comprising:

performing second ligand exchange of supplying a second ligand dispersion containing a second ligand and a third organic solvent to the non-dispersive ligand-containing portion to exchange the non-dispersive ligand with the second ligand.

11. The nanoparticle film patterning method according to claim 1, further comprising:

performing nanoparticle film formation of forming, as the nanoparticle film, a nanoparticle film containing at least the nanoparticle among the nanoparticle and first ligand;

performing resist patterning of forming a resist pattern on a part of the nanoparticle film;

performing non-dispersive ligand supply of supplying a non-dispersive ligand dispersion containing the non-dispersive ligand and a second organic solvent to a portion of the nanoparticle film not covered with the resist pattern, coordinating the non-dispersive ligand to the nanoparticle in the portion not covered with the resist pattern, and forming the non-dispersive ligand-containing portion and a non-dispersive ligand-free portion not containing the non-dispersive ligand in the nanoparticle film;

performing resist pattern removal of removing the resist pattern after the non-dispersive ligand supply; and performing non-dispersive ligand-free portion removal of dispersing the nanoparticle in the non-dispersive ligand-free portion in the first organic solvent and removing the non-dispersive ligand-free portion with the first organic solvent after the resist pattern removal.

12. The nanoparticle film patterning method according to claim 1, wherein the non-dispersive ligand includes one coordinating functional group capable of being coordinated to the nanoparticle, and the non-dispersive ligand has the number of carbons of a main chain skeleton of 1 or more and 8 or less, when the non-dispersive ligand does not contain a ring, a carbon chain having the largest number of carbons contained in the carbon chain connecting the shortest distance from a carbon to which the coordinating functional group is bonded to a carbon of a terminal group is defined as the main chain skeleton and when the non-dispersive ligand contains the ring, the main chain skeleton is defined by a carbon chain containing more carbons among (i) a carbon chain connecting the shortest distance along the ring from a carbon to which the coordinating functional group is bonded to a carbon in the ring located on the opposite side of a carbon to which the coordinating functional group or the substituent containing the coordinating functional group is bonded and (ii) a carbon chain having the largest number of carbons contained in a carbon chain connecting the shortest distance along the ring from a carbon to which the coordinating functional group is bonded to a carbon at a terminal of a substituent other than the coordinating functional group or the substituent containing the coordinating functional group bonded to the ring when the substituent other than the coordinating functional group or the substituent containing the coordinating functional group is bonded to the ring.

13. The nanoparticle film patterning method according to claim 12, wherein the number of carbons of the main chain skeleton in the non-dispersive ligand is 5 or less.

14. The nanoparticle film patterning method according to claim 12, wherein the non-dispersive ligand is p-toluenethiol.

15. The nanoparticle film patterning method according to claim 1, wherein the non-dispersive ligand is at least one type of a ligand selected from the group consisting of, for example, ethyl mercaptan, 1-propanethiol, 1-butanethiol, 1-pentanethiol, 2-methyl-1-butanethiol, o-toluenethiol, m-toluenethiol, p-toluenethiol, 2, 4-dimethylbenzenethiol, 3, 4-dimethylbenzenethiol, 2, 5-dimethylbenzenethiol, 3, 5-dimethylbenzenethiol, and 3-methylcyclopentanethiol, 4-tert-butylbenzenethiol, 4-isopropylbenzenethiol, methyl amine, pentylamine, p-toluidine, 4-phenylbutylamine, pentanoic acid, benzoic acid, ethylphosphonic acid, and trimethylphosphine.

16. A method for manufacturing a light-emitting element comprising:

performing nanoparticle layer patterning of forming a nanoparticle layer pattern by using the nanoparticle film patterning method according to claim 1.

17. A method for manufacturing a display device, the display device including a plurality of subpixels having luminescent colors different from each other, the method comprising:

performing nanoparticle layer patterning of forming a nanoparticle layer pattern for each of the subpixels, wherein the nanoparticle layer pattern in at least one subpixel of the plurality of subpixels is formed using the nanoparticle film patterning method according to claim 1.

18. The method for manufacturing a display device according to claim 17, wherein the plurality of subpixels include at least a first subpixel configured to emit light of a first color and a second subpixel configured to emit light of a second color, and in the nanoparticle layer patterning, a nanoparticle layer pattern in the first subpixel is formed using a nanoparticle film patterning method including performing nanoparticle film formation of forming, as the nanoparticle film, a nanoparticle film containing at least the nanoparticle among the nanoparticle and a first ligand, performing non-dispersive ligand supply of supplying a non-dispersive ligand dispersion containing the non-dispersive ligand and a second organic solvent to the entire nanoparticle film and coordinating the non-dispersive ligand to the nanoparticle, performing resist patterning of forming a resist pattern on a part of the nanoparticle film after the non-dispersive ligand supply, performing dispersive ligand exchange of supplying dispersive ligand dispersion containing a dispersive ligand that is coordinated to the nanoparticles to disperse the nanoparticle in the first organic solvent and the first organic solvent to a portion of the nanoparticle film not covered with the resist pattern, substituting the non-dispersive ligand in the portion not covered with the resist pattern with the dispersive ligand, dispersing the nanoparticle to which the dispersive ligand is coordinated and that is dispersible in the first organic solvent in the first organic solvent and removing the nanoparticle to form the non-dispersive ligand-containing portion, and performing resist pattern removal of removing the resist pattern after the dispersive ligand exchange, and a nanoparticle layer pattern in the second subpixel is formed using a nanoparticle film patterning method including performing nanoparticle film formation of forming, as the nanoparticle film, a nanoparticle film containing at least the nanoparticle among the nanoparticle and first ligand, performing resist patterning of forming a resist pattern on a part of the nanoparticle film, performing non-dispersive ligand supply of supplying a non-dispersive ligand dispersion containing the non-dispersive ligand and a second organic solvent to a portion of the nanoparticle film not covered with the resist pattern, coordinating the non-dispersive ligand to the nanoparticle in the portion not covered with the resist pattern, and forming the non-dispersive ligand-containing portion and a non-dispersive ligand-free portion not containing the non-dispersive ligand in the nanoparticle film, performing resist pattern removal of removing the resist pattern after the non-dispersive ligand supply, and performing non-dispersive ligand-free portion removal of dispersing the nanoparticle in the non-dispersive ligand-free portion in the first organic solvent and removing the non-dispersive ligand-free portion with the first organic solvent after the resist pattern removal.

19. A light-emitting element comprising:

a nanoparticle layer pattern containing a nanoparticle, wherein the nanoparticle layer pattern includes a non-dispersive ligand-containing portion containing a monodentate non-dispersive ligand that is coordinated to the nanoparticle to render the nanoparticle non-dispersible in a solvent and a dispersive ligand-containing portion containing at least dispersive ligand that is coordinated to the nanoparticle to render the nanoparticle dispersible in one of a polar organic solvent and a non-polar organic solvent, the dispersive ligand-containing portion is formed adjacent to the non-dispersive ligand-containing portion in a part of an outer edge portion of the non-dispersive ligand-containing portion, and the dispersive ligand contained in the dispersive ligand-containing portion is coordinated to the nanoparticle to which the non-dispersive ligand is coordinated.

* * * * *